(12) United States Patent
Gunnam et al.

(10) Patent No.: US 12,143,122 B2
(45) Date of Patent: *Nov. 12, 2024

(54) LOW DENSITY PARITY CHECK DECODER

(71) Applicant: The Texas A&M University System, College Station, TX (US)

(72) Inventors: Kiran Kumar Gunnam, San Jose, CA (US); Gwan S. Choi, College Station, TX (US)

(73) Assignee: The Texas A&M University System, College Station, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/214,379

(22) Filed: Jun. 26, 2023

(65) Prior Publication Data

US 2023/0336189 A1 Oct. 19, 2023

Related U.S. Application Data

(63) Continuation of application No. 17/744,576, filed on May 13, 2022, now Pat. No. 11,728,828, which is a
(Continued)

(51) Int. Cl.
*G06F 11/00* (2006.01)
*H03M 13/00* (2006.01)
(Continued)

(52) U.S. Cl.
CPC .... *H03M 13/1128* (2013.01); *H03M 13/1105* (2013.01); *H03M 13/116* (2013.01);
(Continued)

(58) Field of Classification Search
CPC ......... H03M 13/1128; H03M 13/1105; H03M 13/116; H03M 13/1177; H03M 13/13; H03M 13/616
See application file for complete search history.

(56) References Cited

U.S. PATENT DOCUMENTS 5,278,846 A 1/1994 Okayama
5,317,472 A 5/1994 Schweitzer, III
(Continued)

FOREIGN PATENT DOCUMENTS

CN 101248583 B 4/2012
CN 101689865 B 10/2012
(Continued)

OTHER PUBLICATIONS

U.S. Appl. No. 13/693,650, filed Dec. 4, 2012, Patented.
(Continued)

*Primary Examiner* — Elmira Mehrmanesh
(74) *Attorney, Agent, or Firm* — Conley Rose, P.C.

(57) ABSTRACT

A method and system for decoding low density parity check (LDPC) codes. An LDPC code decoder includes LDPC decoding circuitry comprising a Q message generator and a P sum adder array. The Q message generator combines an R message from a previous iteration with a P message to produce a Q message. The P sum adder array adds the P message to a difference of an R message from a current iteration and the R message from the previous iteration to produce an updated P message.

35 Claims, 29 Drawing Sheets

Related U.S. Application Data continuation of application No. 17/084,564, filed on Oct. 29, 2020, now Pat. No. 11,368,168, which is a continuation of application No. 15/373,822, filed on Dec. 9, 2016, now Pat. No. 10,951,235, which is a continuation of application No. 14/792,982, filed on Jul. 7, 2015, now Pat. No. 10,141,950, which is a continuation of application No. 14/141,508, filed on Dec. 27, 2013, now Pat. No. 9,112,530, which is a continuation of application No. 13/693,650, filed on Dec. 4, 2012, now Pat. No. 8,656,250, which is a continuation of application No. 12/113,729, filed on May 1, 2008, now Pat. No. 8,359,522.

(60) Provisional application No. 60/988,680, filed on Nov. 16, 2007, provisional application No. 60/915,320, filed on May 1, 2007.

(51) Int. Cl.
*H03M 13/11* (2006.01)
*H03M 13/13* (2006.01)

(52) U.S. Cl.
CPC ....... *H03M 13/1177* (2013.01); *H03M 13/13* (2013.01); *H03M 13/616* (2013.01)

(56) References Cited

U.S. PATENT DOCUMENTS

| | | |
|---|---|---|
| 5,325,402 A | 6/1994 | Ushirokawa |
| 5,392,299 A | 2/1995 | Rhines et al. |
| 5,471,500 A | 11/1995 | Blaker et al. |
| 5,513,192 A | 4/1996 | Janku et al. |
| 5,550,870 A | 8/1996 | Blaker et al. |
| 5,612,964 A | 3/1997 | Haraszti |
| 5,701,314 A | 12/1997 | Armstrong et al. |
| 5,710,784 A | 1/1998 | Kindred et al. |
| 5,712,861 A | 1/1998 | Inoue et al. |
| 5,717,706 A | 2/1998 | Ikeda |
| 5,802,118 A | 9/1998 | Bliss et al. |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |
| 6,023,783 A | 2/2000 | Divsalar et al. |
| 6,029,264 A | 2/2000 | Kobayashi et al. |
| 6,041,432 A | 3/2000 | Ikeda |
| 6,065,149 A | 5/2000 | Yamanaka |
| 6,097,764 A | 8/2000 | McCallister et al. |
| 6,145,110 A | 11/2000 | Khayrallah |
| 6,163,870 A | 12/2000 | Luby et al. |
| 6,216,249 B1 | 4/2001 | Bliss et al. |
| 6,216,251 B1 | 4/2001 | McGinn |
| 6,229,467 B1 | 5/2001 | Eklund et al. |
| 6,266,795 B1 | 7/2001 | Wei |
| 6,317,472 B1 | 11/2001 | Choi et al. |
| 6,337,642 B1 | 1/2002 | Yagil |
| 6,351,832 B1 | 2/2002 | Wei |
| 6,377,610 B1 | 4/2002 | Hagenauer et al. |
| 6,381,726 B1 | 4/2002 | Weng |
| 6,438,717 B1 | 8/2002 | Butler et al. |
| 6,473,878 B1 | 10/2002 | Wei |
| 6,476,989 B1 | 11/2002 | Chainer et al. |
| 6,603,412 B2 | 8/2003 | Gatherer et al. |
| 6,625,775 B1 | 9/2003 | Kim |
| 6,633,856 B2 | 10/2003 | Richardson et al. |
| 6,657,803 B1 | 12/2003 | Ling et al. |
| 6,671,404 B1 | 12/2003 | Katawani et al. |
| 6,748,034 B2 | 6/2004 | Hattori et al. |
| 6,757,862 B1 | 6/2004 | Marianetti |
| 6,785,863 B2 | 8/2004 | Blankenship et al. |
| 6,788,654 B1 | 9/2004 | Hashimoto et al. |
| 6,810,502 B2 | 10/2004 | Eidson |
| 6,892,335 B2 | 5/2005 | Gueguen |
| 6,938,196 B2 | 8/2005 | Richardson et al. |
| 6,980,382 B2 | 12/2005 | Hirano et al. |
| 6,990,625 B2 | 1/2006 | Fujiwara et al. |
| 7,000,167 B2 | 2/2006 | Coker et al. |
| 7,010,051 B2 | 3/2006 | Murayama et al. |
| 7,047,474 B2 | 5/2006 | Rhee et al. |
| 7,058,873 B2 | 6/2006 | Song et al. |
| 7,073,118 B2 | 7/2006 | Greenberg et al. |
| 6,986,098 B2 | 8/2006 | Poeppelman |
| 7,093,179 B2 | 8/2006 | Shea |
| 7,113,356 B1 | 9/2006 | Wu |
| 7,120,857 B2 | 10/2006 | Kim et al. |
| 7,127,659 B2 | 10/2006 | Richardson et al. |
| 7,133,853 B2 | 11/2006 | Richardson et al. |
| 7,137,060 B2 | 11/2006 | Yu et al. |
| 7,143,333 B2 | 11/2006 | Blankenship et al. |
| 7,149,953 B2 | 12/2006 | Cameron et al. |
| 7,173,783 B1 | 2/2007 | McEwen et al. |
| 7,178,081 B2 | 2/2007 | Lee et al. |
| 7,178,082 B2 | 2/2007 | Yu et al. |
| 7,181,676 B2 | 2/2007 | Hocevar |
| 7,184,486 B1 | 2/2007 | Wu et al. |
| 7,191,378 B2 | 3/2007 | Eroz et al. |
| 7,203,015 B2 | 4/2007 | Sakai et al. |
| 7,203,887 B2 | 4/2007 | Eroz et al. |
| 7,219,288 B2 | 5/2007 | Dielissen et al. |
| 7,236,757 B2 | 6/2007 | Raghaven et al. |
| 7,257,764 B2 | 8/2007 | Suzuki et al. |
| 7,310,768 B2 | 12/2007 | Eidson et al. |
| 7,313,750 B1 | 12/2007 | Feng et al. |
| 7,322,005 B2 | 1/2008 | Shen et al. |
| 7,353,444 B2 | 4/2008 | Owsley et al. |
| 7,360,040 B2 | 4/2008 | Suzuki et al. |
| 7,370,258 B2 | 5/2008 | Iancu et al. |
| 7,383,485 B2 | 6/2008 | Tran et al. |
| 7,395,461 B2 | 7/2008 | Argon et al. |
| 7,395,491 B2 | 7/2008 | Chen |
| 7,403,752 B2 | 7/2008 | Raghavan et al. |
| 7,430,256 B2 | 9/2008 | Zhidkov |
| 7,447,985 B2 | 11/2008 | Tran et al. |
| 7,451,361 B2 | 11/2008 | Schmidt |
| 7,451,386 B2 | 11/2008 | Shen et al. |
| 7,453,960 B1 | 11/2008 | Wu et al. |
| 7,466,773 B2 | 12/2008 | Hansen et al. |
| 7,484,158 B2 | 1/2009 | Sharon et al. |
| 7,555,696 B2 | 1/2009 | Schmidt |
| 7,500,168 B2 | 3/2009 | Yoshida |
| 7,502,189 B2 | 3/2009 | Sawaguchi et al. |
| 7,505,537 B1 | 3/2009 | Sutardja |
| 7,516,389 B2 | 4/2009 | Song |
| 7,523,375 B2 | 4/2009 | Spencer |
| 7,536,623 B2 | 5/2009 | Kim et al. |
| 7,587,657 B2 | 9/2009 | Haratsch |
| 7,590,168 B2 | 9/2009 | Raghaven et al. |
| 7,702,989 B2 | 4/2010 | Graef et al. |
| 7,712,008 B2 | 5/2010 | Song et al. |
| 7,724,163 B2 | 5/2010 | Wong et al. |
| 7,730,377 B2 | 6/2010 | Hocevar |
| 7,752,523 B1 | 7/2010 | Chaichanavong et al. |
| 7,760,114 B2 | 7/2010 | Neeman et al. |
| 7,760,828 B2 | 7/2010 | Visoz et al. |
| 7,779,331 B2 | 8/2010 | Tan |
| 7,797,613 B1 | 9/2010 | Farjadrad et al. |
| 7,801,200 B2 | 9/2010 | Tan |
| 7,802,163 B2 | 9/2010 | Tan |
| 7,802,172 B2 | 9/2010 | Casado |
| 7,853,854 B2 | 12/2010 | Paumier et al. |
| 7,904,792 B2 | 3/2011 | Kim et al. |
| 7,941,737 B2 | 5/2011 | Gopalakrishnan et al. |
| 7,958,427 B1 | 6/2011 | Yeung et al. |
| 8,006,161 B2 | 8/2011 | Lestable et al. |
| 8,132,080 B2 | 3/2012 | Matsumoto et al. |
| 8,140,930 B1 | 3/2012 | Maru |
| 8,281,210 B1 | 10/2012 | Farjadrad et al. |
| 8,359,522 B2 | 1/2013 | Gunnam et al. |
| 8,418,023 B2 | 4/2013 | Gunnam et al. |
| 8,489,962 B2 | 7/2013 | Dielissen |

(56) References Cited

U.S. PATENT DOCUMENTS

| | | | |
|---|---|---|---|
| 8,555,140 B2 | 10/2013 | Gunnam et al. | |
| 8,656,250 B2 | 2/2014 | Gunnam et al. | |
| 9,112,530 B2 | 8/2015 | Gunnam et al. | |
| 10,141,950 B2 | 11/2018 | Gunnam et al. | |
| 10,615,823 B2 | 4/2020 | Gunnam et al. | |
| 10,951,235 B2 | 3/2021 | Gunnam et al. | |
| 11,368,168 B2 | 6/2022 | Gunnam et al. | |
| 11,728,828 B2 * | 8/2023 | Gunnam | H03M 13/13 714/752 |
| 2003/0063405 A1 | 4/2003 | Jin et al. | |
| 2003/0081693 A1 | 5/2003 | Raghaven et al. | |
| 2003/0087634 A1 | 5/2003 | Raghaven et al. | |
| 2003/0112896 A1 | 6/2003 | Raghaven et al. | |
| 2003/0134607 A1 | 7/2003 | Raghaven et al. | |
| 2004/0071206 A1 | 4/2004 | Takatsu | |
| 2004/0098659 A1 | 5/2004 | Bjerke et al. | |
| 2004/0153938 A1 | 8/2004 | Okamura et al. | |
| 2004/0252791 A1 | 12/2004 | Shen et al. | |
| 2004/0255228 A1 | 12/2004 | Shen et al. | |
| 2004/0258177 A1 | 12/2004 | Shen et al. | |
| 2005/0010855 A1 | 1/2005 | Lusky | |
| 2005/0111540 A1 | 5/2005 | Modrie et al. | |
| 2005/0149844 A1 | 7/2005 | Tran et al. | |
| 2005/0157780 A1 | 7/2005 | Wemer et al. | |
| 2005/0166132 A1 | 7/2005 | Shen et al. | |
| 2005/0193320 A1 | 9/2005 | Vamica et al. | |
| 2005/0195749 A1 | 9/2005 | Elmasry et al. | |
| 2005/0204255 A1 | 9/2005 | Yeh et al. | |
| 2005/0210366 A1 | 9/2005 | Maehata | |
| 2005/0216819 A1 | 9/2005 | Chugg et al. | |
| 2005/0240853 A1 | 10/2005 | Yokokawa et al. | |
| 2005/0257124 A1 | 11/2005 | Richardson et al. | |
| 2005/0262424 A1 | 11/2005 | Tran et al. | |
| 2005/0268206 A1 | 12/2005 | Tran et al. | |
| 2005/0273688 A1 | 12/2005 | Argon | |
| 2005/0281111 A1 | 12/2005 | Urard et al. | |
| 2005/0283707 A1 | 12/2005 | Sharon et al. | |
| 2006/0020872 A1 | 1/2006 | Richardson et al. | |
| 2006/0031737 A1 | 2/2006 | Chugg et al. | |
| 2006/0085720 A1 | 4/2006 | Tran et al. | |
| 2006/0107181 A1 | 5/2006 | Dave et al. | |
| 2006/0123285 A1 | 6/2006 | De Araujo et al. | |
| 2006/0140311 A1 | 6/2006 | Ashley et al. | |
| 2006/0156183 A1 | 7/2006 | Kim et al. | |
| 2006/0168493 A1 | 7/2006 | Song et al. | |
| 2006/0195772 A1 | 8/2006 | Graef et al. | |
| 2006/0242533 A1 | 10/2006 | Lee et al. | |
| 2006/0248435 A1 | 11/2006 | Haratsch | |
| 2006/0256670 A1 | 11/2006 | Park et al. | |
| 2006/0271616 A1 | 11/2006 | Yoshida | |
| 2006/0285852 A1 | 12/2006 | Xi et al. | |
| 2007/0011569 A1 | 1/2007 | Vila Casado et al. | |
| 2007/0011573 A1 | 1/2007 | Farjadrad et al. | |
| 2007/0011586 A1 | 1/2007 | Belogolovyi et al. | |
| 2007/0044006 A1 | 2/2007 | Yang et al. | |
| 2007/0047635 A1 | 3/2007 | Stojanovic et al. | |
| 2007/0071009 A1 | 3/2007 | Nagaraj et al. | |
| 2007/0089019 A1 | 4/2007 | Tang et al. | |
| 2007/0110200 A1 | 5/2007 | Mergen et al. | |
| 2007/0124652 A1 | 5/2007 | Litsyn et al. | |
| 2007/0147481 A1 | 6/2007 | Bottomley et al. | |
| 2007/0162788 A1 | 7/2007 | Moelker | |
| 2007/0230407 A1 | 10/2007 | Petrie et al. | |
| 2007/0234178 A1 | 10/2007 | Richardson et al. | |
| 2007/0234184 A1 | 10/2007 | Richardson | |
| 2007/0286270 A1 | 12/2007 | Huang et al. | |
| 2008/0028282 A1 | 1/2008 | Zhong et al. | |
| 2008/0049825 A1 | 2/2008 | Chen et al. | |
| 2008/0055122 A1 | 3/2008 | Tan | |
| 2008/0065970 A1 | 3/2008 | Tan | |
| 2008/0069373 A1 | 3/2008 | Jiang et al. | |
| 2008/0082868 A1 | 4/2008 | Tran et al. | |
| 2008/0104474 A1 | 5/2008 | Gao et al. | |
| 2008/0104485 A1 | 5/2008 | Yurievich et al. | |
| 2008/0109701 A1 | 5/2008 | Yu et al. | |
| 2008/0126910 A1 | 5/2008 | Venkatesan et al. | |
| 2008/0148129 A1 | 6/2008 | Moon | |
| 2008/0163032 A1 | 7/2008 | Lastra-Montano | |
| 2008/0168330 A1 | 7/2008 | Graef et al. | |
| 2008/0215950 A1 | 9/2008 | Shen et al. | |
| 2008/0235561 A1 | 9/2008 | Yang et al. | |
| 2008/0246639 A1 | 10/2008 | Sakai et al. | |
| 2008/0276156 A1 | 11/2008 | Gunnam et al. | |
| 2008/0301521 A1 | 12/2008 | Gunnam et al. | |
| 2009/0037791 A1 | 2/2009 | Pavlov et al. | |
| 2009/0113256 A1 | 4/2009 | Radosavljevic et al. | |
| 2009/0199071 A1 | 8/2009 | Graef | |
| 2009/0217121 A1 | 8/2009 | Yokokawa et al. | |
| 2009/0228771 A1 | 9/2009 | Shasha | |
| 2009/0235116 A1 | 9/2009 | Tan et al. | |
| 2009/0235146 A1 | 9/2009 | Tan | |
| 2009/0259915 A1 | 10/2009 | Livshitz et al. | |
| 2009/0265600 A1 | 10/2009 | Matsumoto et al. | |
| 2009/0273492 A1 | 11/2009 | Yang et al. | |
| 2009/0274247 A1 | 11/2009 | Galbraith et al. | |
| 2010/0002795 A1 | 1/2010 | Raghavan et al. | |
| 2010/0042806 A1 | 2/2010 | Gunnam | |
| 2010/0042890 A1 | 2/2010 | Gunnam | |
| 2010/0050043 A1 | 2/2010 | Savin | |
| 2010/0061492 A1 | 3/2010 | Noeldner | |
| 2010/0070837 A1 | 3/2010 | Xu et al. | |
| 2010/0098185 A1 | 4/2010 | Miyazaki | |
| 2010/0164764 A1 | 7/2010 | Nayak | |
| 2010/0185914 A1 | 7/2010 | Tan et al. | |
| 2011/0041028 A1 | 2/2011 | Liu et al. | |
| 2011/0164669 A1 | 7/2011 | Mathew et al. | |
| 2011/0239085 A1 | 9/2011 | Yeung et al. | |
| 2011/0258508 A1 | 10/2011 | Ivkovic et al. | |
| 2011/0298543 A1 | 12/2011 | Liu et al. | |

FOREIGN PATENT DOCUMENTS

| | | | |
|---|---|---|---|
| EP | 0522578 | | 1/1993 |
| EP | 1503503 | A1 | 2/2005 |
| EP | 1814108 | | 8/2007 |
| JP | 2007295564 | A | 11/2007 |
| WO | WO 2006/016751 | | 2/2006 |
| WO | WO 2006/134527 | | 12/2006 |
| WO | WO 2007/091797 | | 8/2007 |
| WO | 2010019168 | A1 | 2/2010 |

OTHER PUBLICATIONS

U.S. Appl. No. 14/141,508, filed Dec. 27, 2013, Patented.
U.S. Appl. No. 14/792,982, filed Jul. 7, 2015, Patented.
U.S. Appl. No. 15/373,822, filed Dec. 9, 2016, Patented.
U.S. Appl. No. 17/084,564, filed Oct. 29, 2020, Patented.
U.S. Appl. No. 17/744,576, filed May 13, 2022, Pending.
C. Berrou, A. Glavieux, and P. Thitimajshima, "Near Shannon limit error-correcting coding and decoding: Turbo-Codes" in *Proc. IEEE Int. Conf. on Communications (ICC'93)*, Geneva, Switzerland, May 1993, pp. 1064-1070.
R. G. Gallager, *Low-Density Parity-Check Codes*, M.I.T Press, 1963. Available: http://justice.mit.edu/people/gallager.html.
T. Richardson, M. Shokrollahi, and R. Urbanke, "Design of capacity approaching irregular low-density parity-check codes," *IEEE Trans. Inf. Theory*, vol. 47, No. 2, pp. 619-637, Feb. 2001.
D. MacKay and R. Neal, "Near Shannon limit performance of low density parity check codes," *Electronics Letters*, vol. 32, pp. 1645-1646, Aug. 1996.
S. Chung, Jr., G. D. Forney, T. Richardson, and R. Urbanke, "On the design of low-density parity-check codes within 0.0045 db of the shannon limit," *IEEE Communications Letters*, vol. 5, issue 2, pp. 58-60, Feb. 2001.
A. Shokrollahi T.J. Richardson and R. Urbanke, "Design of capacity-approaching irregular low-density parity-check codes," *IEEE Transactions on Information Theory*, vol. 47 issue 2, pp. 619-637, Feb. 2001.
J. L. Fan, "Array codes as low density parity check codes," in Proc. *2nd International Symposium on Turbo Codes and Related Topics*, Brest, France, Sep. 2000, pp. 543-546.

(56) References Cited

OTHER PUBLICATIONS

A. Dholakia and S. Olcer, "Rate-compatible low-density parity-check codes for digital subscriber lines," in *Proc. IEEE International Conference on Communications*, Jun. 2004, pp. 415-419.

M.P.C. Fossorier, "Quasicyclic low-density parity-check codes from circulant permutation matrices," *IEEE Trans. on Information Theory*, vol. 50, No. 8, pp. 1788-1793, Aug. 2004.

IEEE Standard for Local and metropolitan area networks Part 16: Air Interface for Fixed and Mobile Broadband Wireless Access Systems Amendment 2: Physical and Medium Access Control Layers for Combined Fixed and Mobile Operation in Licensed Bands and Corrigendum 1, Feb. 2006.

*IEEE 802.11 Wireless LANsWWiSE Proposal: High Throughput extension to the 802.11 Standard*. IEEE 11-04-0886-00-000n.

J. Castura, E. Boutillon and F.R. Kschischang, "Decoder first code design," in *Proc. 2nd International Symposium on Turbo codes and Related Topics*, Brest, France, Sep. 2000, pp. 459-462.

A. J. Blanksby and C. J. Howland, "A 690-mW 1-GB/s 1024-b, Rate-1/2 low-density parity-check code decoder," *IEEE J. Solid-State Circuits*, vol. 37, No. 3, pp. 404-412, Mar. 2002.

E. Yeo, P. Pakzad, B. Nikolic and V. Anantharaman, "High through-put low-density parity-check decoder architectures," in *IEEE Global Telecommunication Conference, 2001 (GLOBECOM'01)*, vol. 5, pp. 3019-3024.

A. Selvarathinam, G. Choi, K. Narayanan, A. Prabhakar, and E. Kim, "A massively scaleable decoder architecture for low-density parity-check codes," in *Proc. IEEE International Symposium on Circuits and Systems 2003 (ISCAS'03)*, Bangkok, Thailand, vol. 2, May 2003, pp. 61-64.

Y. Li; M. Elassal,; M. Bayoumi, "Power efficient architecture for (3, 6)-regular low-density parity-check code decoder," *in Proc. IEEE International Symposium on Circuits and Systems 2004 (ISCAS '04)*, vol. 4, May 2004, pp. 23-26.

M.M. Mansour, N. R. Shanbhag, "A 640-Mb/s 2048-bit programmable LDPC decoder chip," *IEEE Journal of Solid-State Circuits*, vol. 41, No. 3, pp. 684-698, Mar. 2006.

A, Darabiha, A. C. Carusone and F. R. Kschischang, "Multi-Gbit/sec low density parity check decoders with reduced interconnect complexity," in *Proc. IEEE International Symposium on Circuits and Systems 2005 (ISCAS'05)*, Kobe, Japan, May 2005.

Y. Chen and D. Hocevar, "A FPGA and ASIC implementation of rate 1/2, 8088-b irregular low density parity check decoder," in *Proc. IEEE GLOBECOM*, San Francisco, CA, Dec. 2003, pp. 113-117.

Flarion Technology, Vector-LDPC Coding Solution Data Sheet. Available: http://www.flarion.com/products/vector.asp.

R. Singhal, G.S. Choi, and R. N. Mahapatra, "Programmable LDPC decoder based on the bubble-sort algorithm,", in *Proc. IEEE VLSI Design 2006*, Jan. 2006, pp. 203-208.

V. Nagarajan, N. Jayakumar, S. Khatri, and G. Milenkovic, "High throughput VLSI implementations of iterative decoders and related code construction problems", in *Proc. Global Telecommunications Conference*, 2004 (GLOBECOMM '04), vol. 1, Nov. 29 -Dec. 3, 2004, pp. 361-365.

M. P. C. Fossorier, M. Mihaljevic, and H. Imai, "Reduced complexity iterative decoding of low density parity check codes based on belief propagation," *IEEE Trans. Commun.*, vol. 47, No. 5, pp. 673-680, May 1999.

A. Prabhakar and K. Narayanan, "A memory efficient serial LDPC decoder architecture," in *IEEE International conference on Acoustics, Speech and Signal Processing*, 2005 (ICASSP 2005), Philadelphia, PA, vol. 5, Mar. 18-23, 2005, pp. v/41: v/44.

C. Jones, E. Valles, M. Smith and J. Villasenor, "Approximate-min constraint node updating for LDPC code design," in *IEEE Conference on Military Communications*, 2003(MILCOM 2003), Oct. 13-16, 2003, pp. 57-162.

J. Chen and M. Fossorier, "Near optimum universal belief propagation based decoding of low-density parity check codes," in *IEEE Transactions on Communications*, vol. COM-50, pp. 406-414, Mar. 2002.

J. Chen and M. Fossorier, "Density evolution for two improved BP-based decoding algorithms of LDPC codes," *IEEE Communication Letters*, vol. 6, pp. 208-210, May 2002.

F. Guilloud, E. Boutillon and J.L. Danger "λ-Min decoding algorithm of regular and irregular codes," in *Proc. 3rd International Symposium on Turbo Codes & Related Topics*, Brest, France, Sep. 2003, pp. 451-454.

J. Chen, A. Dholakia, E. Eleftheriou, M.P.C. Fossorier and X.Y. Hu, "Reduced-complexity decoding of LDPC codes," *IEEE Trans, on Communications*, vol. 53, No. 8, pp. 1288-1299, Aug. 2005.

J. Zhang, M. Fossorier, D. Gu and J. Zhang, "Two-dimensional correction for min-sum decoding of irregular codes," *IEEE Communication letters*, vol. 10, issue 3, pp. 180-182, Mar. 2006.

J. Zhao, F. Zarkeshvari and A.H. Banihashemi, "On the implementation of min-sum algorithm and its modifications for decoding low-density parity-check codes," *IEEE Trans. on Communications*, vol. 53, No. 4, pp. 549-554, Apr. 2005.

S.Y. Chung, T.J. Richardson and R.L. Urbanke, "Analysis of sum-product decoding of low-density parity-check codes using a gaussian approximation," *IEEE Trans. Inform. Theory*, vol. 47, No. 2, Feb. 2001.

E. Eleftheriou and S. Olcer, "Low density parity-check codes for digital subscriber lines," in *Proc. Intl. Conf. on Communication 2002*, New York, pp. 1752-1757.

M. Karkooti, and J.R. Cavallaro, "Semi-parallel reconfigurable architectures for real-time LDPC decoding," in *Proc. International Conference on Information Technology: Coding and Computing*, 2004 (ITCC 2004), vol. 1, pp. 579 585.

D. Hocevar, "A reduced complexity decoder architecture via layered decoding of LDPC codes", in *IEEE Workshop on Signal Processing Systems (IEEE SIPS)*, Oct. 2004, pp. 107-112.

H. Sankar and K. R. Narayanan, "Memory-efficient sum-product decoding of LDPC codes," *IEEE Trans. Comm.*, vol. 52, No. 8, pp. 1225-1230, Aug. 2004.

B. Gocal, "Bitonic sorting on Bene networks", in *Proceedings of the 10th International Parallel Processing Symposium* (Apr. 15-19, 1996). IPPS. JEEE Computer Society, Washington, DC, 749-753.

T. Brack, F. Kienle, and N. Wehn, "Disclosing the LDPC code decoder design space," in *Proceedings of Design Automation and Test in Europe (DATE) Conference*, Mar. 2006, pp. 200-205.

L. Yang, M. Shen, H. Liu, and C. Shi, "An FPGA implementation of low-density parity-check code decoder with multi-rate capability," in *Proceedings of the Asia and South Pacific Design Automation Conference*, Jan. 18-21, 2005, vol. 2, pp. 760-763.

E. Kim and G. Choi, "Diagonal low-density parity-check code for simplified routing in decoder," in *IEEE Workshop on Signal Processing Systems (IEEE SIPS)*, Nov. 2005, pp. 756-761.

Z. Wang and Z. Cui, "A Memory Efficient Partially Parallel Decoder Architecture for QC-LDPC Codes," *Conference Record of the Thirty-Ninth Asilomar Conf. on Signals, Systems and Computers*, Oct. 28-Nov. 1, 2005, pp. 729-733.

H. Zhong and T. Zhang, "Block-LDPC: A practical LDPC coding system design approach," *IEEE Trans. on Circuits and Systems-I*, vol. 52, No. 4, pp. 766-775, Apr. 2005.

T. Zhang and K.K. Parhi, "A 54 MBPS (3, 6)-regular FPGA LDPC decoder," in *Proc. IEEE SIPS*, pp. 127-132, 2002.

S. Olcer, "Decoder architecture for array-code-based LDPC codes," in *Global Telecommunication Conference, 2003 (GLOBECOM'03)*, vol. 4, Dec. 2003, pp. 2046-2050.

E. Liao, E. Yeo and B. Nikolic, "Low-density parity-check code constructions for hardware implementations," in *IEEE Intl. Conf. on Communications, (ICC 2004)*, vol. 5, Jun. 20-24, 2004, pp. 2573-2577.

M. M. Mansour and N. R. Shanbhag, "Low power VLSI decoder architectures for LDPC codes," in Proc. *International Symposium on Low Power Electronics and Design (ISLPED)*, Monterey, CA, Aug. 2002, pp. 284-289.

P. Bhagawat, M. Uppal and G. Choi, "FPGA based implementation of decoder for array low-density parity-check codes," in *IEEE International Conference on Acoustics, Speech and Signal processing, 2005 (ICASSP 2005)*, vol. 5, Mar. 18-23, 2005, pp. 29-32.

K. Gunnam, G. Choi and M. B. Yeary, "An LDPC decoding schedule for memory access reduction", in *IEEE International*

(56) References Cited

OTHER PUBLICATIONS

*Conference on Acoustics, Speech and Signal processing, 2004* (ICASSP 2004), vol. 5, May 17-21, 2004, pp. V-173-6.

G. Malema and M. Liebelt, "Interconnection network for structured low-density parity-check decoders," *Asia-Pacific Conference on Communications*, Oct. 3-5, 2005, pp. 537-540.

M. Rovini, N. E. Insalata, F. Rossi, L. Fanucci, "VLSI design of a high throughput multi-rate decoder for structured LDPC codes," in *Proc. 8th Euromicro Conference on Digital System Design*, Sep. 2005, pp. 202-209.

M. Bikerstaff L. Davis, C. Thomas, D. Garrett, and C. Nicol, "A 24 Mb/s radix-4 LogMAP turbo decoder for 3GPP-HSDPA mobile wireless," in *IEEE Int. Solid-State Circuits Conf.(ISSCC) Dig. Tech. Papers*, 2003, pp. 150-151.

M. Bougard B. Bougard, A. Giulietti, V. Derudder, J. Weijers, S. Dupont, L. Hollevoet, F. Catthoor, L. Van der Perre, H. De Man, R. Lauwereins "A scalable 8.7 n.J/bit 75.6 Mb/s parallel concatenated convolutional (turbo-) codec," in *IEEE Int. Solid-State Circuits Conf.(ISSCC)* Dig. Tech. Papers, 2003, pp. 152-153.

L. Sun, H. Song, B.V.K.V. Kumar, and Z. Keirn, "Field programmablegate-array-based investigation of the error floorof low-density parity check codes for magnetic recording channels,"in *IEEE Trans. on Magnetics*, Oct. 2005, pp. 2983-2985.

H. Zhong and T. Zhang, "High-rate quasi-cyclic LDPC codes for magnetic recording channel with low error floor," in Proc. of *IEEE International Symposium on Circuits and Systems* (ISCAS), May 2006, pp. 3546 3549.

X. Hu, B. V. K. V. Kumar, L. Sun, and J. Xie, "Decoding behavior study of LDPC codes under a realistic magnetic recording channel model," *IEEE Transactions on Magnetics*, vol. 42, No. 10, pp. 2606-2608, Oct. 2006.

H. Liu et al., "A 480Mb/s LDPC-COFDM-based UWB baseband transceiver," in *IEEE International Solid-State Circuits Conference* (ISSCC), Feb. 2005, pp. 444-609.

C. Lin, K. Lin, H. Chan, and C. Lee, "A 3.33Gb/s (1200,720) low-density parity check code decoder," in Proceedings of the *31st European Solid-State Circuits Conference*, Sep. 2005, pp. 211-214.

S. Kang and I. Park, "Loosely coupled memory-based decoding architecture for low density parity check codes," Proc. of the *IEEE Custom Integrated Circuits Conference* (CICC), pp. 703-706, Sep. 2005.

J.K.-S. Lee, B. Lee, J. Thorpe, K. Andrews, S. Dolinar, and J. Hamkins, "A scalable architecture of a structured LDPC decoder," in *International Symposium on Information Theory*, Jul. 2004, p. 293.

Z. Wang and Q. Jia, "Low complexity, high speed decoder architecture for quasi-cyclic LDPC codes," in *IEEE International Symposium on Circuits and Systems*, (ISCAS), vol. 6, pp. 5786-5789, May 2005.

R. Kschischang, B. J. Frey, and H.-A. Loeliger, "Factor graphs and the sum-product algorithm," in *IEEE Transactions on Information Theory*, vol. 47, pp. 498-519, Feb. 2001.

L. Sun, H. Song, and B.V.K.V. Kumar, "Error floor investigation and girth optimization for certain types of low-density parity check codes," in Proc. of *IEEE International Conference on Acoustics, Speech, and Signal Processing*, Mar. 2005, pp. 1101-1104.

R. G. Gallager, "Low-density parity-check codes," in *IRE Transactions on Information Theory*, vol. IT-8, pp. 21-28, Jan. 1962.

D. J. C. MacKay, "Good error-correcting codes based on very sparse matrices," in *IEEE Transactions on Information Theory*, vol. 45, pp. 399-431, Mar. 1999.

J. Thorpe, "Low-density parity-check (LDPC) codes constructed from protographs," in *IPN Progress Report*, Aug. 2003, pp. 42-154. Available: http://ipnpr.jpl.nasa.gov/tmo/progress report/42-154/154C. pdf.

M. M. Mansour and N. R. Shanbhag, "Architecture-aware low-density parity-check codes," in *IEEE International Symposium on Circuits and Systems (ISCAS)*, Bangkok, Thailand, May 2003, pp. 57-60.

D. E. Hocevar, "LDPC code construction with flexible hardware implementation," in *IEEE International Conference on Communications*, 2003, pp. 2708-2712.

H. Zhong and T. Zhang, "Design of VLSI implementation-oriented LDPC codes," in *IEEE Semiannual Vehicular Technology Conference* (VTC), Oct. 2003.

Youn, "BER Perf. Due to irreg. of Row-Weight Distr. of the Parity-Check Matrix in Irregular LDPC Codes for 1O-GB/s Optical Signals" Journal of Lightwave Tech., vol. 23 Sep. 9, 2005.

Jose M. F. Moura, J. Lu, , and H. Zhang, "Structured low-density paritycheck codes," in *IEEE signal processing magazine*, pp. 42-55, Jan. 2004.

T. Richardson and R. Urbanke, "Efficient encoding of low-density parity-checkcodes," in *IEEE Transactions on Information Theory*, vol. 47, No. 2, pp. 638-656, Feb. 2001.

D.E Hocevar, "Efficient encoding for a family of quasi-cyclic LDPC codes," in *Global Telecommunications Conference*, vol. 7, pp. 3996-4000, 2003.

E. Eleftheriou and S. Olcer, "Low-density parity-check codes for digital subscriber lines," in Proc. *IEEE International Conference on Communications*, 2002, pp. 1752-1757.

T. Zhang and K. K. Parhi, "Joint (3, k)-regular LDPC code and decoder/encoder design," in *IEEE Transactions on Signal Processing*, vol. 52, No. 4, pp. 1065-1079, Apr. 2004.

T. Tian, C. Jones, J. D. Villasenor, and R. D. Wesel, "Construction of irregular LDPC codes with low error floors," in Proc. *IEEE International Conference on Communications*, 2003, pp. 3125-3129.

J. Campello and D. S. Modha, "Extended bit-filling and LDPC code.design," in Proc. *IEEE Global Telecommunications Conference*, 2001, pp. 985-989.

J. Thorpe, "Design of LDPC graphs for hardware implementation," in Proc. *IEEE International Symposium on Information Theory*, 2002, pp. 483-483.

D. Declercq and F. Verdier, "Optimization of LDPC finite precision belief propagation decoding with discrete density evolution," in *3rd International Symposium on Turbo Codes and Related Topics Brest*, France, Sep. 2003.

P.Radosavljevic, A. de Baynast, M. Karkooti, and J. R. Cavallaro, "High-throughput multi-rate LDPC decoder based on architecture-oriented parity check matrices," in the *14th European Signal Processing Conference* (EUSIPCO), Sep. 2006.

Z. Wu and G. Burd, "Equation based LDPC decoder for intersymbol interference channels," in *IEEE International Conference on Acoustics, Speech, and Signal Processing (ICASSP '05)*, vol. 5, pp. 757-760, Mar. 2005.

S. Jin, G. Minglun, Z. Zhongjin, L. Li, and W. Zhongfeng, "An FPGA implementation of array LDPC decoder," in *Circuits and Systems, 2006. APCCAS 2006. IEEE Asia Pacific Conference on*, 2006, pp. 1675-1678.

A. J. Blanksby and C. J. Howland, "A 690-mW 1-GB/s 1024-b, rate-1/2 low-density parity-check code decoder," *Solid-State Circuits, IEEE Journal of*, vol. 37, pp. 404-412, 2002.

P. Radosavljevic, A. de Baynast, M. Karkooti, and J. R. Cavallaro, "Multi-rate high-throughput LDPC decoder: tradeoff analysis between decoding throughput and area," in *IEEE 17th International Symposium on, Personal, Indoor and Mobile Radio Communications, 2006* 2006, pp. 1-5.

A. Prabhakar, K. Narayanan, "Memory efficient scalable decoder architectures for low density parity check codes," Wireless Communication Laboratory Tech Report, Texas A&M, 2006, ID: WCL-TR-06-104, May 12, 2006, http://wclb.tamu.edu/research.html.

A, Prabhakar and K. Narayanan, "Pseudorandom construction of low-density parity-check codes using linear congruential sequences," *IEEE Transactions on Communications*, vol. 50, pp. 1389-1396, 2002.

C. Jones, E. Valles, M. Smith, and J. Villasenor, "Approximate-MIN constraint node updating for LDPC code decoding," in *IEEE Military Communications Conference, 2003. MILCOM 2003*. 2003, pp. 157-162 vol. 151.

(56) References Cited

OTHER PUBLICATIONS

O. Daesun and K. K. Parhi, "Performance of Quantized Min-Sum Decoding Algorithms for Irregular LDPC Codes," in *IEEE International Symposium on Circuits and Systems, 2007. ISCAS 2007*. May 2007, pp. 2758-2761.
P. Li and W. K. Leung, "Decoding low density parity check codes with finite quantization bits," in *IEEE Communications Letters*, vol. 4, pp. 62-64, 2000.
T. Zhang, Z. Wang, and K. K. Parhi, "On finite precision implementation of low density parity check codes decoder," in *The 2001 IEEE International Symposium on Circuits and Systems, 2001. ISCAS 2001*, 2001, pp. 202-205 vol. 204.
J. Campello, D. S. Modha, and S. Rajagopalan, "Designing LDPC codes using bit-filling," in *IEEE International Conference on Communications, 2001. ICC 2001*, 2001, pp. 55-59 vol. 51.
Selvarathinam, Anand Manivannan (2005). High throughput low power decoder architectures for low density parity check codes. Doctoral dissertation, Texas A&M University. Texas A&M University. Available electronically from http://repository.tamu.edu/handle/1969.1/2529?show=full.
B. Vasic, "High-rate low-density parity check codes based on anti-Pasch affine geometries," in *IEEE International Conference on Communications, 2002. ICC 2002*. 2002, pp. 1332-1336 vol. 1333.
P. Radosavljevic, A. de Baynast, and J. R. Cavallaro, "Optimized Message Passing Schedules for LDPC Decoding," in *Conference Record of the Thirty-Ninth Asilomar Conference on Signals, Systems and Computers, 2005*. 2005, pp. 591-595.
E. Sharon, S. Litsyn, and J. Goldberger, "An efficient message-passing schedule for LDPC decoding," in *Proceedings. of 2004 23rd IEEE Convention of Electrical and Electronics Engineers in Israel, 2004.*, 2004, pp. 223-226.
M. M. Mansour and N. R. Shanbhag, "Memory-efficient turbo decoder architectures for LDPC codes," in *IEEE Workshop on Signal Processing Systems, 2002. (SIPS '02)*. 2002, pp. 159-164.
T. Bhatt, V. Sundaramurthy, V. Stolpman, and D. McCain, "Pipelined Block-Serial Decoder Architecture for Structured Ldpe Codes," in *Proceedings of IEEE International Conference on Acoustics, Speech and Signal Processing, 2006. ICASSP 2006*, 2006, pp. IV-IV.
F. Guilloud, "Generic architecture for LDPC codes decoding," PHD thesis, ENST Paris, Jul. 2004.
T. Brack, et al., "Low Complexity LDPC Code Decoders for Next Generation Standards," in *Design, Automation & Test in Europe Conference & Exhibition, 2007. Date '07*, 2007, pp. 1-6.
T. Brack, M. Alles, F. Kienle, and N. Wehn, "A Synthesizable IP Core for WIMAX 802.16E LDPC Code Decoding," in *IEEE 17th International Symposium on Personal, Indoor and Mobile Radio Communications, 2006*. 2006, pp. 1-5.
N. Wiberg, "Codes and decoding on general graphs," Ph.D. Dissertation, Linkoping University, Sweden, 1996. Available: http://www.essrl.wustl.edu/~jao/itrg2000/.
The Boost Graph Library, http://www.boost.org/libs/graph/.
Shimizu et al., "Partially-parallel LDPC decoder based on high-efficiency message-passing algorithm," in *IEEE Conference on Computer Design (ICCD)*, Oct. 2005, San Jose, CA. Available: www.iccd-conference.org/proceedings/2005/080.sub.--shimizu.sub.--partiall- y.pdf.
Kim et al., "Parallel VLSI architectures for a class of LDPC codes," in *IEEE Int'l Symposium of Circuits and Systems* (ISCAS), 2002; available: www.cdslab.ece.umn.edu/cdslab/library/papers/iscas.sub.-- 02a.pdf.
M. Karkooti, P. Radosavljevic, and J. R. Cavallaro, "Configurable, high throughput, iregular LDPC decoder architecture: tradeoff analysis and implementation," in *International Conference on Application-specific Systems, Architectures and Processors, 2006. ASAP '06*. 2006, pp. 360-367.
M. Karkooti, "Semi-parallel architectures for real-time LDPC coding," Master's Thesis, Rice University, Houston, TX, May 2004.
C. Zhiqiang and W. Zhongfeng, "Area-efficient parallel decoder architecture for high rate QC-LDPC codes," in *Proceeding of 2006 IEEE International Symposium on Circuits and Systems. ISCAS 2006*. May 2006, pp. 4 pp. 5110.
C. Zhiqiang and W. Zhongfeng, "A 170 Mbps (8176, 7156) quasi-cyclic LDPC decoder implementation with FPGA," in *2006 IEEE International Symposium on Circuits and Systems, 2006. ISCAS 2006. Proceedings.*, May 2006, p. 4 pp.
Kiran K. Gunnam, Gwan S. Choi, Mark B. Yeary, "Word length Analysis for LDPC decoders" Texas A&M Technical Note Draft, unpublished report dated 2006.
Kiran Gunnam, Gwan Choi, Mark Yeary, "Architectures for Decoding of Structured LDPC Codes Using the On-the-Fly Computation Paradigm" Texas A&M Technical Note, May 2006.
Kiran Gunnam, Gwan Choi "A Low Power Architecture for Min-Sum Decoding of LDPC Codes", Texas A&M Technical Note, May 2006.
Kiran Gunnam, Gwan Choi, "Efficient Hardware Implementation of Min-Sum with Conditional Correction for LDPC Decoding" Texas A&M Technical Note, May 2006.
Kiran K. Gunnam, Gwan S. Choi, Mark B. Yeary, "Value-Reuse Properties of Min-Sum for GF(q)", Texas A&M Technical Note, Report dated Oct. 2006, Published about Aug. 2010.
Zhong et al., "Iterative MAX-Lag-MAP and LDPC Detector/Decoder Hardware Implementation for Magnetic Read Channel", SRC Technical Publication Abstract, pp. 1. Jul. 2005 Available at http://www.src.org/library/publication/p012802/.
Zhong et al., "High-Rate Quasi-Cyclic LDPC Codes for Magnetic Recording Channel with Low Error Floor", ISCAS, IEEE pp. 3546-3549, May 2006.
Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.
Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Report dated Jul. 2006. Available online at http://dropzone.tam.edu Mar. 2010, pp. 1-5.
Richardson, Tom, "Error Floors of LDPC Codes," Allerton Conf. on Communication, Control and Computing, (Monticello, Illinois), Oct. 2003, pp. 1426-1435.
Cole, Chad A. and Hall, Eric K., "Analysis and Design of Moderate Length Regular LDPC 39 Codes with Low Error Floors," Proc, 40th Conf. Information Sciences and Systems, Princeton, NJ, 2006, 6 pgs.
Stefan Landner, Olgica Milenkovic- "Algorithmic and Combinatorial Analysis of Trapping Sets in Structured LDPC Codes", International Conference on Wireless Networks, Communications and Mobile Computing, 2005. pp. 630-635, vol. 1.
Hao Zhong, Tong Zhang—"Block- LDPC: A Practical LDPC Coding System Design Approach", IEEE transactions on circuits and systems-I: Regular Papers, Apr. 2005, pp. 766-775, vol. 52.
Thomas J. Richardson and Rudiger L. Urbanke—"Efficient Encoding of Low-Density Parity-Check Codes", IEEE Transactions on Information Theory, Feb. 2001,pp. 638-656, vol. 47, No. 2.
Tom Richardson—"Error Floors of LDPC Codes", IEEE Transactions on Information Theory, Feb. 2001, pp. 1426-1435, vol. 47, No. 2.
E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005, pp. 1-4.
David J.C. MacKay—"Information Theory, Inference, and Learning Algorithms", Cambridge University Press Sep. 2003, pp. 640.
R. Michael Tanner, Deepak Sridhara, Arvind Sridharan, Thomas E. Fuja, and Daniel J. Costello, Jr.—"LDPC Block and Convolutional Codes Based on Circulant Matrices", IEEE Transactions on Information Theory, Dec. 2004, Pagers): 2966-2984, vol. 50, No. 12.
Amin Shokrollahi—"LDPC Codes: An Introduction, in Coding, Cryptography and Combinatories", Computer Science and Applied Logic, Birkhauser, Basel, 2004, pp. 85-110, vol. 23.
Yang Han and William E. Ryan—"LDPC Decoder Strategies for Achieving Low Error Floors", Proceedings of Information Theory and Applications Workshop, San Diego, CA, Jan. 2008, pp. 1-10.

(56) References Cited

OTHER PUBLICATIONS

Mohammad M. Mansour and Naresh R. Shanbhag—"Low Power VLSI decoder architectures for LDPC codes" International Symposium on Low Power Electronics and Design Proceedings of the 2002, ICIMS Research Center, 2002, Pagers): 284-289.
Dale E. Hocevar—"A Reduced Complexity Decoder Architecture Via Layered Decoding of LDPC Codes", IEEE Workshop on Signal Processing Systems, 2004, pp. 107-112.
Robert G. Gallager—"Low Density Parity—Check Codes", Cambridge Mass Jul. 1963, pp. 90.
T. Richardson and R. Urbanke—"Modern Coding Theory", Cambridge University Press, Preliminary version—Oct. 18, 2007, pp. 590.
In-Cheol Park; Se-Hyeon Kang; , "Scheduling algorithm for partially parallel architecture of LDPC decoder by matrix permutation," Circuits and Systems, 2005. ISCAS 2005. IEEE International Symposium on , vol. No., pp. 5778-5781 vol. 6, May 23-26, 2005. doi: 10.1109/ISCAS.2005.1465951.
D.J.C. MacKay and R.M. Neal—"Near Shannon limit performance of low density parity check codes", Electronics Letters Mar. 13, 1997, pp. 458-459, vol. 33 No. 6.
Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299, vol. 53, No. 8.
Andrew J. Blanksby and Chris J. Howland - "A690-mw 1Gb/s 1024-b, Rate ½ Low-Density Parity Check Code Decoder," IEEE Journal of Solid- State Circuits, Mar. 202, pp. 404-412, vol. 37, No. 3.
R.Michael Tanner—"A Recursive Approach to Low Complexity Codes", IEEE transaction on Information Theory, Sep. 1981, pp. 533-547, vol. IT-27, No. 5.
Mohammad M. Mansour, and Naresh R. Shanbhag - "A 640-Mb/s 2048-Bit Programmable LDPC Decoder Chip", IEEE Journal of Solid-State Circuits, Mar. 2006, pp. 684-698, vol. 41, No. 3.
Badri N. Vellambi R, and Faramarz Fekri, "An Improved Decoding Algorithm for Low-Density Parity-Check Codes over the Binary Erasure Channel", IEEE Globecom 2005 proceedings, pp. 1182-1186.
Yang Han, William E. Ryan—"Low-Floor Decoders for LDPC Codes", IEEE Transactions on Communications, vol. 57, No. 6, Jun. 2009, pp. 1663-1673.
Cavus et al., "A Performance Improvement and Error Floor Avoidance Technique for Belief Propagation Decoding of LOPC Codes," IEEE 16th International Symposium, Personal, Indoor & Mobile Radio Communications (PIMRC), Berlin, Germany Sep. 11-14, 2005, pp. 2386-2390.
Cavus, Enver et al., "An IS Simulation Technique for Very Low BER Performance Evaluation of LDPC Codes," IEEE International Conference on Communications, Jun. 1, 2006,pp. 1095-1100.
Eunchcol Kim; Choi, G.S.; , "LDPC Code for Reduced Routing Decoder," Communications, 2005 Asia-Pacific Conference on , vol. No., pp. 991-994, Oct. 5-5, 2005. doi: 10.1109/APCC.2005.1554212.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VLSI Implementation", IEEE Transactions on Magnetics, v. 43, pp. 1118-1123, Mar. 2007.
Zhong, "VLSI Architecture of LDPC Based Signal Detection and Coding System for Magnetic Recording Channel", Thesis, RPI, Troy, NY, pp. 1-95, May 2006.
Fisher, R et al., "Adaptive Thresholding"[online] 2003 [retrieved on May 28, 201 OJ Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Matrices" IEEE Transactions on Information Theory, vol. 50, No. 8 Aug. 8, 2004.

Lee et al., "Partial Zero-Forcing Adaptive MMSE Receiver for DS-CDMA Uplink in Multicell Environments" IEEE Transactions on Vehicular Tech. Vol. 51, No. 5, Sep. 2002.
Collins and Hizlan, "Determinate State Convolution Codes" IEEE Transactions on Communications, Dec. 1993.
Eleftheriou, E. et al., "Low Density Parity Check Codes for Digital Subscriber Lines", Proc ICC 2002, pp. 1752-1757.
Han and Ryan, "Pinning Techniques for Low-Floor Detection/Decoding of LDPC-Coded Partial Response Channels", 5th International Symposium on Turbo Codes &Related Topics, 2008.
Mohsenin et al., "Split Row: A Reduced Complexity, High Throughput LDPC Decoder Architecture", pp. 1-6, printed from www.ece.ucdavis.edu on Jul. 9, 2007.
Sari H et al., "Transmission Techniques for Digital Terrestrial TV Broadcasting" IEEE Communications Magazine, IEEE Service Center NY, NY vol. 33, No. Feb. 2, 1995.
Unk, "Auto threshold and Auto Local Threshold" [online] [retr. May 28, 2010] Retr. from the Internet www.dentistry.bham.ac.ukllandinig/software/autothreshold/autothreshold.html.
Vasic, B. "High-Rate Low-Density Parity-check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Wang Y et al., "A Soft Decision Decoding Scheme for Wireless COFDM With App. to DVB-T" IEEE Transactions on Consumer elect., IEEE Service Center, NY,NY vo. 50, No. 1 Feb. 2004.
Weon-Cheol L. et al., "Viterbi Decoding Method Using Channel State Information in COFDM System" IEEE Trans. on Consumer Elect., IEEE Service Center, NY, NY vol. 45 No. 3 Aug. 1999.
Yeo et al., "VLSI Architecture for Iterative Decoders in Magnetic Storage Channels", Mar. 2001, pp. 748-755, IEEE trans. Magnetics, vol. 37, No. 2.
Zhong et al., "Area-Efficient Min-Sum Decoder Design for High-Rate Quasi-Cyclic. Low-Density Parity-Check Codes in Magnetic Recording", pp. 1-4, Dec. 2007.
Zhong, "Block-LDPC: A Practical LDPC Coding System Design Approach", IEEE Trans. on Circuits, Regular Papers, vol. 5, No. 4, pp. 766-775, Apr. 2005.
Gunnam, K., et al., "A Low Power Preamble Detection Methodology for Packet Based Modems," Texas A&M University, ECE Technical Report, Jun. 2006, TAMU-ECE-2006-06 (dropzone.tamu.edu).
Sharon, E., et al., "An Efficient Message-Passing Schedule for LDPC Decoding," Proceeding. 2004 23rd IEEE Convention of Electrical and Electronics Engineers in Israel, pp. 223-226 (Sep. 6-7, 2004).
Sun, Y., et al., "High Throughput, Parallel, Scalable LDPC Encoder/Decoder Architecture for OFDM Systems," 2006 IEEE Dallas/CAS Workshop on Design, Applications, Integration and Software, pp. 39-42 (Oct. 2006).
Sun, Y., "VLSI Decoder Architecture for High-Throughput, Variable Block-size and Multi-rate LDPC Codes," IEEE International Symposium on Circuits and Systems, 2007, pp. 2104-2107 (May 27-30, 2007).
Wang, W., et al., "Low-Power VLSI Design of LDPC Decoder Using DVFS for AWGN Channels," 2009 22nd International Conference on VLSI Design, pp. 51-56 (Jan. 8-9, 2009).
Vila Casado, Andres I.Weng, Wen-Yen and Wesel, Richard D. "Multiple Rate Low-Density Parity-Check Codes with Constant Blocklength," IEEE 2004. pp. 2010-2014.
Vila Casado, Andres I. "Multiple-rate Low-density Parity-check Codes with Constant Blocklength," UCLA 35 Technologies Available for Licensing Copyright © 2009 The Regents of the University of California. http://www.research.ucla.edu/techlucla05-074.htm (2 pages).
Sripimanwat, K., "Turbo Code Applications: A Journey From a Paper to Realization", Oct. 26, 2005, Springer, p. 27.
Jun Tang; Bhatt, T.; Sundaramurthy, V.; Parhi, K.K.; , "Reconfigurable Shuffle Network Design in LDPC Decoders," Application-specific Systems, Architectures and Processors, 2006. ASAP '06. International Conference on , vol. No., pp. 81-86, Sep. 11-13, 2006.

(56) References Cited

OTHER PUBLICATIONS

S. Sivakumar, "VLSI Implementation of Encoder and Decoder for Low Density parity check codes," Master's Thesis, Texas A&M University, Dec. 2001.

Yongmei Dai; Zhiyuan Yan; , "Coset-based quasi-cyclic LDPC codes for optimal overlapped message passing decoding," *Signal Processing Systems Design and Implementation, 2005. IEEE Workshop on* , vol. No., pp. 762-767, Nov. 2-4, 2005.

Jun-Chich Chen; Ting, I.; Chih-Lin I; Jiunn-Tsair Chen; , "A novel broadcast scheduling strategy using factor graphs and sum-product algorithm," *Global Telecommunications Conference, 2004. GLOBECOM '04. IEEE* , vol. 6, No., pp. 4048-4053 vol. 6, Nov. 29-Dec. 3, 2004.

Segard, A.; Verdier, F.; Declercq, D.; Urard, P.; , "A DVB-S2 compliant LDPC decoder integrating the Horizontal Shuffle Scheduling," *Intelligent Signal Processing and Communications, 2006. ISPACS '06.* International Symposium on , vol. No., pp. 1013-1016, Dec. 12-15, 2006.

Jaebum Kim; Namsik Kim; Hyuncheol Park; , "Fast convergence decoding scheme for regular LDPC codes," *Intelligent Signal Processing and Communication Systems, 2004. ISPACS 2004. Proceedings of 2004 International Symposium on* , vol. No., pp. 454-458, Nov. 18-19, 2004.

Yongyi Mao; Banihashemi, A.H.; , "Decoding low-density parity-check codes with probabilistic scheduling," *Communications Letters, IEEE* , vol. 5, No. 10, pp. 414-416, Oct. 2001.

Tarable, A.; Benedetto, S.; Montorsi, G.; , "Mapping interleaving laws to parallel turbo and LDPC decoder architectures," *Information Theory, IEEE Transactions on* , vol. 50, No. 9, pp. 2002-2009, Sep. 2004.

Sharon, Eran; Litsyn, Simon; Goldberger, Jacob; , "Convergence Analysis of Serial Message-Passing Schedules for LDPC Decoding," *Turbo Codes&Related Topics; 6th International ITG-Conference on Source and Channel Coding (TURBOCODING), 2006 4th International Symposium on* , vol. No., pp. 1-6, Apr. 3-7, 2006.

Xiong Lei; Tan Zhenhui; Yao Dongping; , "The Moderate-Throughput and Memory-Efficient LDPC Decoder," *Signal Processing, 2006 8th International Conference on* , vol. 3, No., 16-20 2006.

Yanni Chen; Parhi, K.K.; , "Overlapped message passing for quasi-cyclic low-density parity check codes," *Circuits and Systems I: Regular Papers, IEEE Transactions on* , vol. 51, No. 6, pp. 1106-1113, Jun. 2004.

Yongmei Dai; Zhiyuan Yan; , "Optimal overlapped message passing decoding for quasi-cyclic low-density parity-check codes," *Global Telecommunications Conference, 2005. GLOBECOM '05. IEEE* , vol. 4, No., pp. 5 pp. 2399, Dec. 2-2, 2005.

Yongyi Mao; Banihashemi, A.H.; , "A new schedule for decoding low-density parity-check codes," *Global Telecommunications Conference, 2001. GLOBECOM '01. IEEE* , vol. 2, No., pp. 1007-1010 vol. 2, 2001.

Malema, G.; Liebelt, M.; , "Interconnection Network for Structured Low- Density Parity-Check Decoders," *Communications, 2005 Asia-Pacific Conference on* , vol. No., pp. 537-540, Oct. 5-5, 2005.

Zhang, T.; Parhi, K.K.; , "High-performance, low-complexity decoding of generalized low-density parity-check codes," *Global Telecommunications Conference, 2001. GLOBECOM '01. IEEE* , vol. 1, No., pp. 181-185 vol. 1, 2001.

Al-Rawi, G.; Cioffi, J.; Motwani, R.; Horowitz, M.; , "Optimizing iterative decoding of low-density parity check codes on programmable pipelined parallel architectures," *Global Telecommunications Conference, 2001. GLOBECOM '01. IEEE* , vol. 5, No., pp. 3012-3018 vol. 5, 2001.

Bayramoglu, Muhammet Fatih; Yilmaz, Ali Oezguer; Baykal, Buyurman; , "Sub Graph Approach in Iterative Sum-Product Algorithm," Turbo Codes&Related Topics; 6th International ITG-Conference on Source and Channel Coding (TURBOCODING), 2006 4th International Symposium on , vol. No., pp. 1-6, Apr. 3-7, 2006.

Shimizu, K.; Ishikawa, T.; Togawa, N.; Ikenaga, T.; Goto, S.; , "A parallel LSI architecture for LDPC decoder improving message-passing schedule," *Circuits and Systems, 2006. ISCAS 2006. Proceedings. 2006 IEEE International Symposium on* , vol. No., pp. 4 pp., May 21-24, 2006.

Hua Xiao; Banihashemi, A.H.; , "Graph-based message-passing schedules for decoding LDPC codes," *Communications, IEEE Transactions on* , vol. 52, No. 12, pp. 2098-2105, Dec. 2004.

Sharon, E.; Litsyn, S.; Goldberger, J.; , "An efficient message-passing schedule for LDPC decoding," *Electrical and Electronics Engineers in Israel, 2004. Proceedings. 2004 23rd IEEE Convention of* , vol. No., pp. 223-226, Sep. 6-7, 2004.

Li Yanping; Moon Ho Lee; GiYean Hwang; Ju Yong Park; , "New implementation for the scalable LDPC-decoders," *Vehicular Technology Conference, 2004. VTC 2004-Spring. 2004 IEEE 59th* , vol. 1, No., pp. 343-346 vol. 1, May 17-19, 2004.

Shimizu, K.; Togawa, N.; Ikenaga, T.; Goto, S.; , "Memory-Efficient Accelerating Schedule for LDPC Decoder," *Circuits and Systems, 2006. APCCAS 2006. IEEE Asia Pacific Conference on* , vol. No., pp. 1317-1320, Dec. 4-7, 2006.

Rovini, M.; Martinez, A.; , "On the Addition of an Input Buffer to an Iterative Decoder for LDPC Codes," *Vehicular Technology Conference, 2007. VTC2007-Spring. IEEE 65th* , vol. No., pp. 1995-1999, Apr. 22-25, 2007.

Jianquan Liu; Youyun Xu; Yueming Cai; , "Reduced Complexity and Improved Performance for Short Regular LDPC Codes Based on Select Updating Schedule," *Vehicular Technology Conference, 2007. VTC2007-Spring. IEEE 65th* , vol. No., pp. 1534-1538, Apr. 22-25, 2007.

Dore, Jean-Baptiste; Hamon, Marie-Helene; Penard, Pierre; , "Design and Decoding of a Serial Concatenated Code Structure based on Quasi-Cyclic LDPC Codes," *Turbo Codes&Related Topics; 6th International ITG-Conference on Source and Channel Coding (TURBOCODING), 2006 4th International Symposium on* , vol. No., pp. 1-6, Apr. 3-7, 2006.

Se-Hyeon Kang; In-Cheol Park; , "Loosely coupled memory-based decoding architecture for low density parity check codes," *Circuits and Systems I: Regular Papers, IEEE Transactions on* , vol. 53, No. 5, pp. 1045-1056, May 2006.

Juntan Zhang; Fossorier, M.P.C.; , "Shuffled iterative decoding," *Communications, IEEE Transactions on* , vol. 53, No. 2, pp. 209-213, Feb. 2005.

Gong Chen; Liu Qi; Cui Huijuan; Tang Kim; , "Normalized Switch Schemes for Low Density Parity Check Codes," *Computational Engineering in Systems Applications, IMACS Multiconference on* , vol. 2, No., pp. 1592-1599, Oct. 4-6, 2006.

Mansour, M.M.; Shanbhag, N.R.; , "Turbo decoder architectures for low-density parity-check codes," *Global Telecommunications Conference, 2002. GLOBECOM '02, IEEE* , vol. 2, No., pp. 1383-1388 vol. 2, Nov. 17-21, 2002.

Se-Hyeon Kang; In-Cheol Park; , "Loosely coupled memory-based decoding architecture for low density parity check codes," *Custom Integrated Circuits Conference, 2005. Proceedings of the IEEE 2005* , vol. No., pp. 703-706, Sep. 18-21, 2005.

Hemati, S.; Banihashemi, A.H.; , "Comparison between continuous-time asynchronous and discrete-time synchronous iterative decoding," *Global Telecommunications Conference, 2004. GLOBECOM '04. IEEE* , vol. 1, No., pp. 356-360 vol. 1, Nov. 29-Dec. 3, 2004.

Nouh, A.; Banihashemi, A.H.; , "Bootstrap decoding of low-density parity-check codes," *Communications Letters, IEEE* , vol. 6, No. 9, pp. 391-393, Sep. 2002.

Mansour, M.M.; , "High-performance decoders for regular and irregular repeat-accumulate codes," *Global Telecommunications Conference, 2004. GLOBECOM '04. IEEE* , vol. 4, No., pp. 2583-2588 vol. 4, Nov. 29-Dec. 3, 2004.

Juntan Zhang; Fossorier, M.; , "Shuffled belief propagation decoding,"*Signals, Systems and Computers, 2002. Conference Record of the Thirty-Sixth Asilomar Conference on* , vol. 1, No., pp. 8-15 vol. 1, Nov. 3-6, 2002.

Tarable, A.; Benedetto, S.; , "Further results on mapping functions," *Information Theory Workshop, 2005 IEEE* , vol. No., pp. 5 pp., Aug. 29-Sep. 1, 2005.

(56) References Cited

OTHER PUBLICATIONS

Jing Li; Narayanan, K.R.; Georghiades, C.N.; , "Product accumulate codes: a class of codes with near-capacity performance and low decoding complexity," *Information Theory, IEEE Transactions on*, vol. 50, No. 1, pp. 31-46, Jan. 2004.
Sheng Tong; Xinmei Wang; , "A simple convergence comparison of Gallager codes under two message-passing schedules," *Communications Letters, IEEE*, vol. 9, No. 3, pp. 249-251, Mar. 2005.
Chauhan, O.S.; Moon, T.K.; Gunther, J.H.; , "Accelerating the convergence of message passing on loopy graphs using eigen messages," *Signals, Systems and Computers, 2003. Conference Record of the Thirty-Seventh Asilomar Conference on*, vol. 1, No., pp. 79-83 vol. 1, Nov. 9-12, 2003.
U.S. Appl. No. 12/113,755 Final Office Action dated Jul. 13, 2012, 34 pages.
U.S. Appl. No. 12/113,729 Office Action dated Oct. 26, 2011, 28 pages.
U.S. Appl. No. 12/113,729 Response to Office Action dated Oct. 26, 2011.
U.S. Appl. No. 12/113,729 Final Office Action dated Apr. 26, 2012, 11 pages.
U.S. Appl. No. 12/113,729 Response to Final Office Action dated Apr. 26, 2012.
U.S. Appl. No. 12/113,729 Office Action dated Jul. 5, 2012, 16 pages.
U.S. Appl. No. 12/113,729 Response to Office Action dated Jul. 5, 2012.
U.S. Appl. No. 12/113,755 Office Action dated Oct. 26, 2011, 21 pages.
U.S. Appl. No. 12/113,755 Response to Office Action dated Oct. 26, 2011.
U.S. Appl. No. 12/113,755 Office Action dated Apr. 10, 2012, 17 pages.
U.S. Appl. No. 12/113,755 Response to Office Action dated Apr. 10, 2012.
U.S. Appl. No. 12/113,755 RCE Response to Final Office Action dated Jul. 13, 2012.
Notice of Allowance dated Nov. 16, 2012 for U.S. Appl. No. 12/113,729 (5 p.).
Notice of Allowance dated Jan. 15, 2013 for U.S. Appl. No. 12/113,755 (9 p.).
Notice of Allowance dated May 30, 2013 for U.S. Appl. No. 13/759,225 (13 p.).
U.S. Appl. No. 13/693,650 Office Action dated Jun. 12, 2013 (47 p.).
U.S. Appl. No. 13/693,650 Response to Office Action dated Jun. 12, 2013 filed Sep. 12, 2013 (15 p.).
Notice of Allowance dated Sep. 25, 2013 for U.S. Appl. No. 13/693,650 (8 p.).
Supplemental Notice of Allowability dated Jan. 14, 2014 for U.S. Appl. No. 13/693,650 (3 p.).
U.S. Appl. No. 60/830,045, filed Jul. 10, 2006 (9 p.).
U.S. Appl. No. 14/141,508 Office Action dated Dec. 22, 2014 (55 p.).
U.S. Appl. No. 14/141,508 Response to Office Action dated Dec. 22, 2014 filed Mar. 23, 2015 (11 p.).
Notice of Allowance dated Apr. 7, 2015 for U.S. Appl. No. 14/141,508 (8 p.).
U.S. Appl. No. 14/792,982 Office Action dated Oct. 1, 2015 (14 pages).
U.S. Appl. No. 14/792,982 Response to Office Action dated Oct. 1, 2015, filed Jan. 29, 2016 (8 pages).
U.S. Appl. No. 14/792,982 Final Office Action dated May 19, 2016 (12 pages).
U.S. Appl. No. 14/792,982 Appeal Brief filed Oct. 19, 2016 (13 pages).
Zhang, Juntan, et al., "Improved Min-Sum Decoding of LDPC Codes Using 2-Dimensional Normalization, " Mitsubishi Electric Research Laboratories, Jun. 2006 (8 p.).
Examiner's Answer dated Feb. 7, 2017, for U.S. Appl. No. 14/792,982 (12 p.).
Decision of Appeal dated Jan. 29, 2018, for U.S. Appl. No. 14/792,982 (7 p.).
Request for Continued Examination and Response to Decision on Appeal dated Jan. 29, 2018, for U.S. Appl. No. 14/792,982; Response filed Mar. 28, 2018 (10 p.).
Notice of Allowance dated Apr. 25, 2018, for U.S. Appl. No. 14/792,982 (5 p.).
Notice of Allowance dated Aug. 14, 2018, for U.S. Appl. No. 14/792,982 (5 p.).
Office Action dated Sep. 6, 2019, for U.S. Appl. No. 16/164,778 (58 p.).
Response to Office Action dated Sep. 6, 2019 filed Dec. 3, 2019, for U.S. Appl. No. 16/164,778 (8 p.).
Notice of Allowance dated Dec. 31, 2019, for U.S. Appl. No. 16/164,778 (5 p.).
Office Action dated Jan. 11, 2019, for U.S. Appl. No. 15/373,822 (58 p.).
Response to Office Action dated Jan. 11, 2019 filed May 10, 2019, for U.S. Appl. No. 15/373,822 (22 p.).
Final Office Action dated Aug. 21, 2019, for U.S. Appl. No. 15/373,822 (12 p.).
Response to Final Office Action dated Aug. 21, 2019 filed Oct. 21, 2019, for U.S. Appl. No. 15/373,822 (20 p.).
Advisory Action dated Nov. 21, 2019, for U.S. Appl. No. 15/373,822 (3 p.).
Notice of Appeal and Pre-Appeal Brief Request for Review filed Dec. 19, 2019, for U.S. Appl. No. 15/373,822 (9 p.).
Notice of Allowance and Examiner Initiated Interview Summary dated Mar. 30, 2020, for U.S. Appl. No. 15/373,822 (10 p.).
Applicant Initiated Interview Summary dated Jun. 15, 2020, for U.S. Appl. No. 15/373,822 (3 p.).
Request for Continued Examination and Amendment After Allowance filed Jun. 29, 2020, for U.S. Appl. No. 15/373,822 (24 p.).
Notice of Allowance dated Jul. 29, 2020, for U.S. Appl. No. 15/373,822 (5 p.).
Office Action dated Dec. 11, 2021, for U.S. Appl. No. 17/084,564 (69 pages).
Response to Office Action dated Dec. 11, 2021 filed Jan. 31, 2022, for U.S. Appl. No. 17/084,564 (11 pages).
Notice of Allowance dated Feb. 18, 2022, for U.S. Appl. No. 17/084,564 (5 pages).
Supplemental Notice of Allowability dated Mar. 4, 2022, for U.S. Appl. No. 17/084,564 (4 pages).
Office Action dated Dec. 7, 2022, for U.S. Appl. No. 17/744,576 (68 pages).
Response to Office Action dated Dec. 7, 2022 filed Mar. 7, 2023, for U.S. Appl. No. 17/744,576 (11 pages).
Notice of Allowance dated Mar. 27, 2023, for U.S. Appl. No. 17/744,576 (60 pages).
Supplemental Notice of Allowability dated Apr. 17, 2023, for U.S. Appl. No. 17/744,576 (4 pages).

\* cited by examiner

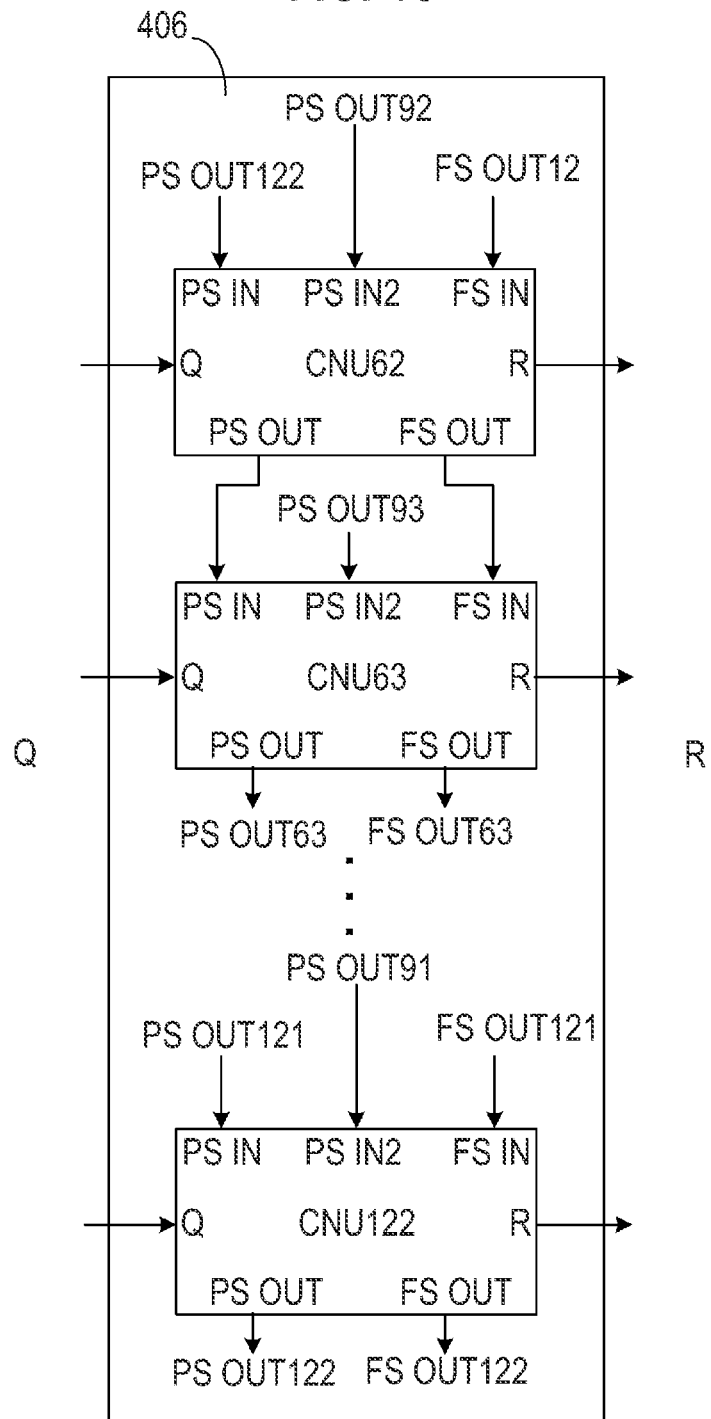

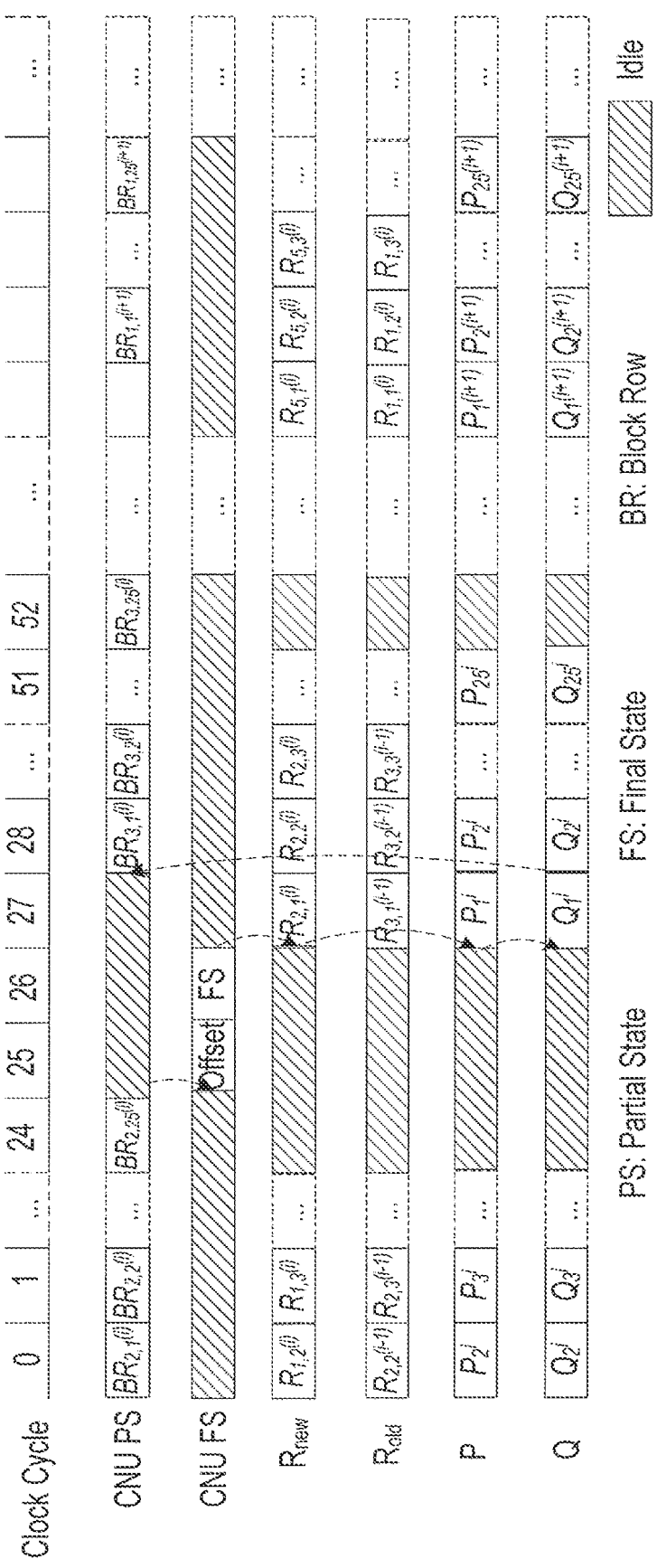

R SELECTION FOR R NEW OPERATES OUT OF ORDER TO FEED THE DATA FOR PS PROCESSING OF THE NEXT LAYER.

PREVIOUS LAYER   CURRENT LAYER   NEXT LAYER

| | | | | | | | | |
|---|---|---|---|---|---|---|---|---|
| 2 | 3 | 4 | 7 | 9 | 10 | 1 | 5 | 6 | 8 |
| 2 | 4 | 5 | 6 | 8 | 9 | 10 | 1 | 3 | 7 |
| 1 | 4 | 5 | 6 | 7 | 8 | 9 | 2 | 3 | 10 |
| 2 | 3 | 4 | 6 | 7 | 8 | 9 | 10 | 1 | 5 |
| 1 | 2 | 3 | 4 | 7 | 9 | 10 | 5 | 6 | 8 |
| 1 | 4 | 6 | 8 | 9 | 10 | 2 | 3 | 5 | 7 |
| 1 | 2 | 3 | 5 | 8 | 9 | 10 | 4 | 6 | 7 |
| 2 | 3 | 5 | 7 | 8 | 10 | 1 | 4 | 6 | 9 |

FIG. 51

| | | | | | | | | |
|---|---|---|---|---|---|---|---|---|
| 2 | 3 | 4 | 7 | 9 | 10 | 1 | 5 | 6 | 8 |
| 12 | 14 | 15 | 16 | 18 | 19 | 20 | 11 | 13 | 17 |
| 21 | 24 | 25 | 26 | 27 | 28 | 29 | 22 | 23 | 30 |
| 32 | 33 | 34 | 36 | 37 | 38 | 39 | 40 | 31 | 35 |
| 41 | 42 | 43 | 44 | 47 | 49 | 50 | 45 | 46 | 48 |
| 51 | 54 | 56 | 58 | 59 | 60 | 52 | 53 | 55 | 57 |
| 61 | 62 | 63 | 65 | 68 | 69 | 70 | 64 | 66 | 67 |
| 72 | 73 | 75 | 77 | 78 | 80 | 71 | 74 | 76 | 79 |

FIG. 52

| | | | | | | | | |
|---|---|---|---|---|---|---|---|---|
| 52 | 64 | 65 | 47 | 40 | 59 | 72 | 75 | 76 | 78 |
| 63 | 74 | 67 | 77 | 58 | 30 | 49 | 1 | 3 | 8 |
| 61 | 73 | 5 | 6 | 7 | 79 | 60 | 11 | 13 | 19 |
| 12 | 4 | 14 | 16 | 17 | 18 | 70 | 9 | 22 | 26 |
| 21 | 71 | 2 | 23 | 27 | 20 | 80 | 34 | 35 | 37 |
| 31 | 24 | 15 | 38 | 10 | 29 | 43 | 44 | 45 | 48 |
| 41 | 42 | 32 | 33 | 46 | 28 | 39 | 53 | 55 | 56 |
| 51 | 54 | 25 | 36 | 57 | 50 | 62 | 66 | 68 | 69 |

FIG. 53

| | | | | | | | | |
|---|---|---|---|---|---|---|---|---|
| 4 | 6 | 8 | 14 | 19 | 20 | 3 | 10 | 12 | 15 |
| 5 | 9 | 11 | 13 | 16 | 22 | 23 | 3 | 6 | 15 |
| 1 | 7 | 10 | 12 | 14 | 17 | 21 | 3 | 6 | 22 |
| 5 | 8 | 9 | 13 | 15 | 16 | 18 | 19 | 3 | 12 |
| 1 | 2 | 4 | 6 | 14 | 23 | 24 | 9 | 12 | 15 |
| 3 | 7 | 11 | 16 | 20 | 21 | 4 | 6 | 9 | 15 |
| 1 | 2 | 5 | 8 | 12 | 17 | 18 | 6 | 9 | 11 |
| 3 | 7 | 10 | 13 | 15 | 24 | 2 | 9 | 12 | 17 |

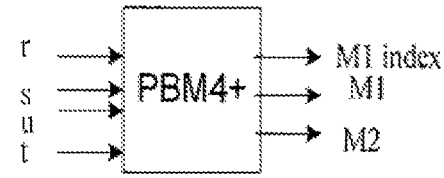
FIG. 59A
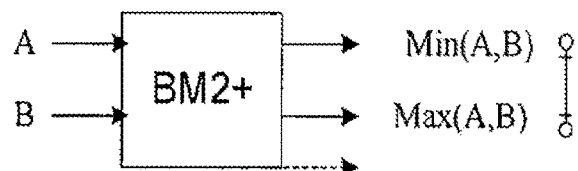
FIG. 59B
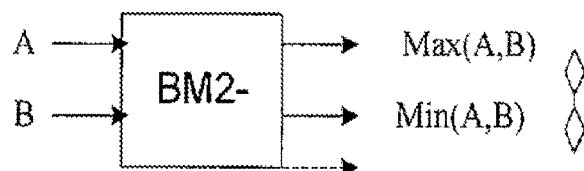
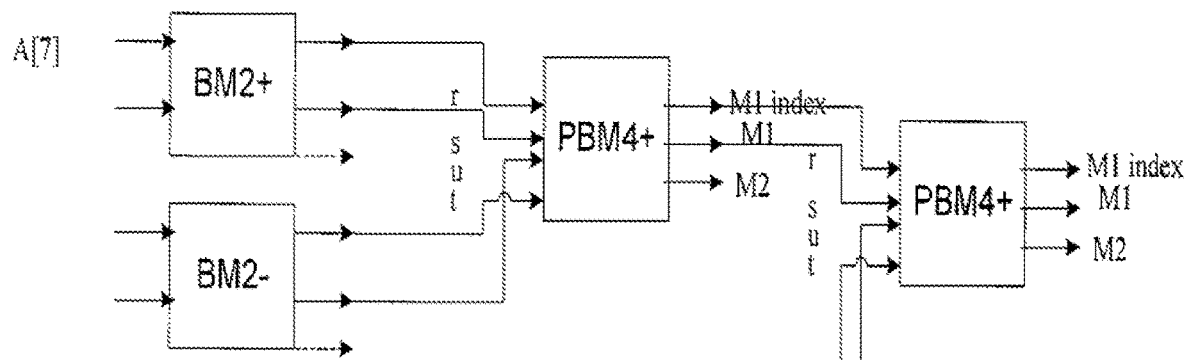
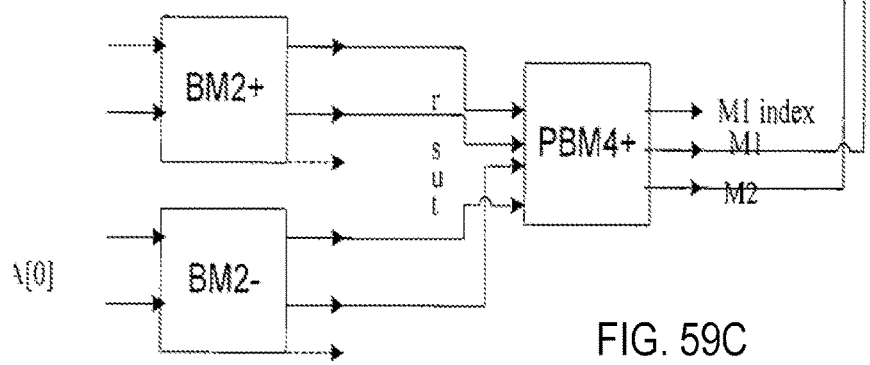
FIG. 59C

LOW DENSITY PARITY CHECK DECODER

CROSS-REFERENCE TO RELATED APPLICATIONS

This application is a continuation of U.S. patent application Ser. No. 17/744,576, filed May 13, 2022, (now U.S. Pat. No. 11,728,828), titled "Low Density Parity Check Decoder," which is a continuation of U.S. patent application Ser. No. 17/084,564, filed Oct. 29, 2020 (now U.S. Pat. No. 11,368,168), titled "Low Density Parity Check Decoder," which is a continuation of U.S. patent application Ser. No. 15/373,822, filed Dec. 9, 2016 (now U.S. U.S. Pat. No. 10,951,235), titled "Low Density Parity Check Decoder," which is a continuation of U.S. patent application Ser. No. 14/792,982, filed Jul. 7, 2015 (now U.S. Pat. No. 10,141, 950), titled "Low Density Parity Check Decoder," which is a continuation of U.S. patent application Ser. No. 14/141, 508, filed Dec. 27, 2013 (now U.S. Pat. No. 9,112,530), titled "Low Density Parity Check Decoder," which is a continuation of U.S. patent application Ser. No. 13/693,650, filed Dec. 4, 2012 (now U.S. Pat. No. 8,656,250), titled "Low Density Parity Check Decoder for Regular LDPC Codes," which is a continuation of U.S. patent application Ser. No. 12/113,729, filed May 1, 2008 (now U.S. Pat. No. 8,359,522), titled "Low Density Parity Check Decoder for Regular LDPC Codes," which claims priority from U.S. provisional patent application Ser. No. 60/915,320, filed May 1, 2007 and U.S. provisional patent application Ser. No. 60/988,680, filed Nov. 16, 2007. The disclosures of said applications are hereby incorporated herein by reference in their entireties.

BACKGROUND

Error correcting codes are used to automatically detect and correct errors in a received data signal. Generally, a data signal transmitter applies a selected encoding algorithm to a transmitted data signal. A receiver applies an appropriate decoder to determine whether the received signal was corrupted after transmission and to correct any errors detected. Low density parity check ("LDPC") codes are one of a variety of error correcting codes.

LDPC decoders operate near the Shannon limit. When compared to the decoding of turbo codes, low density parity check decoders require simpler computational processing, and they are more suitable for parallelization and low complexity implementation. Low density parity check decoders are applicable for error correction coding in a variety of next generation communication and data storage systems.

LDPC decoders require simpler computational processing than other error coding schemes. While some parallel low density parity check decoder designs for randomly constructed low density parity check codes suffer from complex interconnect issues, various semi-parallel and parallel implementations, based on structured low density parity check codes, alleviate the interconnect complexity.

Because of their superior performance and suitability for hardware implementation, LDPC codes are considered to be a promising alternative to other coding schemes in telecommunication, magnetic storage, and other applications requiring forward error correction.

SUMMARY

A variety of novel techniques for decoding low density parity check ("LDPC") codes are herein disclosed. The techniques disclosed present a number of advantages over known decoders, for example, embodiments allow for a reduction both in message storage memory and message routing logic. In accordance with at least some embodiments, a decoder comprises a check node unit ("CNU"). The CNU comprises a set of comparators for comparing stored minimum values to a received variable message Q. The total number of comparators in the set is less than the check node degree. A first comparator of the set determines a first minimum value, M1, by comparing a first stored minimum value, $M1_{PS}$, and the received variable message Q. A second comparator of the set determines a second minimum value, $M_2$, by comparing a second stored minimum value, $M_{1_{PS}}$, and the received variable message Q.

In other embodiments, a method for decoding a LDPC code comprises comparing a received variable message to a first stored minimum value to determine a new first minimum value. The received variable message is further compared to a second stored minimum value to determine new second minimum value. Indicia of the location of the new first minimum value are also determined. The new first minimum value, the new second minimum value and the indicia of the new first minimum value location are stored in a partial state storage array and provided to produce a message to a variable node.

In other embodiments, an LDPC decoder comprises a plurality of CNU arrays, each array comprising a plurality of CNUs, and each array processing a block row of an LDPC parity check matrix. The CNUs of each array are interconnected to perform a cyclic shift characteristic of the block row processed by the array.

In other embodiments, a method for decoding a LDPC code comprises applying a log-likelihood ratio ("LLR") as an initial variable message to a check node unit ("CNU") array. An array of CNUs processes a layer of an LDPC parity check matrix. The CNUs of the array are interconnected, without active routers, to provide incremental shifts in accordance with the number of incremental shifts characteristic of the blocks of the layer.

In other embodiments, an LDPC decoder comprises an R select unit, a Q message first-in first-out ("FIFO") memory, and a cyclic shifter. The R select unit provides an R message by selecting from a plurality of possible R message values. The Q message memory stores a Q message until an R message is generated by a CNU, the Q message and the R message are combined to provide a P message. The cyclic shifter shifts the P message.

In other embodiments, a method for decoding a LDPC code comprises selecting an R old message from a plurality of possible R old messages based on a message index value and a sign bit. A Q message is delayed in a FIFO memory until a CNU provides an R new message. The new R message and the delayed Q message are summed to produce a P message. The P message is cyclically shifted.

In other embodiments, an LDPC decoder comprises a first R select unit, a Q message generator, and a first cyclic shifter. The first R select unit provides an R message by selecting from a plurality of possible R message values. The Q message generator combines the R message with a P message to produce a Q message. The first cyclic shifter shifts the P message.

In other embodiments, a method for decoding a LDPC code comprises selecting a first R message from a plurality of previously generated R messages based on at least a message index value and a sign bit. A Q message is generated by combining the first R message with a P message. The P message is cyclically shifted.

In other embodiments, an LDPC decoder comprises an array of CNUs that performs block parallel processing. The array processes all the block columns of M, where M≤p, rows in a layer of an LDPC parity check matrix in one clock cycle.

In other embodiments, a method for decoding a LDPC code comprises performing block parallel processing wherein all the block columns of M, where M≤p, rows in a layer of an LDPC parity check matrix are processed in one clock cycle.

Notation and Nomenclature

Certain terms are used throughout the following description and claims to refer to particular system components. As one skilled in the art will appreciate, entities may refer to a component by different names. This document does not intend to distinguish between components that differ in name but not function. In the following discussion and in the claims, the terms "including" and "comprising" and "e.g." are used in an open-ended fashion, and thus should be interpreted to mean "including, but not limited to . . . ". The term "couple" or "couples" is intended to mean either an indirect or direct connection. Thus, if a first component couples to a second component, that connection may be through a direct connection, or through an indirect connection via other components and connections. The term "system" refers to a collection of two or more hardware and/or software components, and may be used to refer to an electronic device or devices, or a sub-system thereof. Further, the term "software" includes any executable code capable of running on a processor, regardless of the media used to store the software. Thus, code stored in non-volatile memory, and sometimes referred to as "embedded firmware," is included within the definition of software.

BRIEF DESCRIPTION OF THE DRAWINGS

In the following detailed description, reference will be made to the accompanying drawings, in which:

FIGS. 4B-4D show CNU arrays of the TPMP decoder in accordance with various embodiments;

FIGS. 6A and 6B show a pipeline architecture for regular coded messages in accordance with various embodiments;

Figures 15, 16, 17, 18:
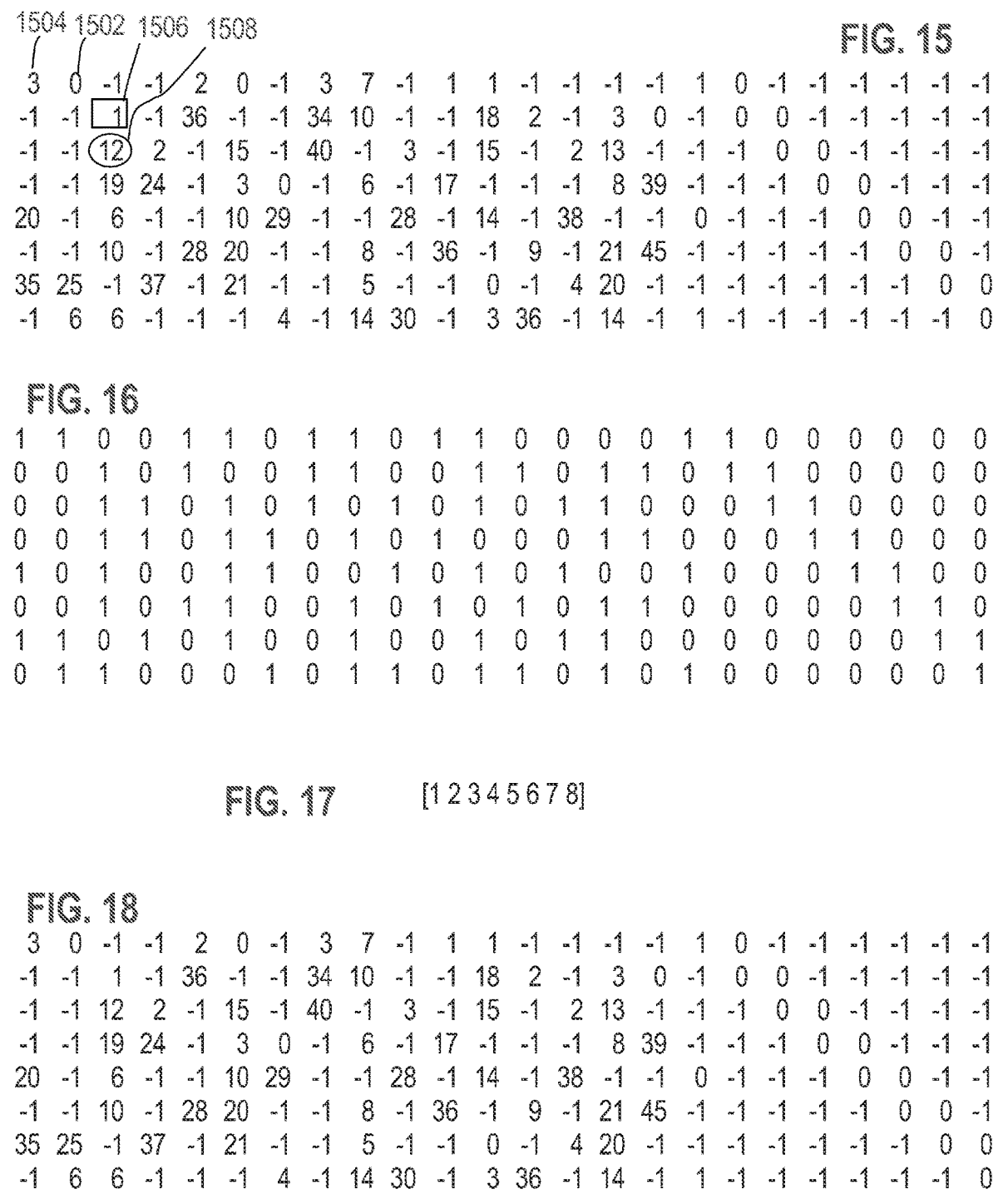

FIG. 15 shows an S matrix for an IEEE 802.16e rate 2/3 A code in accordance with various embodiments;

FIG. 16 shows an $H_b$ base matrix for an IEEE 802.16e rate 2/3 A code in accordance with various embodiments;

Figures 28, 29, 30, 31:
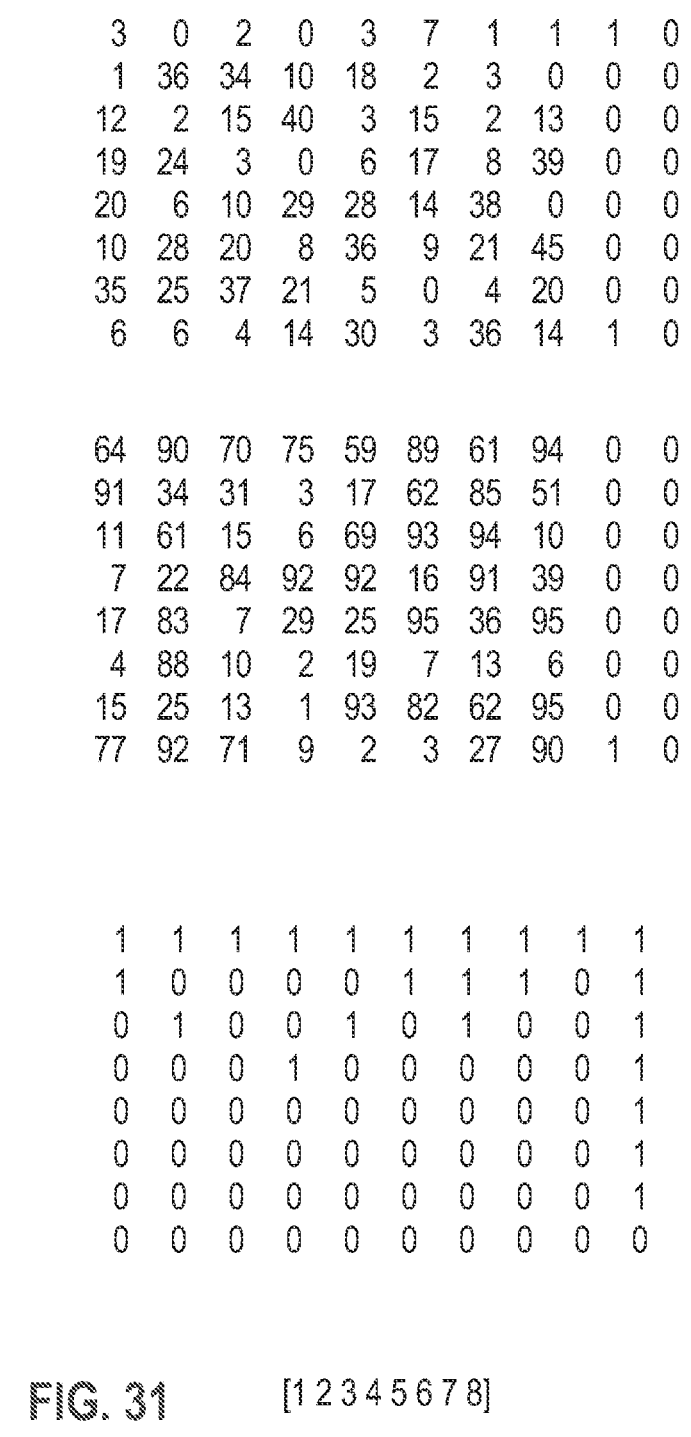
Figures 45, 46, 47, 48, 49:
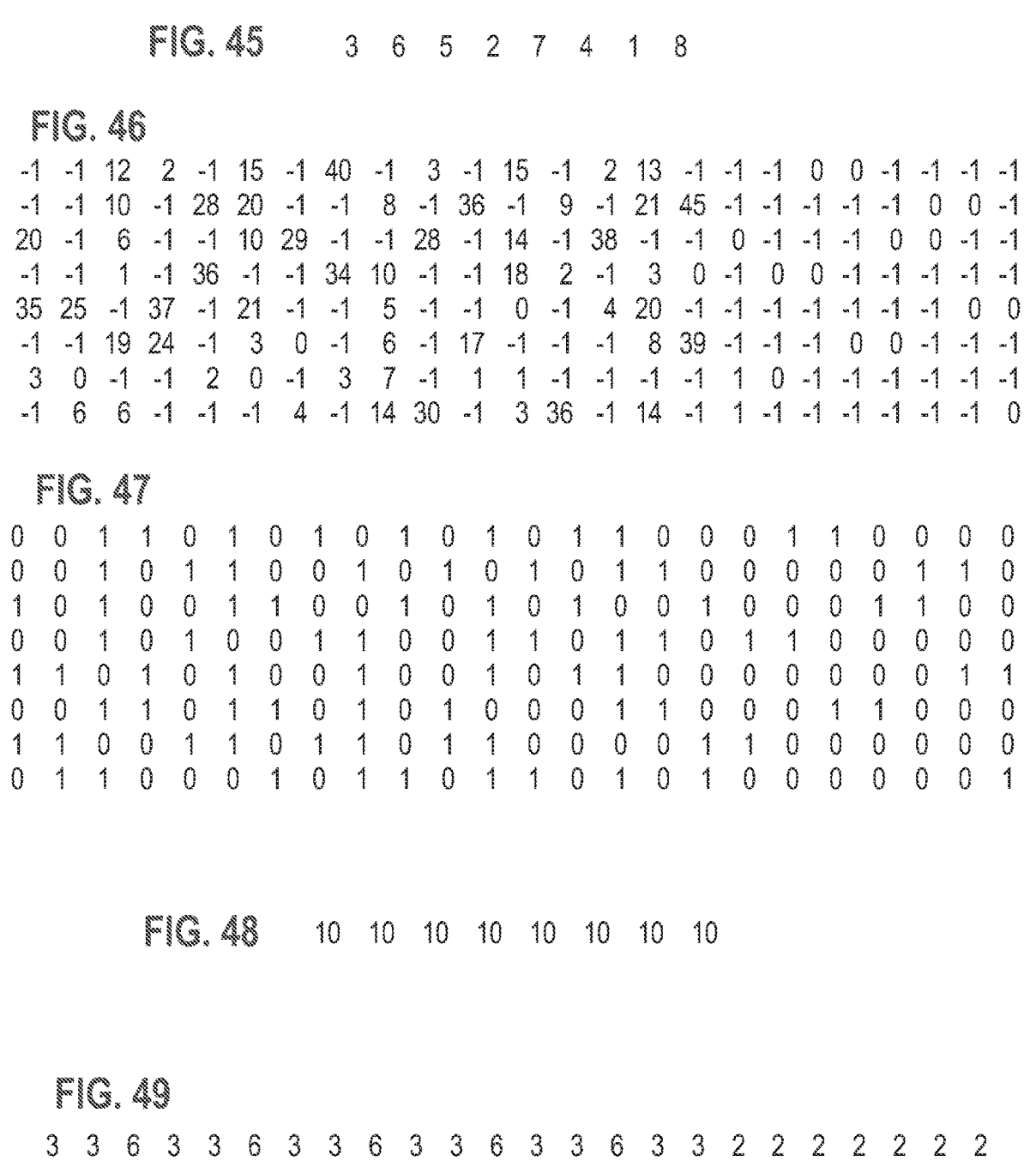

FIGS. 17, 31, and 45 show a layer sequence for schedule 1, schedule 2, and schedule 3 processing, respectively, in accordance with various embodiments;

Figures 32, 33, 34, 35, 36:
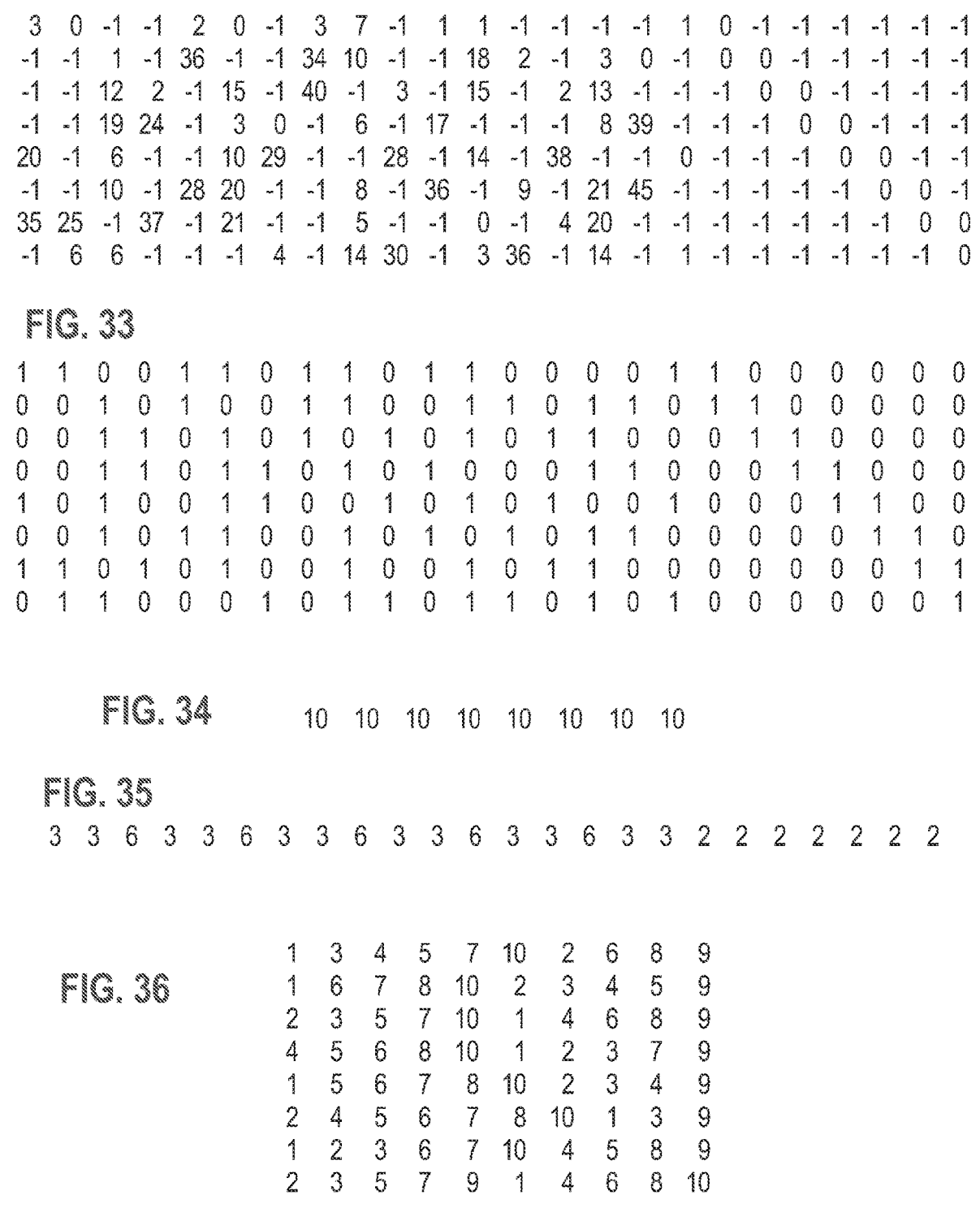

FIGS. 18, 32, and 46 show an S matrix in reordered form based on a selected layer sequence for schedule 1, schedule 2, and schedule 3 processing, respectively, in accordance with various embodiments;

FIGS. 19, 33, and 47 show an $H_b$ base matrix for in reordered form based on a selected layer sequence for schedule 1, schedule 2, and schedule 3 processing, respectively, in accordance with various embodiments;

FIGS. 20, 34, and 48 show a check node degree vector for schedule 1, schedule 2, and schedule 3 processing, respectively, in accordance with various embodiments;

FIGS. 21, 35, and 49 show a variable node degree vector for schedule 1, schedule 2, and schedule 3 processing, respectively, in accordance with various embodiments;

FIGS. 22, 36, and 50 show a block number matrix for schedule 1, schedule 2, and schedule 3 processing, respectively, in accordance with various embodiments;

FIGS. 23, 37, and 51 show a circulant index matrix for schedule 1, schedule 2, and schedule 3 processing, respectively, in accordance with various embodiments;

FIGS. 24, 38, and 52 show a dependent circulant index matrix for schedule 1, schedule 2, and schedule 3 processing, respectively, in accordance with various embodiments;

FIGS. 25, 39, and 53 show a block column matrix for schedule 1, schedule 2, and schedule 3 processing, respectively, in accordance with various embodiments;

Figures 54, 55, 56, 57:
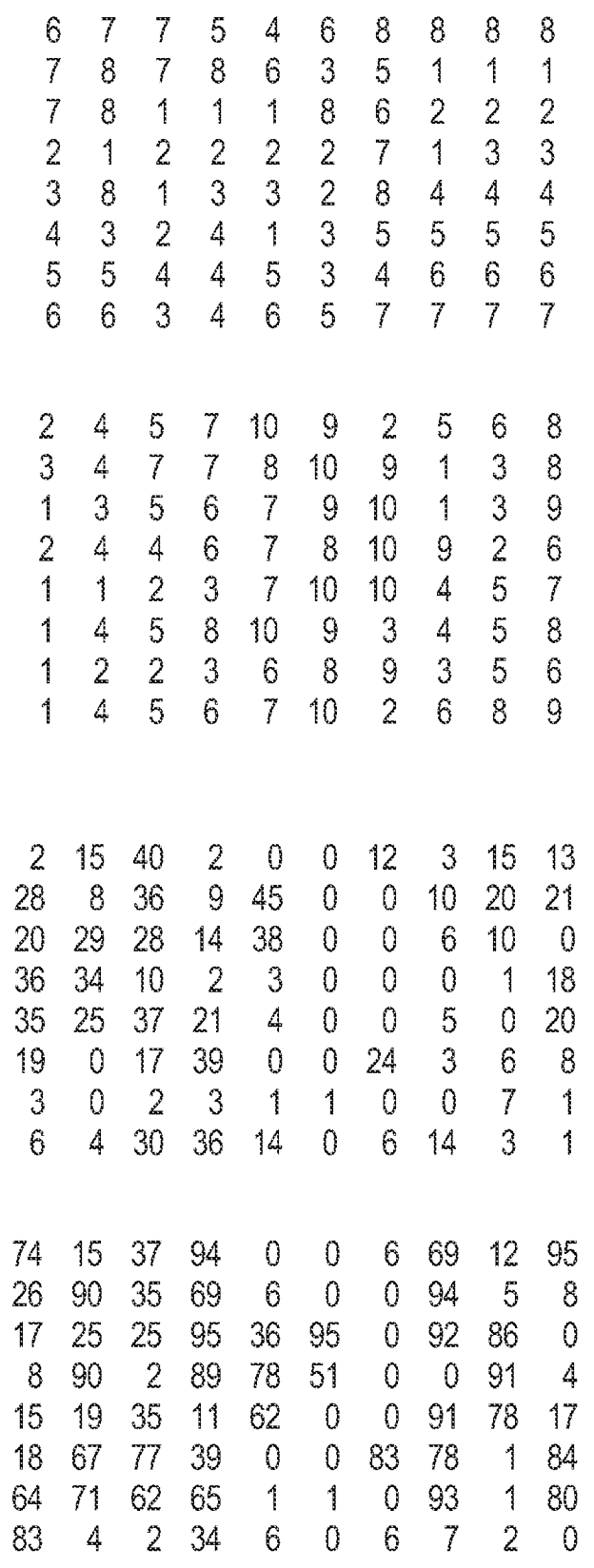

FIGS. 26, 40, and 54 show a dependent layer matrix for schedule 1, schedule 2, and schedule 3 processing, respectively, in accordance with various embodiments;

Figures 41, 42, 43, 44:
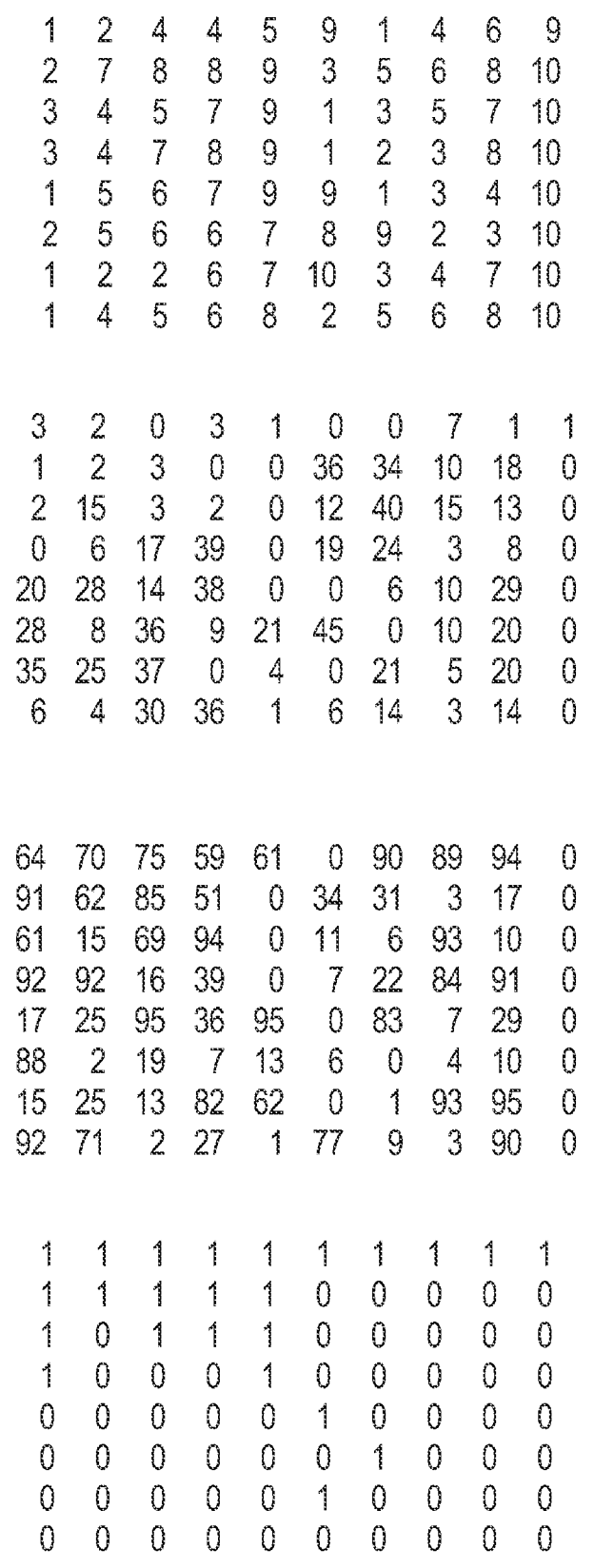

FIGS. 27, 41, and 55 show a dependent block matrix for schedule 1, schedule 2, and schedule 3 processing, respectively, in accordance with various embodiments;

FIGS. 28, 42, and 56 show a shift matrix for schedule 1, schedule 2, and schedule 3 processing, respectively, in accordance with various embodiments;

FIGS. 29, 43, and 57 show a delta shift matrix for schedule 1, schedule 2, and schedule 3 processing, respectively, in accordance with various embodiments;

Figure 58:
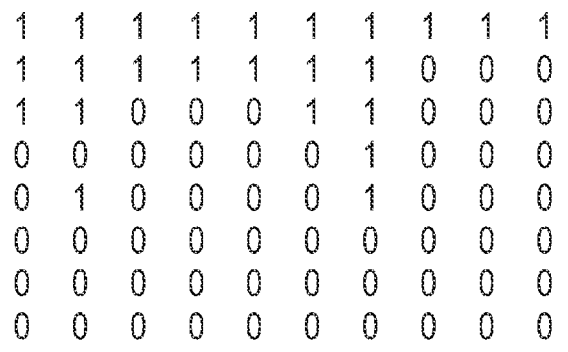

FIGS. 30, 44, and 58 show a use channel value flag matrix for schedule 1, schedule 2, and schedule 3 processing, respectively, in accordance with various embodiments; and FIGS. 59A-59E show a reconfigurable min1-min2 finder in accordance with various embodiments.

The drawings show illustrative embodiments that will be described in detail. However, the description and accompanying drawings are not intended to limit the claimed invention to the illustrative embodiments, but to the contrary, the intention is to disclose and protect all modifications, equivalents, and alternatives falling within the spirit and scope of the appended claims.

DETAILED DESCRIPTION

Figure 1:
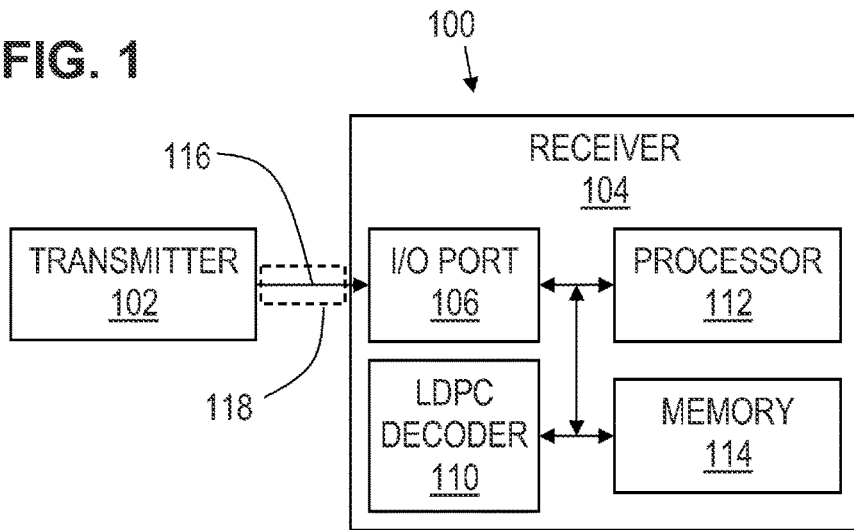
FIG. 1 shows a system comprising a low density parity check ("LDPC") decoder in accordance with various embodiments.

FIG. 1 shows one embodiment of a system 100 comprising a low density parity check ("LDPC") decoder in accordance with various embodiments. System 100 generally includes a transmitter 102, and receiver 104. The receiver 104 comprises an I/O port 106, a processor 112, a memory 114, and an LDPC decoder 110. Transmitter 102 transmits signal 116 encoded using an LDPC code to provide forward error correction. Transmitter 106 may be any of a variety of devices adapted to provide an LDPC encoded signal 116 to the receiver 104. For example, transmitter 106 may be wireless transmitter, a wire-line transmitter, an optical transmitter.

I/O port 106 is adapted to detect the signal 116 from transmitter 106 as received via the selected transmission medium. I/O port 116 may include any suitable protocol for receiving encoded signal 116 from transmitter 102. For example, I/O port 106 may incorporate an Ethernet protocol for network based communications or incorporate a wireless protocol, such as IEEE 802.11 or IEEE 802.16. The encoded signal 116 detected by the I/O port 106 is provided to the LDPC decoder 110. The LDPC decoder 110 decodes the encoded signal 116 to extract the signal encoded by the transmitter 102. The LDPC decoder 110 detects and corrects errors introduced into the signal 116 as the signal 116 traversed the channel 118. The LDPC decoder 110 preferably includes on-the-fly computation of LDPC codes as disclosed herein to optimize decoding performance, hardware resource utilization and power consumption.

Processor 112 may be any suitable computer processor for executing code stored in memory 114. Processor 16 controls operations of I/O port 12 by inputting data in the form of coded messages from remote computing system 20. Memory 14 may be any suitable type of storage for computer related data and/or programming which may be, for example, volatile memory elements, such as random access memory (RAM), dynamic random access memory (DRAM), static random access memory (SRAM), or FLASH memory.

Some embodiments of receiver 104 comprise a hardware implementation of the LDPC decoder 110. For example the LDPC decoder 110 may be implemented in an application specific integrated circuit ("ASIC") or a field programmable gate array ("FPGA"). Some embodiments of receiver 104 may provide the LDPC decoder 110 as software programming executed by processor 112. Some embodiments of receiver 104 may implement the LDPC decoder 110 as a combination of software programming executed by processor 112 and other electronic circuits.

While elements of system 100 are described in terms of data transmission and reception, system 100 is also applicable to other systems. For example, various embodiments may be applied to data storage systems where LDPC encoded data is stored on a storage medium (e.g., a magnetic disk). Thus, in such embodiments, the storage medium is represented by channel 118. Transmitter 102 provides media write systems, and receiver 104 provides media read systems.

LDPC codes are linear block codes described by an m×n sparse parity check matrix H. LDPC codes are well represented by bipartite graphs. One set of nodes, the variable or bit nodes correspond to elements of the code word and the other set of nodes, viz. check nodes, correspond to the set of parity check constraints satisfied by the code words. Typically the edge connections are chosen at random. The error correction capability of an LDPC code is improved if cycles of short length are avoided in the graph. In an (r, c) regular code, each of the n bit nodes ($b_1, b_2 \ldots, b_n$) has connections to r check nodes and each of the m check nodes ($c_1, c_2, \ldots, c_m$) has connections to c bit nodes. In an irregular LDPC code, the check node degree is not uniform. Similarly the variable node degree is not uniform. The present disclosure focuses on the construction which structures the parity check matrix H into blocks of p×p matrices such that: (1) a bit in a block participates in only one check equation in the block, and (2) each check equation in the block involves only one bit from the block. These LDPC codes are termed Quasi-cyclic ("QC") LDPC codes because a cyclic shift of a code word by p results in another code word. Here p is the size of square matrix which is either a zero matrix or a circulant matrix. This is a generalization of a cyclic code in which a cyclic shift of a code word by 1 results in another code word. The block of p×p matrix can be a zero matrix or cyclically shifted identity matrix of size p×p. The Block LDPC codes having these blocks are referred as QC-LDPC codes. The block of p×p matrix can be a random permutation as in IEEE 802.3 Reed Solomon based LDPC codes. The present disclosure gives examples for QC-LDPC codes and it is straight forward for one skilled in the art to use the same embodiments for other Block LDPC codes with appropriate modification. To enable such modification, embodiments apply a permuter rather than a cyclic shifter.

An array low density parity check parity-check matrix for a regular quasi-cyclic LDPC code is specified by three parameters: a prime number p and two integers k (check-node degree) and j (variable-node degree) such that j,k≤p. This is given by $$H = \begin{bmatrix} I & I & I & \ldots & I \\ I & \alpha & \alpha^2 & \ldots & \alpha^{k-1} \\ I & \alpha^2 & \alpha^4 & \ldots & \alpha^{2(k-1)} \\ \vdots & \vdots & \vdots & & \vdots \\ I & \alpha^{j-1} & \alpha^{(j-1)2} & \ldots & \alpha^{(j-1)(k-1)} \end{bmatrix}, \quad (1)$$

where I is a p×p identity matrix, and $\alpha$ is a p×p permutation matrix representing a single right cyclic shift (or equivalently up cyclic shift) of I. The exponent of $\alpha$ in H is called the shift coefficient and denotes multiple cyclic shifts, with the number of shifts given by the value of the exponent.

Rate-compatible array LDPC codes (i.e., irregular quasi-cyclic array LDPC codes) are modified versions of the above for efficient encoding and multi-rate compatibility. The H matrix of a rate-compatible array LDPC code has the following structure:

$$H = \begin{bmatrix} I & I & I & \cdots & I & I & \cdots & I \\ O & I & \alpha & \cdots & \alpha^{j-2} & \alpha^{j-1} & & \alpha^{k-2} \\ O & O & I & \cdots & \alpha^{2(j-3)} & \alpha^{2(j-2)} & & \alpha^{2(k-3)} \\ \vdots & \vdots & \vdots & \ddots & \vdots & \vdots & & \vdots \\ O & O & \cdots & \cdots & I & \alpha^{(j-1)} & \cdots & \alpha^{(j-1)(k-j)} \end{bmatrix}, \quad (2)$$

where O is the p×p null matrix. The LDPC codes defined by H in equation (2) have codeword length N=kp, number of parity-checks M=jp, and an information block length K=(k−j)p. A family of rate-compatible codes is obtained by successively puncturing the left most p columns, and the topmost p rows. According to this construction, a rate-compatible code within a family can be uniquely specified by a single parameter, for example, q with $0 < q \leq j-2$. To provide a wide range of rate-compatible codes, j and p may be fixed, and different values for the parameter k selected. Since all the codes share the same base matrix size p; the same hardware decoder implementation can be used. Note that this specific form is suitable for efficient linear-time LDPC encoding. The systematic encoding procedure is carried out by associating the first N−K columns of H with parity bits, and the remaining K columns with information bits.

The block irregular LDPC codes have competitive performance and provide flexibility and low encoding/decoding complexity. The Block LDPC code is defined by a matrix H as:

$$H = \begin{bmatrix} P_{1,1} & P_{1,2} & \cdots & P_{1,N_b} \\ P_{2,1} & P_{2,2} & \cdots & P_{2,N_b} \\ \cdots & \cdots & \cdots & \cdots \\ P_{M_b,1} & P_{M_b,2} & \cdots & P_{M_b,N_b} \end{bmatrix} = P^{H_b}, \quad (3)$$

where $P_{i,j}$ is one of a set of z-by-z cyclically right shifted identity matrices or a z-by-z zero matrix. Each 1 in the base matrix $H_b$ is replaced by a permuted identity matrix while each 0 in $H_b$ is replaced by a negative value to denote a z-by-z zero matrix. The shift coefficient matrix S for the H matrix of a rate 2/3 irregular LDPC code adopted for the IEEE 802.16e standard is shown in FIG. 15. Here $N_b$=24 $M_b$=8, z=96. The entry −1 in the matrix S corresponds to a z-by-z zero matrix (also called null matrix) in the H matrix. The entry 0 1502 in the matrix S corresponds to a z-by-z identity matrix in the H matrix. The entry 3 1504 in the matrix S corresponds to a z-by-z identity matrix cyclically right shifted by the shift amount 3. Each row in the S matrix represents a layer in the H matrix (i.e. the 1$^{st}$ row in the S matrix corresponds to the 1$^{st}$ layer (also called 1$^{st}$ block row) in the H matrix and so on). The binary base $H_b$ is the same size as S. Each negative value of −1 is replaced with 0 and all other positive values (between 0 and z−1) are replaced with 1. Note that a code design usually starts with a binary base matrix $H_b$ and the S matrix follows therefrom by optimizing the shift coefficient values. The base matrix $H_b$ for the above LDPC code is shown in FIG. 16.

Considering now offset min-sum decoding of LDPC codes, assume binary phase shift keying ("BPSK") modulation (a 1 is mapped to −1 and a 0 is mapped to 1) over an additive white Gaussian noise ("AWGN") channel. The received values y are Gaussian with mean $x_n=\pm 1$ and variance $\sigma^2$. The reliability messages used in a belief propagation ("BP")-based offset min-sum ("OMS") algorithm can be computed in two phases: (1) check-node processing and (2) variable-node processing. The two operations are repeated iteratively until the decoding criterion is satisfied. This is also referred to as standard message passing or two-phase message passing ("TPMP"). For the i$^{th}$ iteration, $Q_{nm}^{(i)}$ is the message from variable node n to check node m, $R_{mn}^{(i)}$ is the message from check node m to variable node n, M(n) is the set of the neighboring check nodes for variable node n, and N(m) is the set of the neighboring variable nodes for check node m. The message passing for TPMP based on OMS is described in the following three steps to facilitate the discussion of turbo decoding message passing ("TDMP") herein below:

Step 1. Check-node processing: for each m and n∈N(m), $$R_{mn}^{(i)} = \delta_{mn}^{(i)} \max(\kappa_{mn}^{(i)} - \beta, 0), \quad (4)$$

$$\kappa_{mn}^{(i)} = |R_{mn}^{(i)}| = \min_{n' \in N(m) \setminus n} |Q_{n'm}^{(i-1)}|, \quad (5.1)$$

where β is a positive constant and depends on the code parameters. For (3, 6) rate 0.5 array LDPC code, β is computed as 0.15 using the density evolution technique. In general, for the irregular codes, embodiments apply the correction on variable node messages Q and the correction factor for each circulant is based on check node degree and variable node degree. In these embodiments, the Q message can be performed either by scaling down the messages with a scaling factor ($Q = Q \cdot \alpha$) or by applying an offset to the magnitude of Q message, ($Q = \text{sgn}(Q)\max(|Q|-\beta, 0)$). For each check node m, $|R_{mn}^{(i)}| \forall n \in N(m)$ takes only 2 values. The least minimum and the second least minimum of the entire set of the messages can be defined from various variable-nodes to the check-node m as:

$$M1_m^{(i)} = \min_{n' \in N(m)} |Q_{mn'}^{(i-1)}|, \quad (5.2)$$

and $$M2_m^{(i)} = 2\text{nd} \min_{n' \in N(m)} |Q_{mn'}^{(i-1)}|. \quad (5.3)$$

Now Equation 5.1 becomes:

$$|R_{mn}^{(i)}| = M1_m^{(i)}, \quad (5.4)$$

$$\forall n \in N(m) \setminus M1\_\text{index} = M2_m^{(i)},$$

$$n = M1\_\text{index}.$$

Since $\forall n \in N(m)$, $\delta_{mn}^{(i)}$ takes a value of either +1 or −1 and $|R_{mn}^{(i)}|$ takes only two values. So, equation (4) gives rise to only three possible values for the whole set $R_{mn}^{(i)} \forall n \in N(m)$. In a VLSI implementation, this property significantly simplifies the logic and reduces the memory.

The sign of check-node message $R_{mn}^{(i)}$ is defined as:

$$\delta_{mn}^{(i)} = \left( \prod_{n' \in N(m) \setminus n} \text{sgn}(Q_{n'm}^{(i-1)}) \right). \quad (6)$$

Step 2. Variable-node processing: for each n and m ∈ M(n):

$$Q_{nm}^{(i)} = L_n^{(0)} + \sum_{m' \in M(n) \setminus m} R_{m'n}^{(i)}, \quad (7)$$

where the log-likelihood ratio of bit n is $L_n^{(0)} = y_n$.

Step 3. Decision: for final decoding $$P_n = L_n^{(0)} + \sum_{m \in M(n)} R_{mn}^{(i)}. \quad (8)$$

A hard decision is taken by setting $\hat{x}_n = 0$ if $P_n(x_n) \geq 0$, and $\hat{x}_n = 1$ if $P_n(x_n) < 0$. If $\hat{x}H^T = 0$, the decoding process is finished with $\hat{x}_n$ as the decoder output; otherwise, repeat steps 1-3. If the decoding process doesn't end within predefined maximum number of iterations, $it_{max}$, stop and output an error message flag and proceed to the decoding of the next data frame.

In TDMP, an array LDPC with j block rows can be viewed as a concatenation of j layers or constituent sub-codes. After the check-node processing is finished for one block row, the messages are immediately used to update the variable nodes (in step 2, above), whose results are then provided for processing the next block row of check nodes (in step 1, above). The vector equations for TDMP for array LDPC codes assuming that the H matrix has the structure in equation (1) are illustrated first. These equations are directly applicable to all other regular QC-LDPC codes (such as cyclotomic coset based LDPC). For rate compatible array LDPC codes and Block LDPC codes, minor modifications in the vector equations are necessary.

$\vec{R}_{l,n}^{(0)} = 0, \vec{P}_n = \vec{L}_n^{(0)}$ [Initialization for each new received data frame], (9)

$\forall i = 1, 2, \ldots, it_{max}$ [Iteration loop], $\forall l = 1, 2, \ldots, j$ [Sub-iteration loop], $\forall n = 1, 2, \ldots, k$ [Block column loop], $$[\vec{Q}_{l,n}^{(i)}]^{S(l,n)} = [\vec{P}_n]^{S(l,n)} - \vec{R}_{l,n}^{(i-1)} \quad (10)$$

$$\vec{R}_{l,n}^{(i)} = f([\vec{Q}_{l,n'}^{(i)}]^{S(l,n')}, \forall n' = 1, 2, \ldots, k), \quad (11)$$

$$[\vec{P}_n]^{S(l,n)} = [\vec{Q}_{l,n}^{(i)}]^{S(l,n)} + \vec{R}_{l,n}^{(i)}, \quad (12)$$

where the vectors $\vec{R}_{l,n}^{(i)}$ and $\vec{Q}_{l,n}^{(i)}$ represent all the R and Q messages in each p×p block of the H matrix, and s(l,n) denotes the shift coefficient for the block in $i^{th}$ block row and $n^{th}$ block column of the H matrix. $[\vec{Q}_{l,n}^{(i)}]^{S(l,n)}$ denotes that the vector $\vec{Q}_{l,n}^{(i)}$ is cyclically shifted up by the amount s(l,n) and k is the check-node degree of the block row. A negative sign on s(l,n) indicates that it is a cyclic down shift (equivalent cyclic left shift). f(•) denotes the check-node processing, which embodiments implement using, for example, a Bahl-Cocke-Jelinek-Raviv algorithm ("BCJR") or sum-of-products ("SP") or OMS. Some embodiments use OMS as defined in equations (4)-(6). In an embodiment that processes a block row in serial fashion using p check-node units, as in equation (11), the output of the CNU will also be in serial form. As soon as the output vector $\vec{R}_{l,n}^{(i)}$ corresponding to each block column n in H matrix for a block row l is available, the output vector can be used to produce updated sum $[\vec{P}_n]^{S(l,n)}$ (equation (12)). The updated sum can be immediately used in equation (10) to process block row l+1 except that the shift s(l,n) imposed on $\vec{P}_n$ has to be undone and a new shift s(l+1,n) has to be imposed. This re-shifting can be simply done by imposing a shift corresponding to the difference of s(l+1,n) and s(l,n).

Note that due to the slight irregularity in the array LDPC matrix defined in equation (2), each block row l has a node degree j-l+1. The variable-nodes in each block column n have a node degree equal to min(n,j). One way to simplify implementation is to assume that all the block rows have equal check-node degree and to set the check-node messages corresponding to null blocks in the H matrix to zero in order not to affect the variable-node processing. Similarly, the variable-node messages belonging to the null blocks are always set to positive infinity in order not to affect the check-node processing. For check-node update based on SP or OMS, the message with maximum reliability won't affect the CNU output. In the specific case of OMS, this is easily seen as the CNU magnitude is dependent on the two least minimum.

There are several null blocks in the Block LDPC codes defined by equation (3). So the above method for dealing with irregularity introduces significant idle clock cycles. Some embodiments deal with this check-node irregularity by setting the check-node degrees in a CNU processor unit based on the block row that is being processed. In addition, out-of-order processing is enforced in the generation of R messages as explained below.

The micro-architecture of an embodiment of a serial CNU for OMS is now considered. For each check node m, $|R_{mn}^{(i)}| \forall n \in N(m)$ takes only two values, which are the two minimum of input magnitude values. Since $\forall n \in N(m)$, $\delta_{mn}^{(i)}$ takes a value of either +1 or −1 and $|R_{mn}^{(i)}|$ takes only 2 values, equation (4) gives rise to only three possible values for the whole set, $R_{mn}^{(i)} \forall n \in N(m)$. In a very-large-scale integration ("VLSI") implementation, this property significantly simplifies the logic and reduces the memory.

Figure 2B:
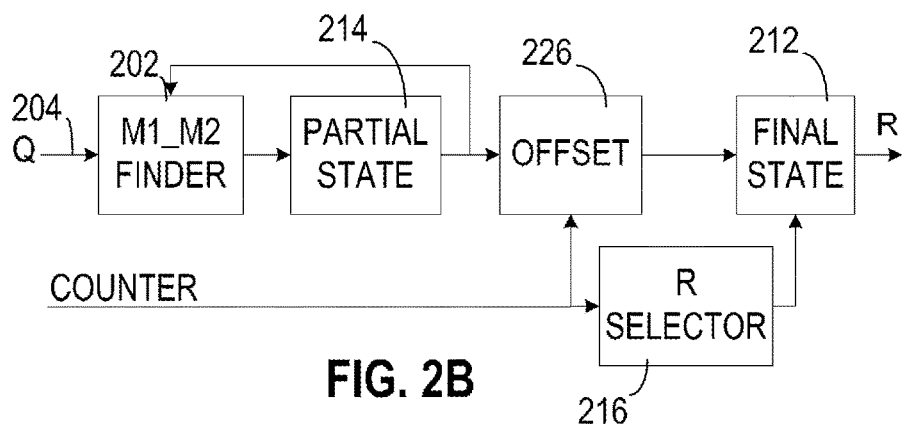
FIG. 2B shows a block diagram of a check node unit in accordance with various embodiments.
Figure 2A:
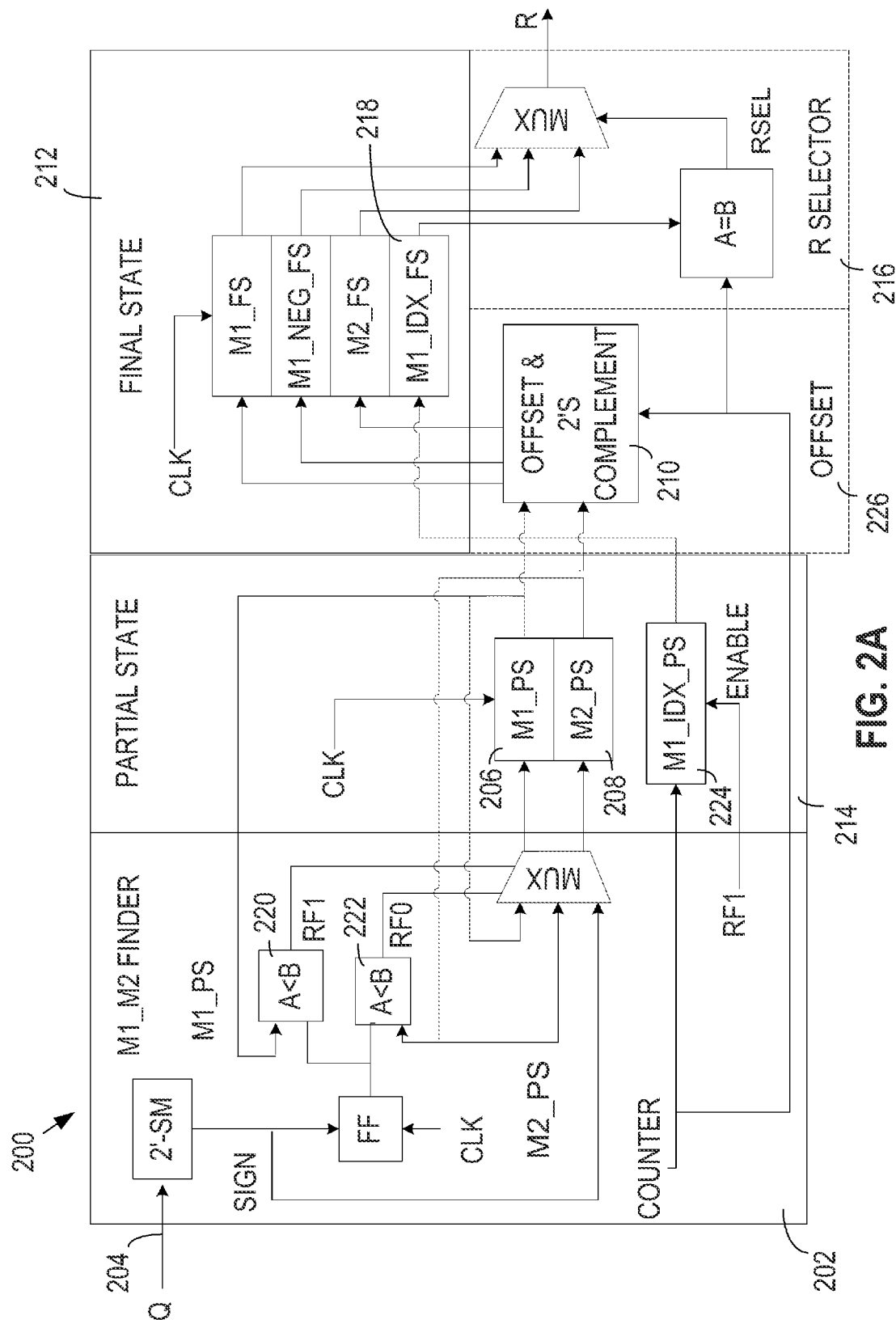
FIG. 2A shows a diagram of one embodiment of a check node unit ("CNU") of the LDPC decoder in accordance with various embodiments.

FIG. 2A shows an embodiment of a Check-Node Unit ("CNU") micro-architecture 200 for OMS that applies the value re-use property. FIG. 2B shows the block diagram of the same. The exemplary micro-architecture is considered as applied to a (5, 25) code. In the first 25 clock cycles of the check-node processing, incoming variable messages (Q 204) are compared with the two up-to-date least minimum numbers (partial state, PS) 206, 208 to generate the new partial state, M1 206 which is the first minimum value, M2 208 which is the second minimum value, and the index of M1 224. The final state (FS) is then computed by offsetting the partial state. It should be noted that the final state includes only M1, −M1, +/−M2 with offset correction applied to each. M1_M2 finder 202 computes the two least numbers, according to the incoming data 204 and the current minimum numbers 206, 208 stored in partial state. The offset module 210 applies the offset correction, and stores the results in the Final State module 212. R selector 216 then assigns one out of these 3 values, based on the index of M1 218 and the sign of R message generated by sign exclusive "or" ("XOR") logic, equation (6), to the output R messages. While the final state has dependency on offset correction, the offset is dependent on the completion of partial state 214. In operation, the final state 212 and partial state 214 will operate on different check-nodes. The serial CNU 200 finds the least two minimum numbers 206, 208 with 2 comparators 200, 222 in a serial fashion and reduces the number of offset-correction computations from k to 2. Normally, CNU processing is done using signed magnitude arithmetic for equations (4)-(6). Variable-node unit ("VNU") processing of equation (7) is done in 2's complement arithmetic. Such processing requires 2's complement to signed magnitude conversion at the inputs of CNU and signed magnitude to 2's complement conversion at the output of CNU. In various embodiments, however, 2's complement is applied to only 2 values instead of k values at the output of CNU. The value re-use property also reduces the memory requirement significantly. Conventionally, the number of messages each CNU stores is equal to the number of edges it has, that is k. In some embodiments, only four units of information are needed: the three values that $R_{mn}^{(i)}$ may take (M1, −M1, +/−M2 all with offset correction) and the location of $M1_m^{(i)}$ (index of M1). A check-node message to the VNU is then readily chosen by multiplexing. Some embodiments to store only M1, M2, and the index of M1 to effectuate further savings in the memory required to store the Final State (FS).

Figure 4A:
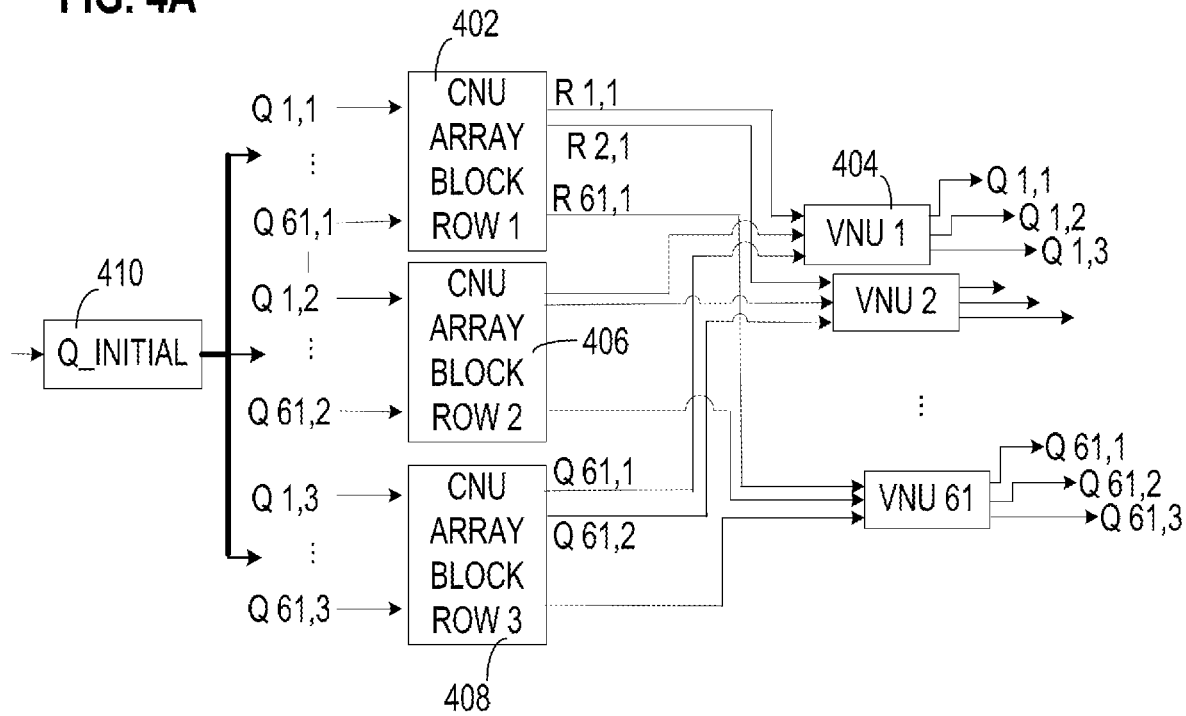
FIG. 4A shows a two phase message passing ("TPMP") decoder for regular array LDPC coded messages in accordance with various embodiments.
Figure 4B:
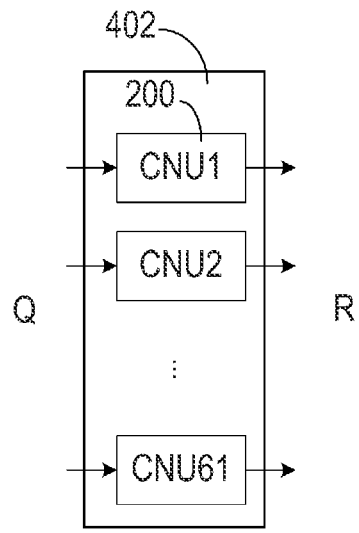

FIG. 4A shows a low density parity check decoder 400 for TPMP and OMS for regular array LDPC codes in accordance with various embodiments. Specifically, in this example, a decoder for an array LDPC code of length 1830 with the circulant matrix size of 61 is shown. The check node processing unit array is composed of 3 sub-arrays 402, 406, 408. Each sub-array (as shown in FIG. 4B) contains 61 serial CNUs (e.g., FIG. 2 200) which compute the partial state for each block row to produce the check-node messages for each block column of H. CNU array block row 1 402 is an array of 61 simple CNUs 200.

Cyclic shifters, generally, consume approximately 10%-20% of chip area based on the decoder's parallelization and constitute the critical path of the decoder. If all the block rows are assigned to different computational unit arrays of CNUs and serial CNU processing across block rows is employed, then embodiments use constant wiring to achieve any cyclic shift as each subsequent shift can be realized using the feedback of a previous shifted value. Embodiments thus eliminate both the forward router between CNU and VNU and the reverse router between VNU and CNU. This is possible because block-serial processing is employed and array codes have a constant incremental shift in each block row. For the first block row, the shift and incremental shift is 0. For the second block row, the shifts are [0,1, 2, . . . ] and the incremental shift is 1. For the third block row, the shifts are [0, 2, . . . ] and the incremental shift is 2. In this TPMP architecture embodiment, the check node messages in the H matrix are produced block column wise so that all the variable messages in each block column can be produced on the fly. These variable-node messages can be immediately consumed by the partial state computation sub-units in the CNUs. Such scheduling results in savings in message passing memory that is needed to store intermediate messages. The savings in message passing memory due to scheduling are 80%, in some cases, as embodiments need to store only the sign bits of variable node messages. Forward and reverse routers are eliminated, reducing the number of multiplexers required.

CNU array block rows 2 and 3 (406, 408) are composed of dynamic CNUs 300. The variable node processing array 404 is composed of 61 parallel VNU units which can process 3×61 messages at each clock cycle. The sign bits will be stored in a first-in-first-out memory ("FIFO") (implemented as RAM), however, there is no need to subject these values to shifts as these values are not modified in check node processing partial state processing. In the array 402 of simple serial CNU 200 that is designed to do check node processing for first block row in H matrix, the check node processing for each row in H matrix is done such that all the comparisons are performed locally within one CNU to update the partial state each clock cycle and transfer the partial state to final state d once every cycle.

Figure 3:
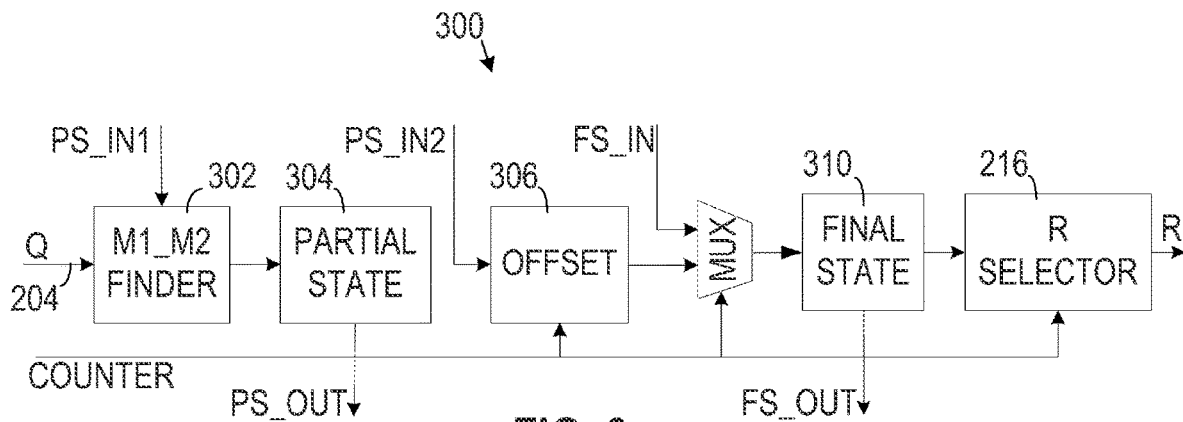
FIG. 3 shows an embodiment of a check node unit of a LDPC decoder that incorporates a dynamic shift mechanism for offset min-sum ("OMS") using the value-reuse property in accordance with various embodiments.
Figure 4D:
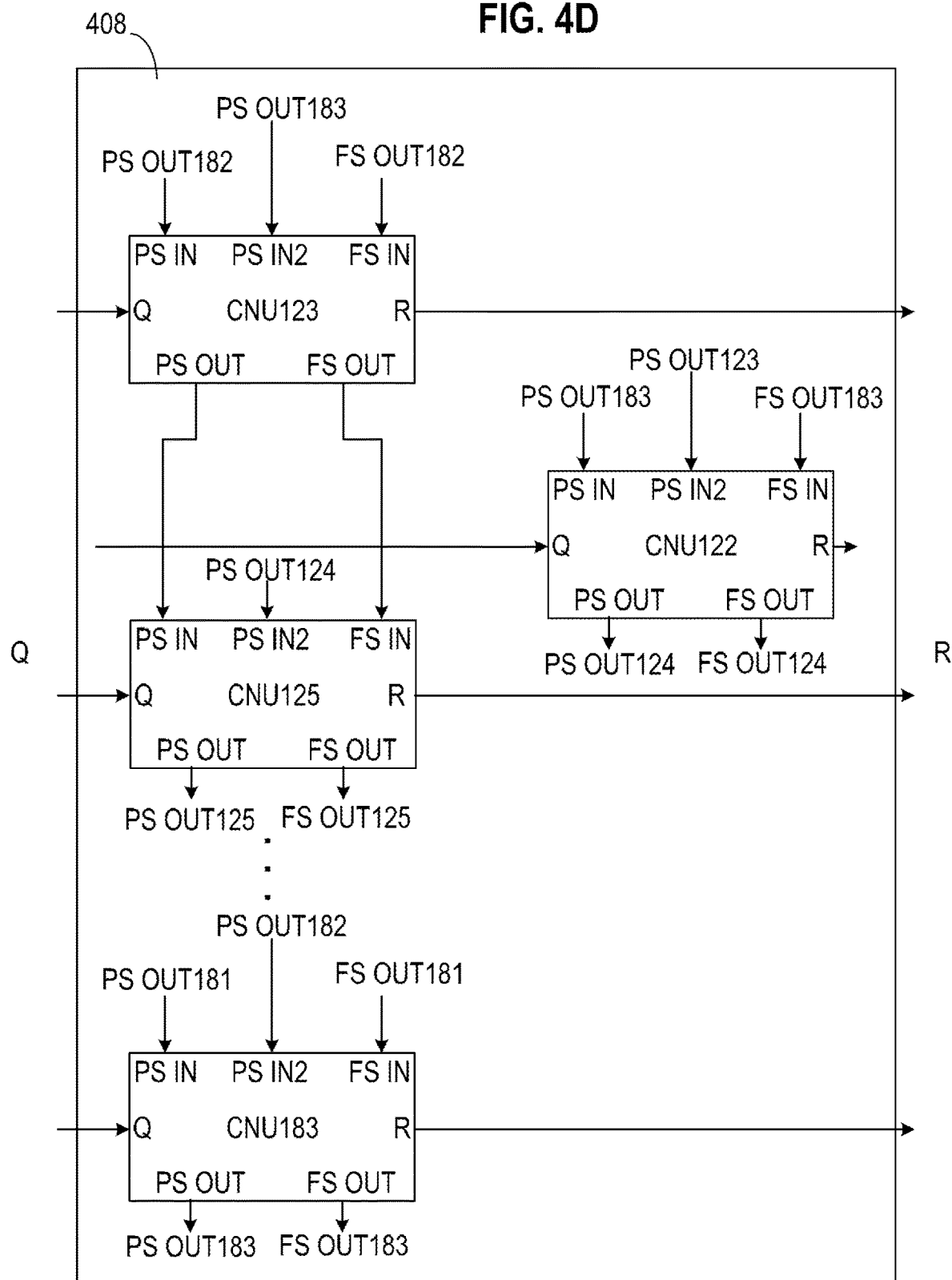

As shown in FIG. 3, in the dynamic CNU 300, the M1_M2 finder 302 and offset block 306 receive partial state input from another CNU rather than partial state block 304. The final state block 310 receives input from both the offset block 306 and another CNU 300. Accordingly, the partial state block 304 and final state block 310 provide output to other CNUs 300. In CNU array 406 (shown in FIG. 4C), designed for the second block row in an H matrix, CNU122 gets its partial state from CNU121, CNU121 gets its partial state from CNU120 and so on. The array of dynamic CNU 408 (shown in FIG. 4D) is designed for the third block row in an H matrix such that the connection between partial state registers among various units achieve cyclic shifts of [0,2, . . . ,58], thus CNU125 gets its partial state from CNU 123. A similar principle is applied when making connections for the final state in the CNU array to achieve reverse routing (i.e., CNU123 gets its partial state from CNU183 and CNU 182).

Initially the variable messages are available in row wise as they are set to soft log-likelihood information ("LLR") of the bits coming from the channel. Q Init 410 is a RAM of size 2N and holds the channel LLR values of two different frames. Q Init 410 can supply p intrinsic values to the VNUs each clock cycle. The data path of the embodiment is set to 5 bits to provide the same bit error rate ("BER") performance as that of a floating point sum of products algorithm with 0.1-0.2 dB SNR loss. Each iteration takes $d_c+3$ clock cycles. For (3, 30) code this results in 6×33 clock cycles to process each frame when a maximum number of iterations set to 6. For (3, 6) code this results in 20×9 clock cycles to process each frame when the number of iterations is set to 20.

Figure 5:
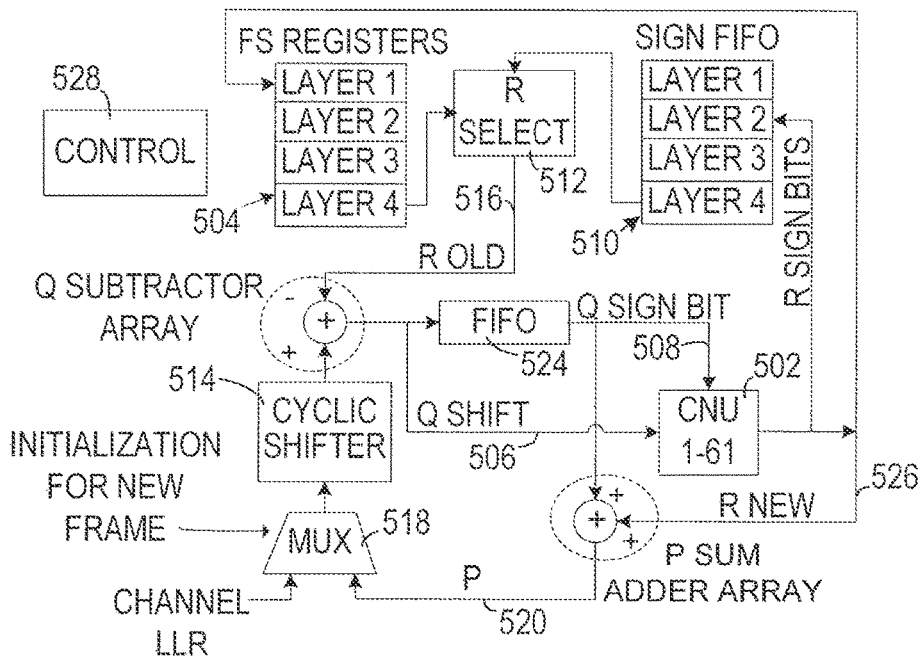
FIG. 5 shows an LDPC decoder that uses layered decoding and an offset min-sum algorithm with block serial processing in accordance with various embodiments.

FIG. 5 shows a turbo decoding message passing decoder 500 in accordance with various embodiments. As a matter of simplification, the present disclosure illustrates the architecture for a specific structured code: a regular array code of length 1525 described by equation (1), j=5, k=25 and p=61. One skilled in that art will understand that the example can be easily generalized to any other structured code. The functionality of each block in the architecture is explained below. In discussing the present and subsequent embodiments, a distinction is made regarding the various R messages presented. Assume, for example, that layer l and iteration i are presently being processed. The next layer to be processed in the present iteration i has R messages that were computed in the previous iteration. These messages are termed "R old" messages. The layer presently being processed in the present iteration has R messages that were computed in the previous iteration. These messages are termed "R prev" messages. The R messages that are being computed for the present layer in the present iteration are termed "R new" messages.

The CNU array 502 is composed of p computation units (CNU 200 described supra) that compute the partial state for each block row to produce the R messages 526 in block serial fashion. The final state of previous block rows, in which the compact information for CNU messages is stored, is needed for TDMP. The final state information is stored in register banks 504. There is one register bank 504 of depth j−1, which is 4 in this example, connected with each CNU 200. Each final state register bank 504 is the same as the final state register bank 226 in the CNU 200. In addition to the shifted Q messages 506, the CNU array 502 takes as input the sign information 508 from previously computed Q messages in order to perform an R selection operation. The R sign bits are stored in sign FIFO 510. The total length of sign FIFO 510 is k and each block row has p one bit sign FIFOs. Embodiments employ j−1 of such FIFO banks 510 in total.

Quantity p R select units 512 are used for generation of R old 516. An R select unit 512 generates the R messages for 25(=edges of a check-node from three possible values stored in a final state register associated with that particular check-node in a serial fashion. Its functionality and structure is the same as the block denoted as R select 216 in CNU 200. The R select unit 512 can be treated as a de-compressor of the check node edge information which is stored in compact form in FS registers 504. The generation of R messages 516 for all the layers in this way amounts to substantial memory savings.

The shifter 514 is constructed as cyclic up logarithmic shifter to achieve the cyclic shifts specified by the binary encoded value of the shift. The logarithmic shifter 514 is composed of log 2(p) stages of p switches. Since cyclic down shift is also needed in the operation of the decoder, cyclic down shift by u can be simply achieved by doing cyclic up shift with p−u on the vector of size p.

The decoding operation proceeds as per the vector equations (9)-(12). In the beginning of the decoding process, P vector 520 is set to receive channel values in the first k clock cycles (i.e. the first sub-iteration) as the channel values arrive in chunks of p, while the output vector 516 of R select unit 512 is set to a zero vector. In some embodiments, the multiplexer array 518 at the input of cyclic shifter 514 is used for this initialization. In other embodiments, a multiplexer at the input of Q message FIFO 524 selects channel values for FIFO storage during initialization.

The CNU array 502 takes the output of the cyclic shifter 514 serially, and the partial state stage 214 operates on these values. After k clock cycles, partial state processing will be complete and the final state stage 212 in CNU array 502 will produce the final state for each check-node in 2 clock cycles. Subsequently, R select unit 216 within each CNU unit 200 starts generating k values of check-node messages in serial fashion. The CNU array 502 thus produces the check-node messages in a block serial fashion as there are p CNUs 200 operating in parallel. The P vector 520 is computed by adding the delayed version of the Q vector (which is stored into a FIFO SRAM 524 until the serial CNU produces the output) to the output vector R 526 of the CNU 502. Note that the P vector 520 that is generated can be used immediately to generate the Q vector as the input to the CNU array 502 as CNU array 502 is ready to process the next block row. This is possible because CNU processing is split into three stages as shown in the pipeline diagrams 6A-6B and partial state stage 214 and final state stage 212 can operate simultaneously on two different block rows. The P message vector 520 will undergo a cyclic shift by the amount of difference of the shifts of the block row that is being processed, and the block row that was last processed. This shift value can be either positive or negative indicating respectively that the cyclic shifter needs to perform an up shift or down shift. The R message 516 is subtracted from the shifted P sum message to produce the shifted version of the Q message 506.

Figure 6B:
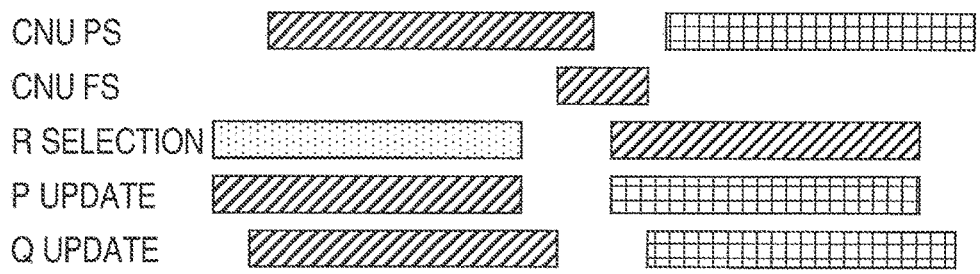
Figure 6C:
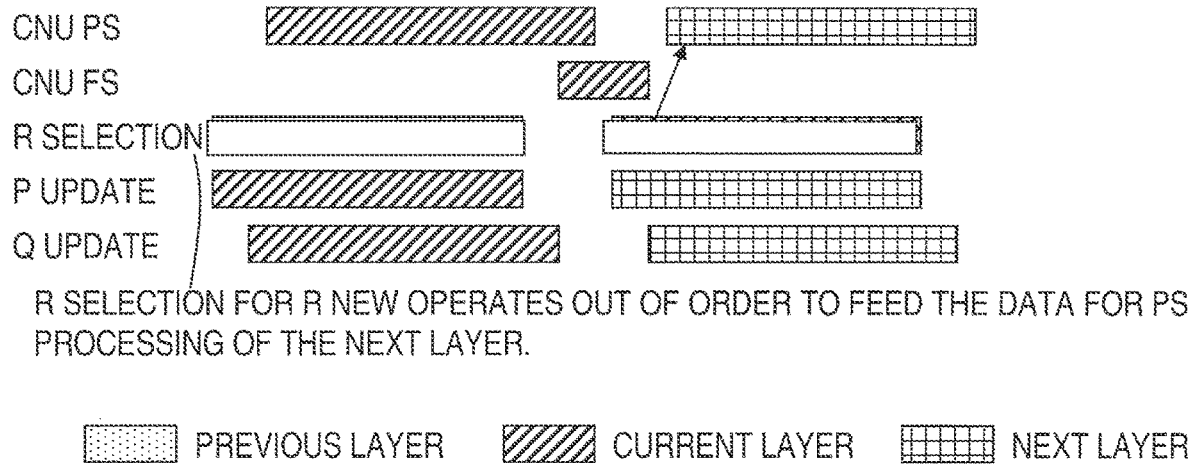
FIG. 6C shows pipeline architecture for irregular coded messages in accordance with various embodiments.

The snapshot of the pipeline of the decoder 500 is shown in FIGS. 6A and 6B. FIG. 6A is detailed diagram and FIG. 6B is a simple diagram. In this illustration, the partial state stage 214 in CNU 200 is operating on the $2^{nd}$ block row from clock cycles labeled as 0 to 24 (note that these numbers will not denote the actual clock numbers as the snapshot is shown in the middle of the processing). Final state stage 212 in CNU 200 can not start until the end of PS processing, that is clock cycle 25. As soon as the FS is done in clock cycle 26, R select 216 is able to select the output R messages, and P and Q message processing starts. With the first block of Q message ready, partial state for next block row can be started immediately. Note that all the logic blocks (other than the storage elements) are active over 90% of the time. The only exception is the offset module 226, which is composed of two 5-bit adders, in each CNU 200. The overall proportion of all the CNU FS logic 212 in the overall decoder 500 is less than 4%. The control unit 528 contains the information of array code parameters such as j,k,q—these parameters can be changed to support multi-rate decoding.

Figure 12:
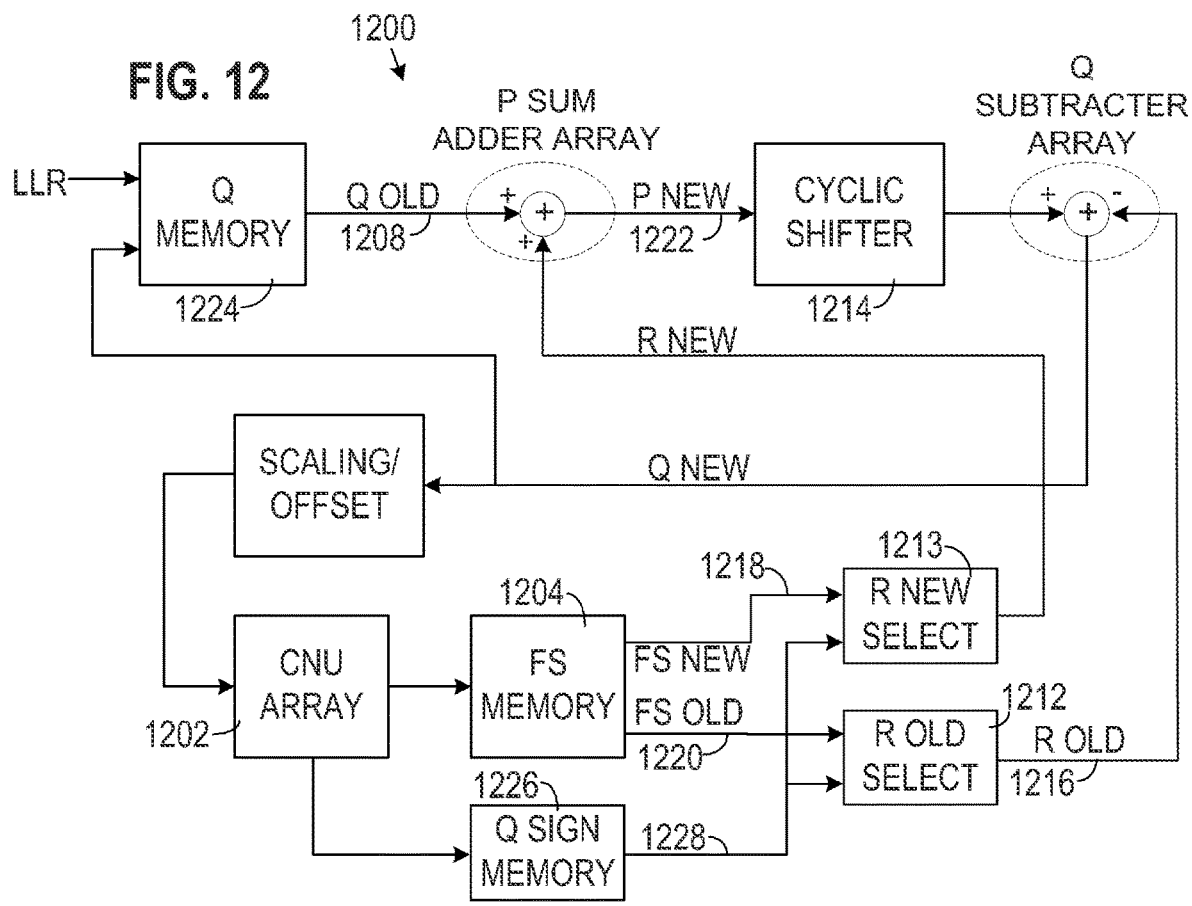
FIG. 12 shows an LDPC decoder that uses out-of-order processing for decoding irregular LDPC codes in accordance with various embodiments.

A family of rate-compatible codes is obtained by successively puncturing the left most p. columns and the topmost p rows in the H matrix defined in equation (2) q times. Changing q from 0 to 3(=j−2) gives the code rates of 0.8 to 0.909. Changing k values from 15 to 61 while fixing j=5 results in code rates from 0.666 to 0.91. The $Q$ FIFO needs to be of maximum depth p as the k can take a maximum value equal to p Note that for Block LDPC codes, the Q FIFO may be replaced with a random access memory of the same size, as shown in FIG. 12. In addition out-of-order processing is employed on R selection for R new to account for the irregularity of Block LDPC codes Note that the throughput of the architecture is increased by increasing p of the code, and scaling the hardware accordingly. While the complexity of computational units scales linearly with p, the complexity of the cyclic shifter increases with the factor $(p/2)\log_2 p$. So, it is necessary to change the architecture for large values of p. Alternatively it may be desirable to have low parallelization in low throughput applications. To suit this requirement, minor changes in the proposed architecture are necessary. Assume that the desired parallelization is M<p. For ease of implementation, choose M close to a power of 2. The cyclic shifter needed is M×M. Since a p×p cyclic shift is to be achieved with consecutive shifts of M×M, it is necessary for the complete vector of size p to be available in M banks with the depth s=(ceil(p/M)) and shifting is achieved in part by the cyclic shifter, and in part by address generation. In such embodiments, all the CNU and variable node processing is done in a time division multiplexed fashion for each sub-vector of length M, so as to process the vector of size p to mimic the pipeline in FIG. 6A, 6B. Such processing is referred to as sub-block serial processing.

Figure 7:
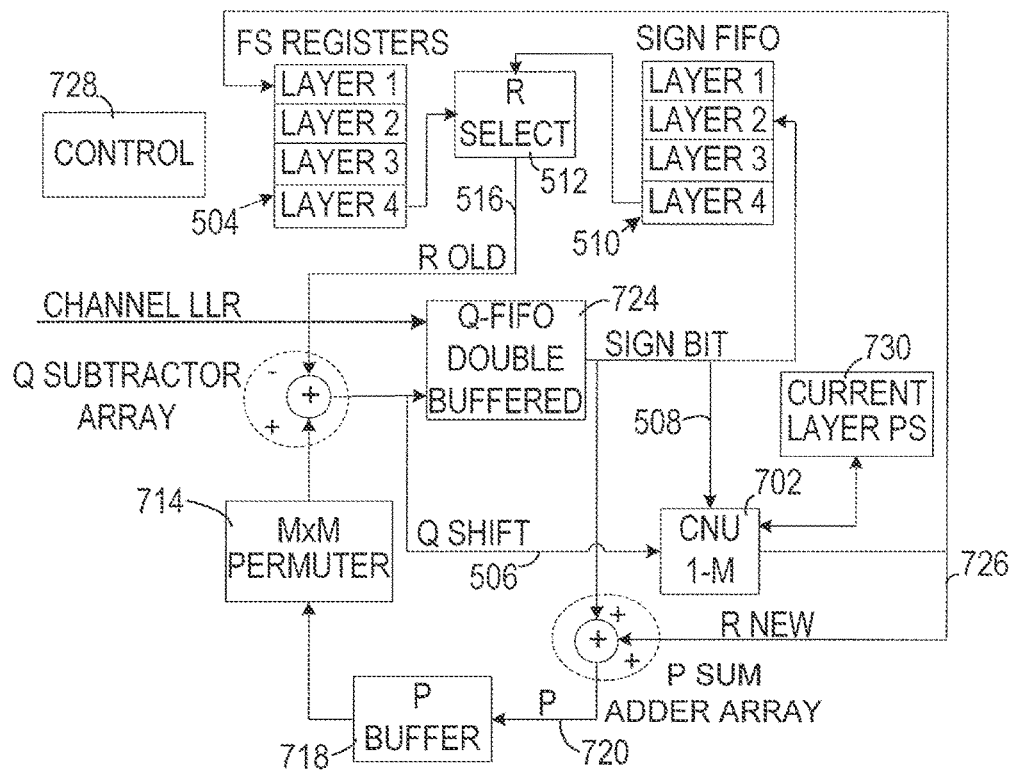
FIG. 7 shows a sub-block serial LDPC decoder in accordance with various embodiments.

FIG. 7 shows a sub-block serial LDPC decoder in accordance with various embodiments. The final state array 504, R select unit 512, and sign bit array 510 are as described above in relation to decoder 500. The CNU array 702 includes M CNUs 200, where M<p, resulting in a reduction of CNU array logic as described above. Because CNU array 702 processes sub-blocks rather than blocks, the results of sub-block processing, i.e., intermediate block processing partial state data, is stored in memory 730. These intermediate results are read into the CNU array as block processing progresses.

An M×M permuter (i.e., cyclic shifter) 714 is used as described above. As explained, shifting of the vector P is accomplished by a combination of permuter 714 shifts and addressing of P buffer 718.

Figure 8:
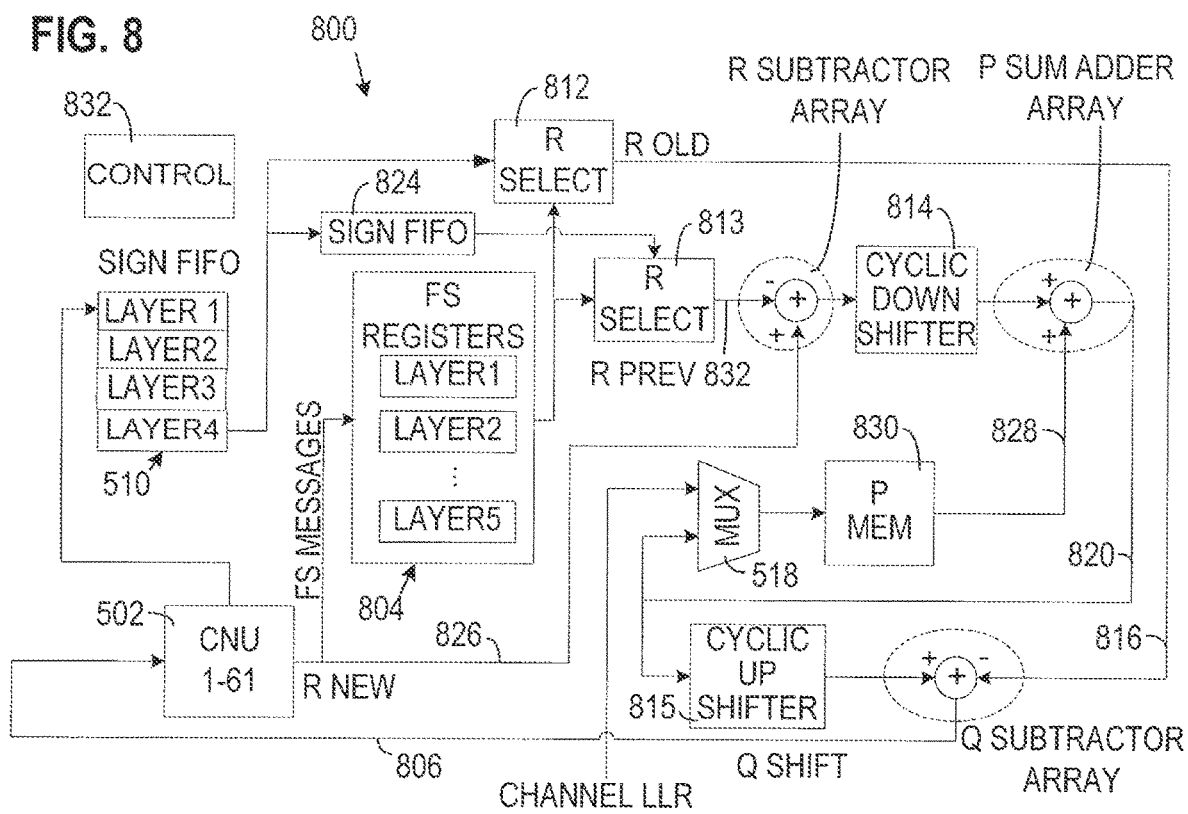
FIG. 8 shows an LDPC decoder including layered decoding and two cyclic shifters in accordance with various embodiments.

FIG. 8 shows an LDPC decoder 800 including layered decoding and two cyclic shifters in accordance with various embodiments. The vector equations applicable to this embodiment comprise the following:

$$\vec{R}_{l,n}^{(0)}=0, \vec{P}_n=\vec{L}_n^{(0)} \text{ [Initialization for each new received data frame],} \quad (13)$$

$$\forall i=1,2,\ldots,it_{max} \text{ [Iteration loop]},$$

$$\forall l=1,2,\ldots,j \text{ [Sub-iteration loop]},$$

$$\forall n=1,2,\ldots,k \text{ [Block column loop]},$$

$$[\vec{Q}_{l,n}^{(i)}]^{S(l,n)}=[\vec{P}_n]^{S(l,n)}-\vec{R}_{l,n}^{(i-1)}, \quad (14)$$

$$\vec{R}_{l,n}^{(i)}=f([\vec{Q}_{l,n}^{(i)}]^{S(l,n')}, \forall n'=1,2,\ldots,k), \quad (15)$$

$$\vec{P}_n=\vec{P}_n+[\vec{R}_{l,n}^{(i)}-\vec{R}_{l,n}^{(i-1)}]^{-S(l,n')}, \quad (16)$$

where the various terms are as defined in regard to equations (9)-(12) above. The decoder 800 is illustrated as configured for the same code used to illustrate decoder 500, a regular array code of length 1525 described by equation (1), j=5, k=25 and p=61.

Decoder 800 includes a CNU array 502 and a sign FIFO array 510 as described above in regard to decoder 500. The final state array 804 is similar to array 504, but includes five rather than 4 register banks. Two R select units 812, 813 are included as are a cyclic down shifter 814 and a cyclic up shifter 815. The R select units 812, 813 are functionally equivalent to R selector 512 described above. Sign FIFO 824 delays application of sign bits to R select unit 813. In accordance with equation (14), shifted Q message 806, input to CNU array 502, is produced by subtracting the R old message 816 provided by the R selector unit 812 from the P message 820 shifted by the cyclic up shifter 815. The P message 820 is constructed by adding the difference of the R new message 826 from the CNU array 502 and the R prev message 832 provided by R selector unit 813 shifted by cyclic down shifter 814 to the P message 828 provided by P memory 830.

At the beginning of the decoding process, multiplexer 518, coupled to the input of the P memory 830, is set to provide channel values to P memory 830. The channel values serve as initial P messages to initialize the decoder 800.

Figure 9:
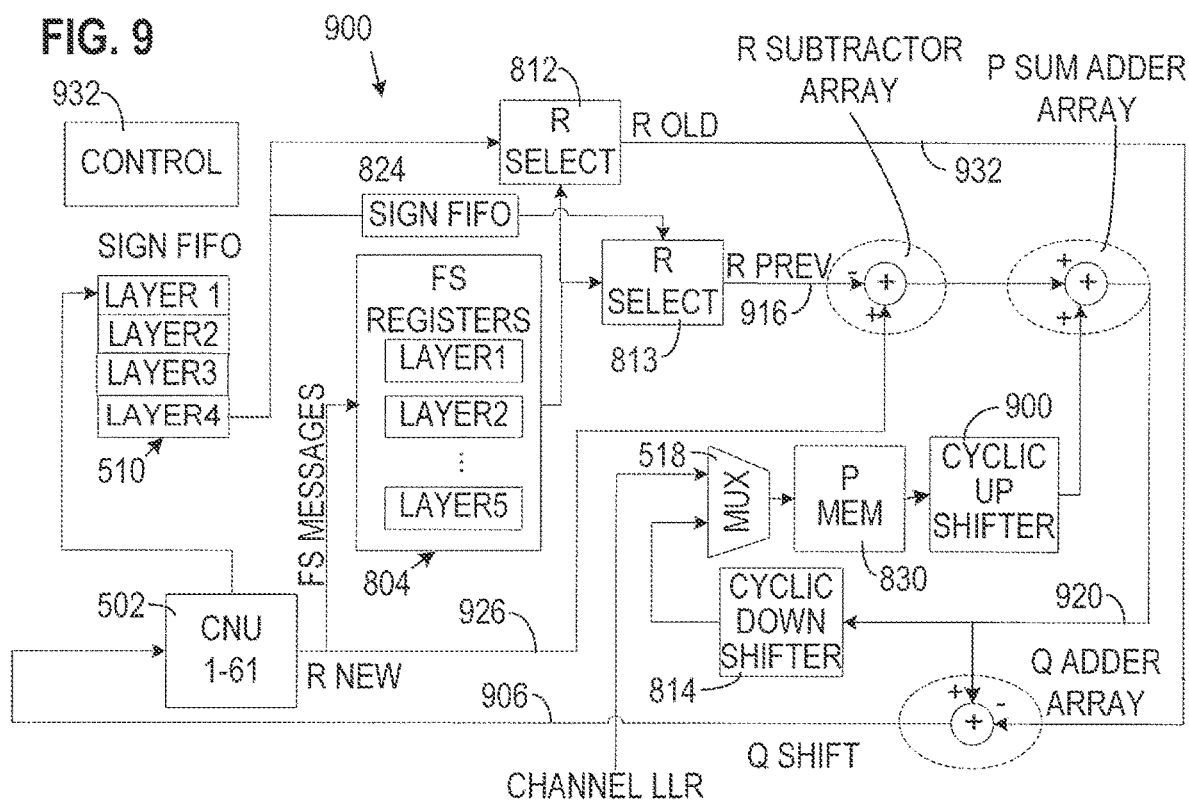
FIG. 9 shows another LDPC decoder including layered decoding and two cyclic shifters in accordance with various embodiments.

FIG. 9 shows another LDPC decoder 900 including layered decoding and two cyclic shifters in accordance with various embodiments. The vector equations applicable to this embodiment comprise the following:

$$\vec{R}_{l,n}^{(0)}=0, \vec{P}_n=\vec{L}_n^{(0)} \text{ [Initialization for each new received data frame],} \quad (17)$$

$$\forall i=1,2,\ldots,it_{max} \text{ [Iteration loop]},$$

$$\forall l=1,2,\ldots,j \text{ [Sub-iteration loop]},$$

$$\forall n=1,2,\ldots,k \text{ [Block column loop]},$$

$$[\vec{Q}_{l,n}^{(i)}]^{S(l,n)}=[\vec{P}_n]^{S(l,n)}-\vec{R}_{l,n}^{(i-1)}, \quad (18)$$

$$\vec{R}_{l,n}^{(i)}=f([\vec{Q}_{l,n'}^{(i)}]^{S(l,n')}, \forall n'=1,2,\ldots,k), \quad (19)$$

$$[\vec{P}_n]^{S(l,n)}=[\vec{P}_n]^{S(l,n)}+R_{l,n}^{(i)}-R_{l,n}^{(i-1)} \quad (20)$$

where the various terms are as defined in regard to equations (9)-(12) above. The decoder 900 is illustrated as configured for the same code used to illustrate decoders 500 and 800, a regular array code of length 1525 described by equation (1), j=5, k=25 and p=61. Decoder 900 includes a CNU array 502 and a sign FIFO array 510 as described above in regard to decoder 500. The final state array 804, R select units 812, 813, cyclic shifters 814, 815, and sign FIFO 824 are as described above in regard to decoder 800. In accordance with equation (18), shifted Q message 906, input to CNU array 502, is produced by subtracting an R old message 932 provided by the R selector unit 812 from the shifted P message 920. The P message 920 is constructed (equation (20)) by adding the difference of the R new message 926 from the CNU array 502 and the R prev message 916 provided by R selector unit 813 to the P message provided by P memory 830 shifted by cyclic up shifter 900. The decoder 900 is initialized by selecting channel values for storage in P memory 830 using multiplexer 518 as described above in regard to decoder 800.

Figure 10:
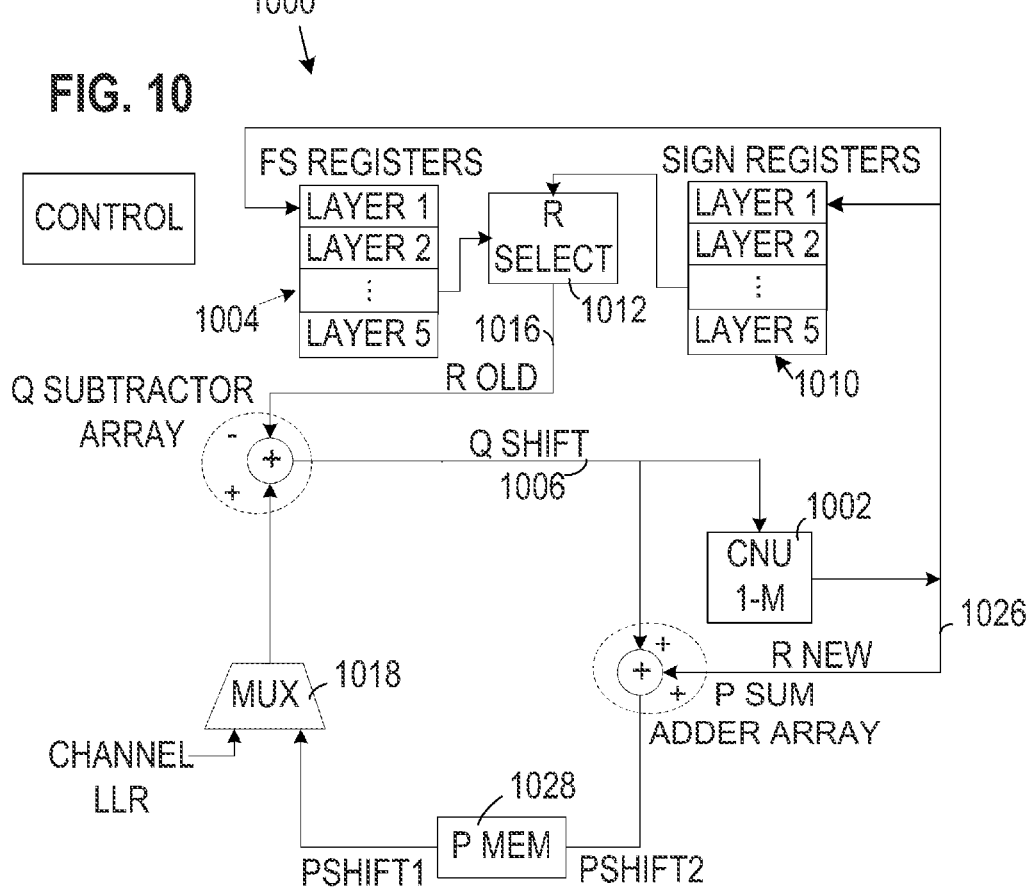
FIG. 10 shows an LDPC decoder that uses layered decoding and an offset min-sum algorithm with block parallel processing in accordance with various embodiments.

FIG. 10 shows an LDPC decoder 1000 that uses layered decoding and an offset min-sum algorithm with block parallel processing in accordance with various embodiments. As does decoder 500, embodiments of decoder 1000 apply vector equations (9)-(12). The difference between the two decoders, 500 and 1000, being that decoder 1000 processes all the block columns of M (where, M≤p) rows in a layer in one clock cycle. In decoder 500, which employs block serial processing, one block column is processed for p rows. In decoder 700, which employs sub-block serial processing, one block column is processed for M rows, where M p Thus, embodiments of decoder 1000 use a check node unit array 1002 that can find M1 and M2 in one or two clock cycles when all the inputs to CNU are present at the same time.

For the irregular block LDPC codes, the TDMP algorithm can be described with equations (21)-(24):

$$\vec{R}_{l,n}^{(0)}=0, \vec{P}_n=\vec{L}_n^{(0)} \text{ [Initialization for each new received data frame],} \quad (21)$$

$$\forall i=1,2,\ldots,it_{max} \text{ [Iteration loop]},$$

$$\forall l=1,2,\ldots,j \text{ [Sub-iteration loop]},$$

$$\forall n=1,2,\ldots,k \text{ [Block column loop]},$$

$$[\vec{Q}_{l,n}^{(i)}]^{S(l,n)}=[\vec{P}_n]^{S(l,n)}-\vec{R}_{l,n}^{(i-1)}, \quad (22)$$

$$\vec{R}_{l,n}^{(i)}=f([\vec{Q}_{l,n'}^{(i)}]^{S(l,n')}, \forall n'=1,2,\ldots,k), \quad (23)$$

$$[\vec{P}_n]^{S(l,n)}=[\vec{Q}_{l,n}^{(i)}]^{S(l,n)}+\vec{R}_{l,n}^{(i)}, \quad (24)$$

where the vectors $\vec{R}_{l,n}^{(i)}$ and $\vec{Q}_{l,n}^{(i)}$ represent all the R and Q messages in each non-zero block of the H matrix, s(l,n) denotes the shift coefficient for the $i^{th}$ block row and $n^{th}$ non-zero block of the H matrix (note that null blocks in the H matrix need not be processed); $[\vec{R}_{l,n}^{i-1}]^{S(l,n)}$ denotes that the vector $\vec{R}_{l,n}^{i-1}$ is cyclically shifted up by the amount s(l,n), and k is the check-node degree of the block row or the layer. A negative sign on s(l,n) indicates that it is cyclic down shift (equivalent cyclic left shift). $f(\cdot)$ denotes the check-node processing, which can be performed using BCJR, SP or MS.

To accommodate the irregularity in block LDPC codes, the R selection unit for selecting R old ($\vec{R}_{l,n}^{(i-1)}$ in equation (22)) and partial state processing are executed in linear order for the current layer (i.e. first non-zero block, second non-zero block, etc. in a layer). The order of R generation for R new processing ($\vec{R}_{l,n}^{(i)}$ in equation (23)), however, is determined by the non-zero blocks of the next layer to be processed because $\vec{Q}_{l,n}^{(i)}$ in equation (22) of the next layer is dependent on $[\vec{P}_n]$ in equation (24) of the last layer that is updated (this is not necessarily the previous layer in the H matrix because of the irregularity of the H matrix) which in turn depends on $\vec{R}_{l,n}^{(i)}$ in equation (23) of the previous layer. Furthermore, since the check node degree of each layer in H Irregular Block codes may vary widely, it is not efficient to process each layer for a number of clock cycles equal to the maximum check-node degree. Additionally, data dependencies may necessitate that the processing of the next layer be stalled. To address these inefficiencies, embodiments apply out-of-order processing on R new generation. The R select unit for R new may operate on any of the previous layers. R generation is independent of PS or FS processing, so, out-of-order R message generation imposes no any additional restriction on the architecture.

Based on the desired hardware implementation objectives, for example, the number of pipeline stages required in a hardware implementation without stall cycles and/or reducing the number of memory accesses, embodiments optimize the processing order of the layers in the H matrix. Such processing is referred to as reordering of layers. In an H matrix having 8 layers, there are factorial of 8 combinations to choose for the processing order. Embodiments generate a permutation such that two adjacent layers have many independent circulants and then generate the decoder scheduling parameters and determine if the desired processing objective is met. If the desired processing objective is not met, embodiments continue testing another permutation. A good optimized layer sequence is generally determined within the first 1000 or a limited set of trails. Note that reordering the H matrix does not change the LDPC code specification, thus, embodiments can decode data that is encoded by the original H matrix.

Embodiments first extract several code related parameters that aid in scheduling the decoding process. These parameters may be extracted from the S matrix, the H matrix or the base matrix $H_b$. Some embodiments use the base matrix $H_b$ and the S matrix to obtain the following parameters. Based on the desired objectives (e.g., reducing pipeline stalls), embodiments optimize the processing order of the layers in the H matrix. For each ordering, embodiments generate the following parameters and see if the desired objective is met.

Check node degree of each layer in H matrix: This is defined as the number of entries in the corresponding row of S matrix, whose value is not equal to −1. This also can be defined as the number of non-zero entries in the corresponding row of the $H_b$ matrix as shown in below equation (25), $$dc(l) = \sum_{n=1}^{N_b} H_b(l, n). \tag{25}$$

Variable node degree of each block column in H matrix: This is defined as the number of entries in the corresponding column of the S matrix, whose value is not equal to −1. This also can be defined as the number of non-zero entries in the corresponding column of the $H_b$ matrix as shown below in equation (26), $$dv(n) = \sum_{l=1}^{M_b} H_b(l, n) \tag{26}$$

Circulant size, z: The size of the block or sub-block or circulant in the H matrix.

Block Number, bn: Each non-zero circulant in each layer of the H matrix is identified with a unique number.

Circulant Index, ci: Each non-zero circulant in the entire H matrix is identified with a unique number.

Block column bc: This is the block column of the specified non-zero circulant in the H matrix.

Dependent layer dl: This is the layer that supplies the last updated information of P message to the specified non-zero circulant.

Dependent non-zero circulant is the non-zero circulant that supplies the last updated information of P message to the specified non-zero circulant. The specified and the dependent circulant share the same block column.

Dependent block db: This is the block number of the non-zero circulant in the dependent layer (DL) that supplies the last updated information of P message to the specified non-zero circulant.

Dependent Circulant Index dci: This is the circulant index of the non-zero circulant in the dependent layer (DL) that supplies the last updated information of P message to the specified non-zero circulant.

Shift Matrix sm: This is the shift coefficient of the specified non-zero circulant.

Delta Shift Matrix dsm: This is the delta shift coefficient of the specified non-zero circulant. Delta Shift Matrix is equal to the difference of the sm of the specified non-zero circulant and sm of the dependent non-zero circulant.

Use Channel Value Flag ucvf: This is the flag of the specified non-zero circulant. If this flag is 1, it indicates that this is the first non-zero circulant that is updated in its block column bc. If this flag is 1 and the iteration is the first iteration, then the specified non-zero circulant gets the channel LLR value as a P message. In other cases, the non-zero circulant gets an updated P message from other non-zero circulants in its block column.

The matrices for the above variables for the complete H matrix are denoted with capital and italics of the same name. Note that some of the matrices need not be stored for some decoder configurations and decoder schedules. Embodiments apply the correction on variable node messages Q and the correction factor for each circulant is based on check node degree and variable node degree. These correction factors are stored in a matrix BETA that is indexed by check node degree and variable node degree of the specified circulant.

The following pseudo-code shows embodiments of 3 algorithms for extracting scheduling parameters from a given H matrix specified by the matrices S and $H_b$.

Parameter Extraction Algorithm Part 1:

The matrix CI_temp are initialized to zero matrices of size $M_b \times dc_{max}$. Due to the irregularity in check node degree (i.e., when $dc(l) < dc_{max}$), some of the last entries in some of the rows in these matrices remain at zero. As an example, B(i,j) represents the value in the B matrix at ith row and jth column.

BN _temp = zeros($M_b$,$N_b$);
CI _temp = zeros($M_b$,$dc_{max}$);

-continued

```
        ci = 0;
    for l = 1:M_b BEGIN
        bn = 0;
        for n = 1:N_b BEGIN
            if H_b(l,n) ≠ 0 BEGIN
                ci = ci + 1;
                bn = bn + 1;
                BN _temp(l,n) = bn;
                CI _temp(l,bn) = ci;
            END
        END
    END           (27)
```

Parameter Extraction Algorithm Part II:

```
DC = zeros(M_b);
BN = zeros(M_b,dc_max);
BC = zeros(M_b,dc_max);
DL = zeros(M_b,dc_max);
DB = zeros(M_b,dc_max);
CI = zeros(M_b,dc_max);
DCI = zeros(M_b,dc_max);
DV = zeros(N_b);
SM = -1 * zeros(M_b,dc_max);
DSM = -1 * zeros(M_b,dc_max);
    for l = 1:M_b BEGIN
        bn = 0;
        DC(l) = dc(l);
        for n = 1:N_b BEGIN
            if H_b(l,n) ≠ 0 BEGIN
                bn = bn + 1;
                pl = l - 1, if l > 1
                   = M_b, if l = 1
                while H_b(pl,n) == 0 BEGIN
                    pl = pl - 1, if pl > 1
                       = M_b, if pl = 1
                END
                dl = pl,
                db = BN _temp(dl,n);
                BC(l,bn) = n,
                BN(l,bn) = bn;
                DL(l,bn)) = dl;
                DB(l,bn) = db;
                CI(l,bn) = CI _temp(l,bn);
                DCI(l,bn) = CI _temp(dl,db);
                SM(l,bn) = S(l,n);
                DSM(l,bn) = S(l,n)- S(dl,n);
                if DSM(l,bn) < 0 BEGIN DSM(l,bn) = z + S(l,n)- S(dl,n);
            END
        END
        DV(n) = dv(n);
    END
END           (28)
```

Parameter Extraction Algorithm Part III:
Embodiments also extract the Use Channel Value Flag (UCVF).

```
UCVF = zeros(M_b,dc_max);
    for n = 1:N_b BEGIN
        for l = 1:M_b BEGIN
            if H_b(l,n) ≠ 0 BEGIN
                UCVF(l,BN _temp(l,n)) = 1;
                BREAK THE INNER FOR LOOP AND GO
                BACK TO OUTER FOR LOOP
            END
        END
    END
```

FIG. 15 shows an S matrix for an IEEE 802.16e rate 2/3 A code. There are 8 rows and 24 columns in the S matrix. Thus, there are 8 layers (or 8 block rows) and 24 block columns in the corresponding H matrix. The circulant size is 96. Zero circulants are denoted with −1 in the S matrix. So, the H matrix has a zero circulant (i.e. all zero matrix with size 96×96) corresponding to each −1 entry in S matrix. A zero circulant in the H matrix corresponds to a 0 entry in the $H_b$ matrix. Assume that processing is performed in layer sequence (i.e., in layer 1, 2, . . . 8) in each iteration.

The following are the parameters of the circulant 1508 marked with the circle (denote this as the specified circulant):

The specified circulant 1508 belongs to 3rd layer.
This is the first non-zero circulant in this layer. So, the block number bn for the specified circulant 1508 is 1.
The circulant index ci for this specified circulant 1508 is 21.
The block column be for this specified circulant 1508 is 3.
This specified circulant 1508 takes the updated P message from the circulant 1506 marked with the rectangle. So, circulant 1506 is the dependent circulant of the circulant 1508. The dependent circulant 1506 has a circulant index ci of 11. So, the dependent circulant index dci of the circulant 1508 is 11.
The layer of the dependent circulant 1506 is 2. So the dependent layer dl of the circulant 1508 marked with the circle is 2.
The block number of the dependent circulant 1506 is 1. So, the dependent block number db of the specified circulant 1508 is 1
The shift coefficient of the specified circulant 1508 is 12. Thus, the shift matrix coefficient sm of the specified circulant 1508 is 12. The H matrix has a circulant (i.e. identity matrix of size 96×96 that is cyclically shifted right by the amount 12) corresponding to 12 entry 1508 in the S matrix. Note that a non-zero circulant in the H matrix corresponds to 1 entry in the $H_b$ matrix.
The shift coefficient of the dependent circulant 1506 is 1. So, the delta shift matrix coefficient dsm of the specified circulant 1508 is 12−1=11.
The specified circulant 1508 is the second non-zero circulant in the 3rd block column. Since the specified circulant 1508 is NOT the first non-zero circulant in its block column, the specified circulant takes the updated P message from the dependent circulant 1506 in all the iterations. Therefore, the use channel value flag ucvf of the specified circulant 1508 is 0.

Figure 11:
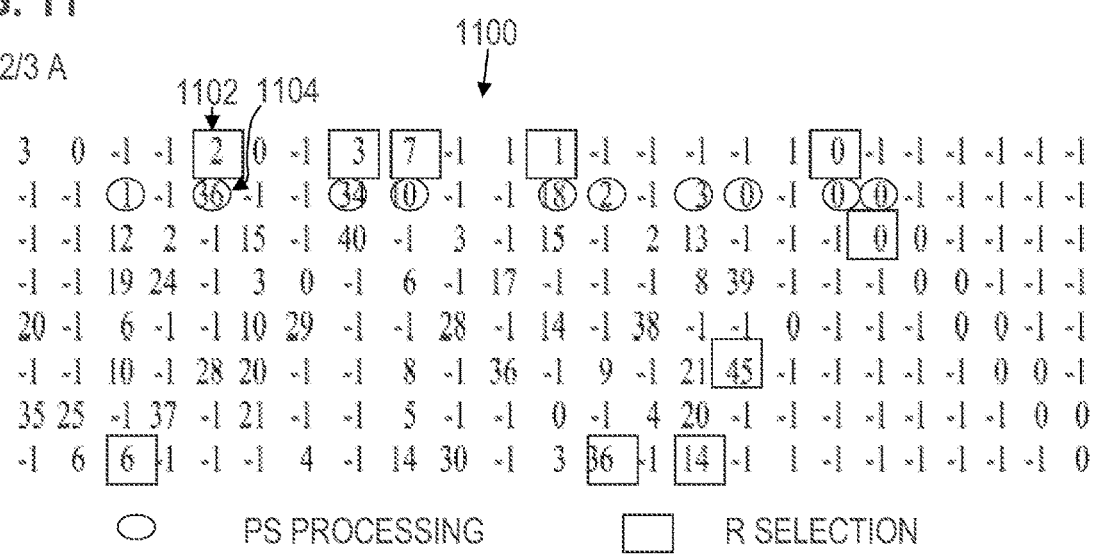
FIG. 11 shows an irregular block code suitable for out-of-order processing in accordance with various embodiments.

Referring now to FIG. 11, an irregular block code 1100 suitable out-of-order processing is shown. Embodiments perform out-of order processing at any of several levels of complexity. An embodiment may perform R selection out of order so that the R message can be timely provided for partial state processing of a subsequent layer. Thus, while processing code 1100 the R message for block 1102 of layer 1 may not be selected until needed for partial state processing of the block 1104 of layer 2. The decoder scheduling parameters that facilitate the decoder functionality for this schedule (referred to herein as "schedule 1") are listed in FIG. 17 to FIG. 30.

An embodiment can reorder block processing such that while processing layer 2, the blocks of layer 2 which depend on layer 1, for example block 1104, will be processed last to allow for latency in the processing pipeline. Thus, in regard to code 1100, the pipeline latency can be up to five without requiring the introduction of stall cycles which would impact throughput. The decoder scheduling parameters that facilitate the decoder functionality for the out of order PS processing and out of order R selection (referred to herein as "schedule 2") are listed in FIG. 31 to FIG. 44. One difference between schedule 1 and schedule 2 processing is that schedule 2 provides out-of-order block processing. Both schedules process the layers in the same order, i.e., use the same S matrix.

Figures 19, 20, 21, 22, 23:
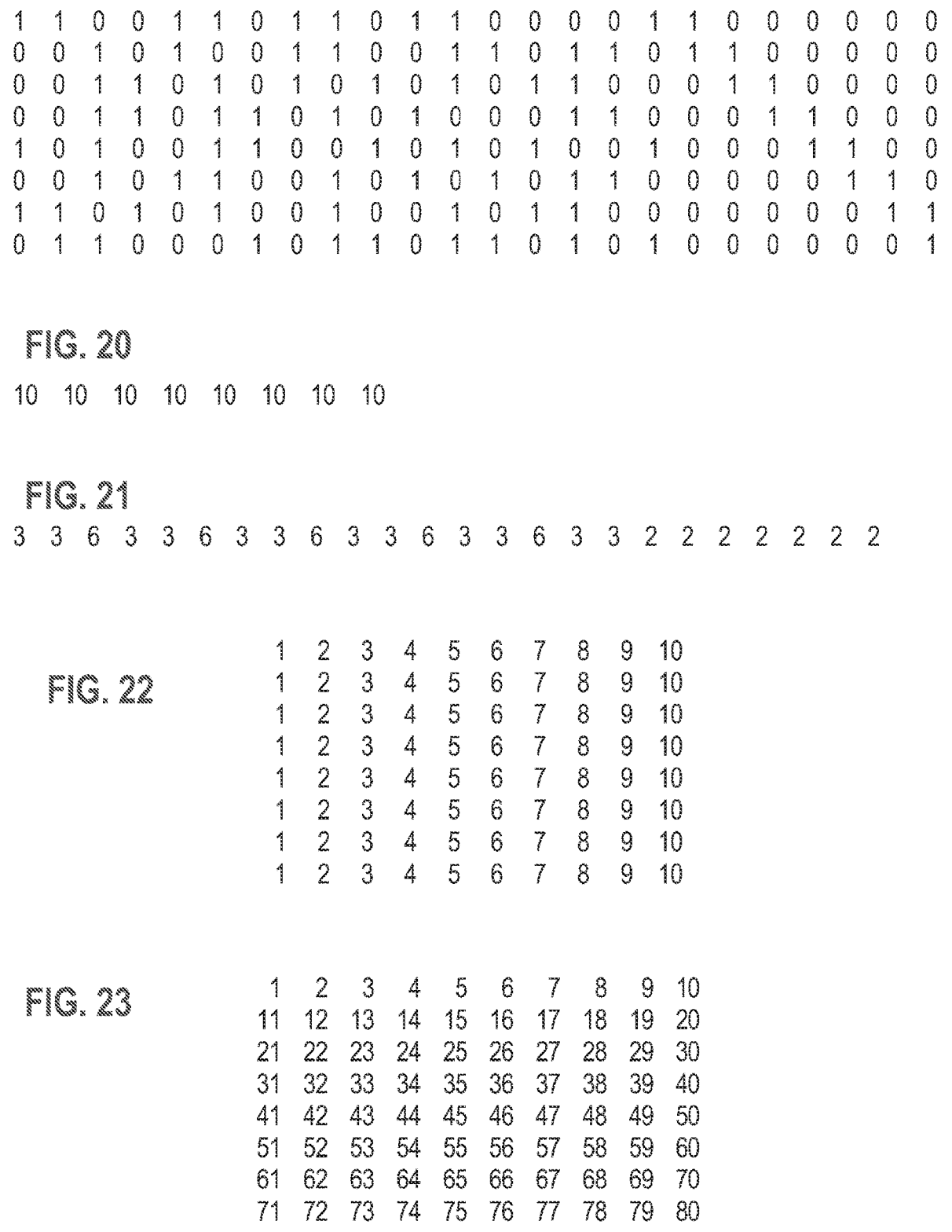
Figures 24, 25, 26, 27:
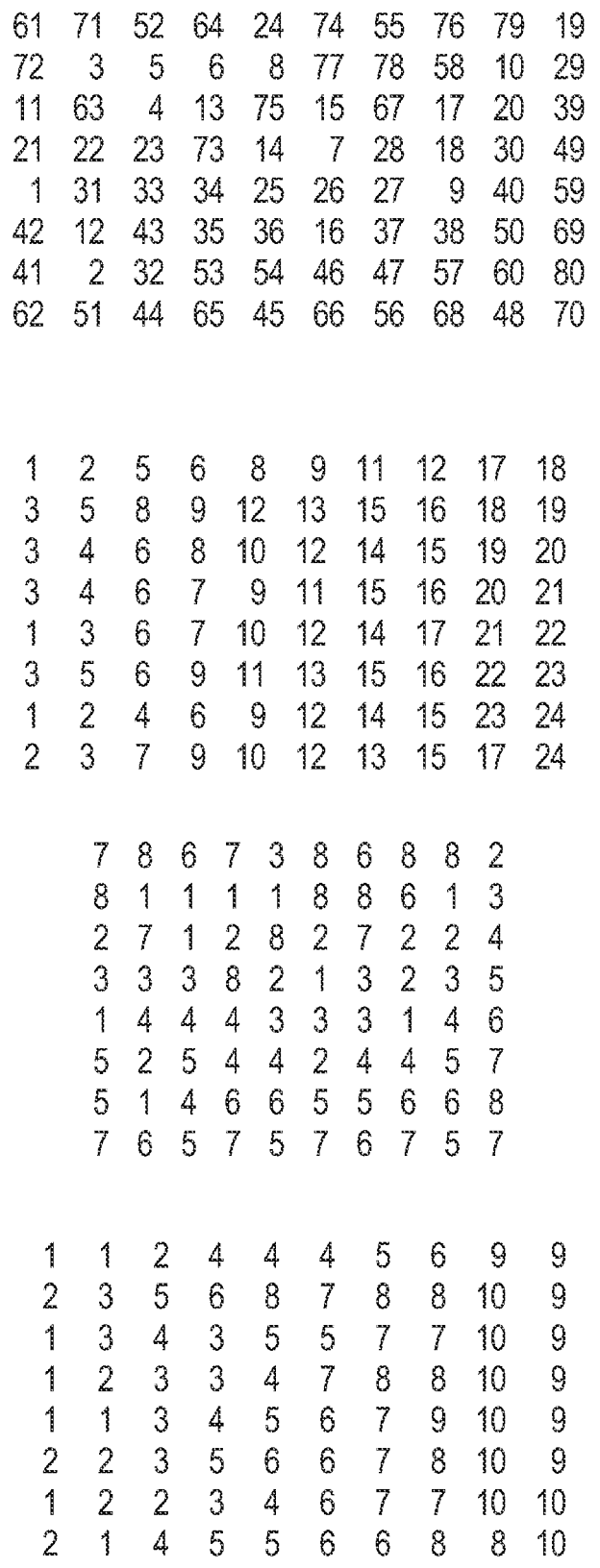
Figures 37, 38, 39, 40:
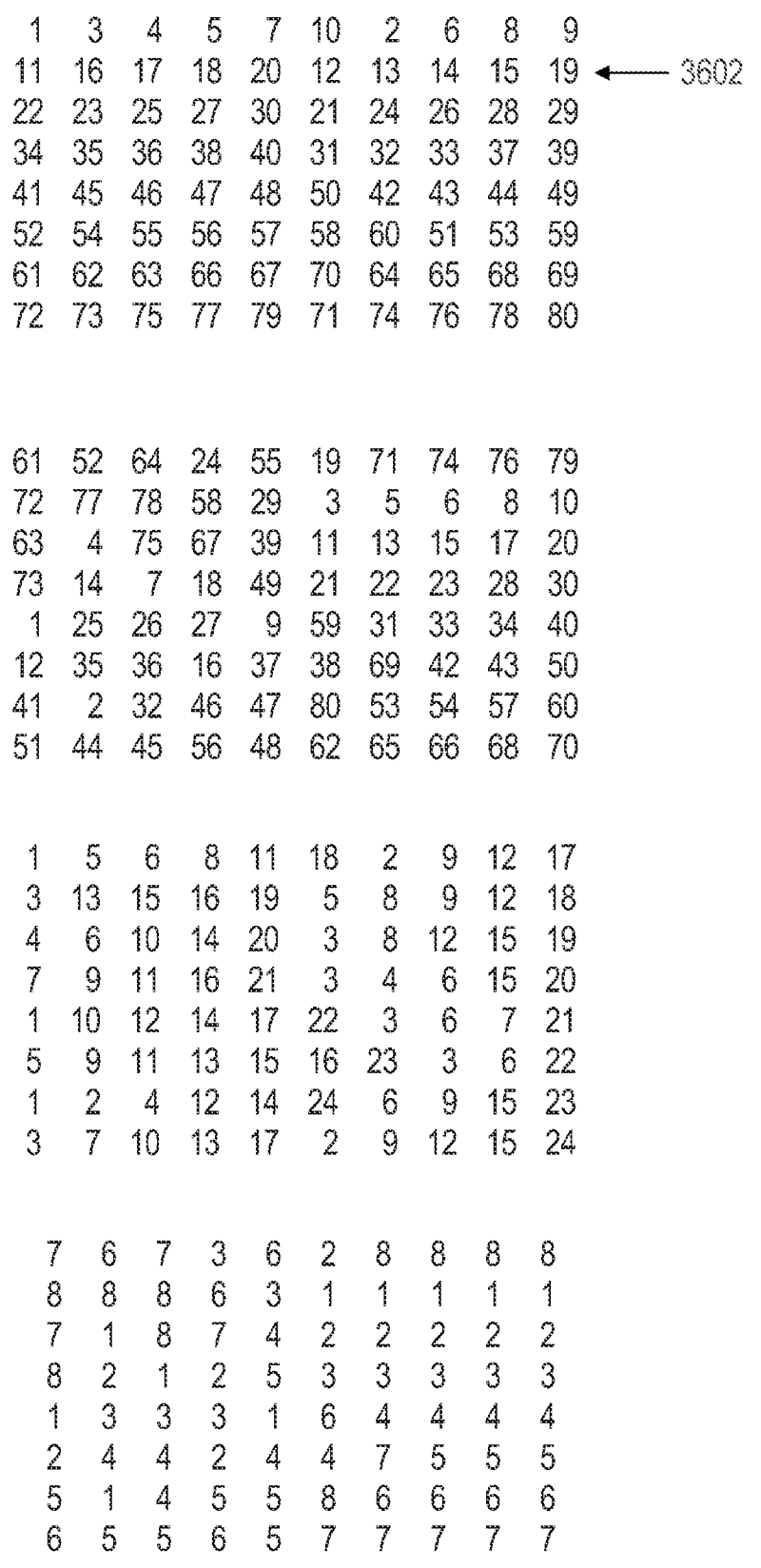

FIG. 23 and FIG. 37 show the circulant index matrices for schedule 1 and schedule 2 respectively. The indices of the circulants processed in layer 2 of FIG. 37 are: [11 16 17 18 20 12 13 14 15 19]. The indices of the circulants processed in layer 2 of FIG. 23, are: [11 12 13 14 15 16 17 18 19 20]. In FIG. 26, the 2nd row of the DL matrix gives the dependent layer information: [8 1 1 1 1 8 8 6 1 3]. Since the circulants with circulant indices [12 13 14 15 19] in layer 2 are dependent on layer 1, these circulants in layer 2 will be processed after processing the circulants with circulant indices [11 16 17 18 20]. The resulting 2nd row DL matrix of FIG. 40 is [8 8 8 6 3 1 1 1 1 1]. Similarly, out-of-order processing is employed on each layer as is shown in FIG. 37. The matrices DCI, DB, DL, BC, SM, DSM, and UCVF are obtained by doing block reordering of their counterpart matrices of schedule 1. The block reordering information is completely specified in the CI matrix of FIG. 37. Based on the pipeline requirements of a particular hardware implementation, embodiments reorder the processing of blocks in each layer, leading to out of order processing for PS processing. Embodiments perform reordering by reordering the BC, DL, DB, DCI, SM, DSM, UCVF, and DC matrices in each row according to the reordering of block numbers in the CI matrix. For example, each row in the BC matrix is reordered differently. FIG. 39 shows the BC matrix for schedule 2 which is the reordered BC matrix of FIG. 25.

For implementations in which a pipeline depth greater than five is desirable, considering again code 1100, an embodiment can reorder the layers first as shown in FIG. 45 and apply out of order processing for R selection and PS processing. Here the processing sequence of layers is optimized such that the possible pipeline depth is 6. One such processing sequence of layers is [3 6 5 2 7 4 1 8]. The H matrix is reordered and the resulting S and $H_b$ matrices are shown in FIG. 46 and FIG. 47 respectively. The decoder scheduling parameters are extracted based on out-of-order processing for R selection and PS processing. The parameters are shown in FIG. 46 to FIG. 58. Because the S and $H_b$ matrix as seen by the decoder are changed, the decoder scheduling parameters are be quite different from Schedules 1 and 2. Note, however that schedule 3 is essentially schedule 2 applied to a reordered H matrix.

Embodiments obtain improved schedules by reordering based on other criterion and other matrices as well. For example, examination of the DL matrix of FIG. 40 for schedule 2, reveals that layer 3 needs to access FS from layers [7 1 8 7 4 2 2 2 2 2] to generate the R new messages. The layer 7 is accessed at different processing times-however the same value is read. Embodiments can reorder the processing such that the 3rd row in the DL matrix is [7 7 1 8 4 2 2 2 2 2]. Since the two accesses are in consecutive processing time slots, there is only physical read access to the FS memory. This helps minimize the memory power. Similar reordering can be done on the remaining rows of DL matrix. To satisfy both the pipeline requirements and memory access requirements, the reordering of the DL matrix is done such that the DL entries that have the same value are grouped together and the entries that show dependence of the current layer on the previous layer are listed last in the processing schedule.

As an illustration of above scheduling schemes, consider the following scenarios:

SCHEDULE 1: No reordering of layers is done. Out-of-order processing for R new message generation is possible with these parameters. No out-of-order block processing is performed in PS processing.

SCHEDULE 2: No reordering of layers is done. Out-of-order processing for R new message generation is possible with these parameters. Out-of-order block processing is performed in PS processing.

SCHEDULE 3: Reordering of layers is done. Out-of-order processing for R new message generation is possible with these parameters. Out-of-order block processing is performed in PS processing.

Figure 13:
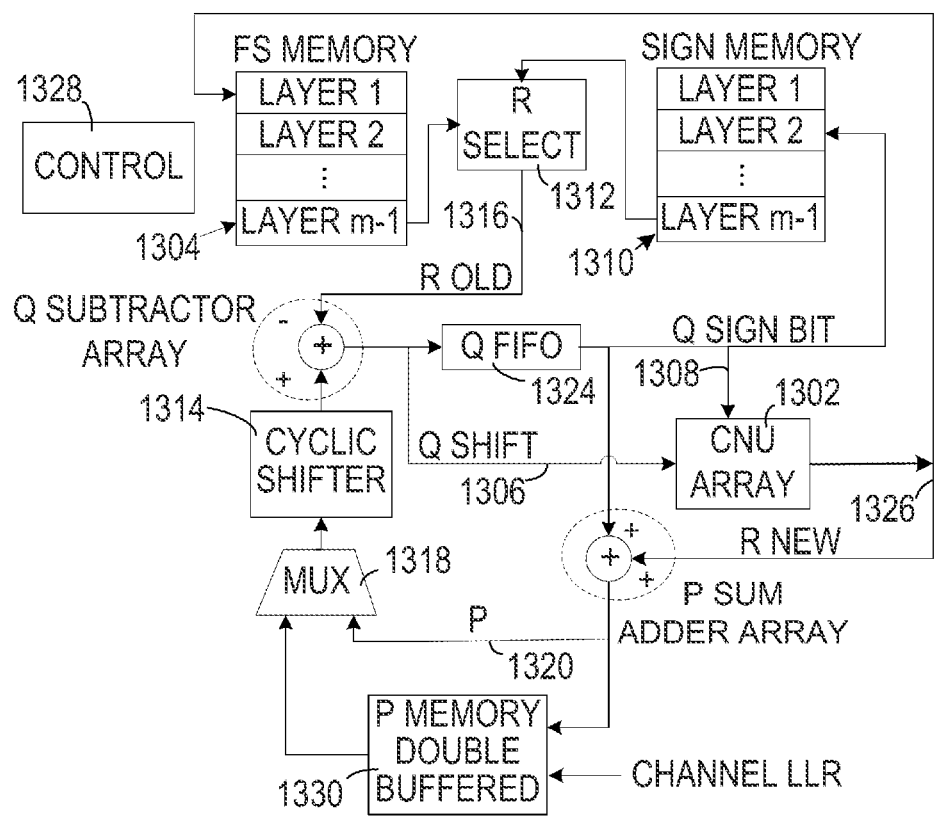
FIG. 13 shows another illustrative LDPC decoder that uses out-of-order processing for decoding irregular LDPC codes in accordance with various embodiments.
Figure 14:
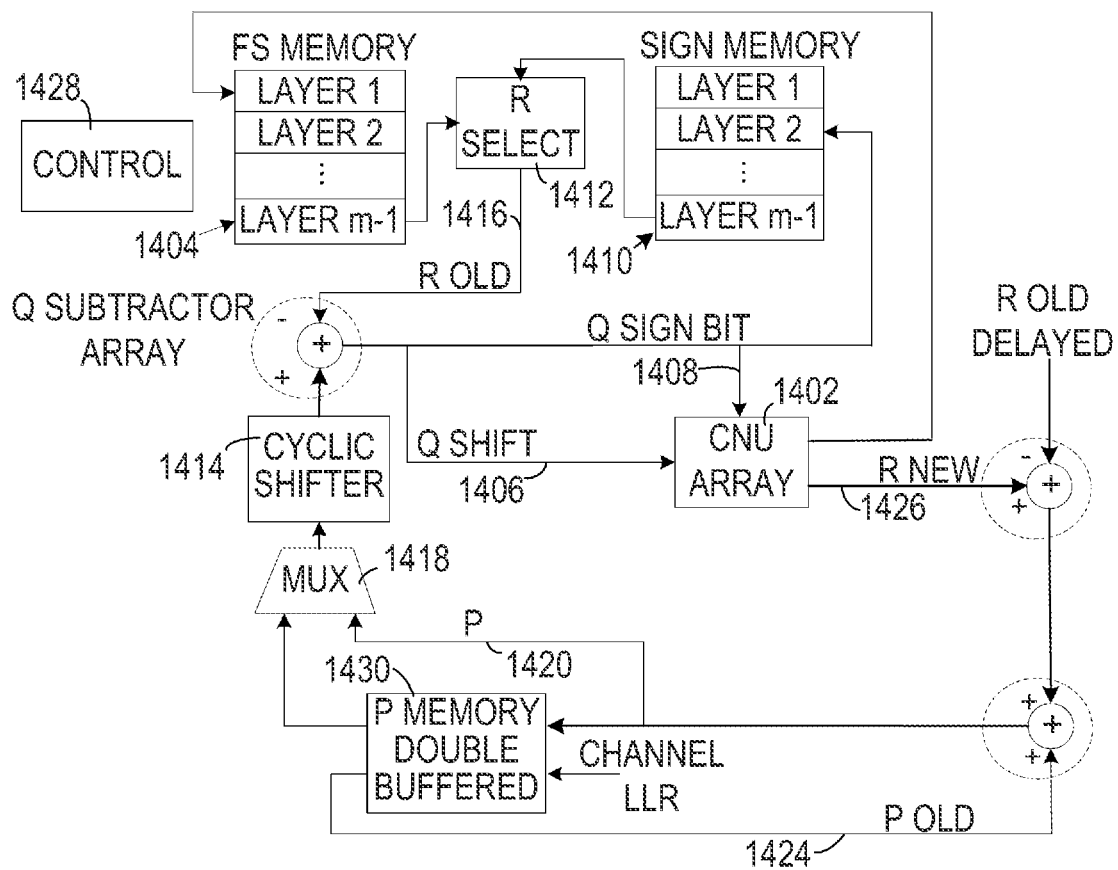
FIG. 14 shows another illustrative LDPC decoder that uses out-of-order processing for decoding irregular LDPC codes in accordance with various embodiments.

The above scheduling parameters in all the above 3 processing schedules are applicable to a variety of decoder structures, including, for example, the decoders 1200, 1300, 1400 of FIGS. 12-14. A difference between these decoders is that R new messages are generated in order for decoders 1300, 1400, thus the decoders 1300, 1400 have no need for the parameters DL, DB, and DCI. All the above schedules decode the 802.16e rate 2/3A code as specified in IEEE 802.16e standard—however, with different pipeline characteristics in hardware and thus different hardware efficiencies in terms of throughput. With schedule 1, the number of pipeline stages in a decoder without any stall cycles is zero. With schedule 2, the number of pipeline stages in a decoder without any stall cycles is 5. With schedule 3, the number of pipeline stages in a decoder without any stall cycles is 6.

For cases in which a pipeline depth greater than six is desirable, considering again code 1100, an embodiment can process the blocks of layer 3 and higher layers that are independent of layers one and two. When the result from layer one is available, an embodiment can process the blocks in layers two and three that are dependent on layer one. When layer two results are also available, an embodiment can complete processing of layer three blocks dependent on layer 2. Thus embodiments perform out-of-order processing at the block level and process the independent blocks. Because embodiments partially process multiple layers partial state memory should be sized to accommodate the number of layers processed.

FIG. 12 shows an LDPC decoder that uses out-of-order processing for decoding irregular LDPC codes in accordance with various embodiments. Embodiments of the decoder 1200 apply vector equations (21)-(24) which are similar to equations (9)-(12). Cyclic shifter 1214 operates as described above in regard to cyclic shifter 504 of decoder 500. Decoder 1200 differs from decoder 500 in a number of respects to enable out-of-order block processing however. The final state storage registers 230 of CNU 200 used in the CNU array 502 of decoder 500 have been moved outside of CNU array 1202 in decoder 1200 to facilitate out-of-order block processing. Thus, final state storage array 1204 provides new final state data 1218 to R new select unit 1213 and old final state data 1220 to R old select unit 1212. Similarly, Q sign memory 1226 provides stored Q sign bits 1228 to the R new select unit 1213 and the R old select unit 1212 for R message generation. Q memory 1224 is randomly accessible to provide the appropriate Q old message 1208 for generation of a new P message 1222 during out-of-order processing.

It is not possible to achieve cyclic shifts specified by s(l,n),(=0,1, . . . z−1) on a vector of length z with a cyclic shifter of size M×M if M is not an integer multiple of z. So, to accommodate the different shifts needed for WiMax LDPC codes, embodiments use a Benes network, which is of complexity 2 log 2(M)−1 stages of M 2-in-1 multiplexers. In some embodiments, a memory can be used to store control inputs needed for different shifts if supporting one expansion factor. The memory for providing control signals to the network is equal to $$\frac{M}{2}(2\log2(M) - 1)$$

bits for every shift value that needs to be supported.

This results in a large memory requirement to support all the WiMax codes. To avoid the control memory requirement, embodiments employ a cyclic shifter constructed as a Master-slave Benes network to accommodate 114 different parity check matrices in run time for IEEE 802.16e. This approach eliminates the control memory requirements by generating the control signals for the slave data router with the help of a self routing master network. Note that the control memory savings are specific to an IEEE 802.16e decoder.

The following set of equations provide more details as to how equations (21)-(24) are processed in the decoder 1200. of FIG. 12.
The TDMP can be described with the following equations:

explained in the previous sections for scheduling parameter generation. Note that this decoder 1200 structure supports out-of-order processing for R new messages, out-of-order processing for PS processing, and layer reordering.

The variable n keeps track of the number of circulants that are processed in each layer. If there is no out-of-order block processing of circulants (for PS processing), then bn=BN(l, n)=n; (i.e. in the nth clock of processing layer l, circulant with block number n). If there is out-of-order block processing of circulants (for PS processing), then bn=BN(l,n); (i.e. in the nth clock of processing layer l, circulant with block number indexed by BN(l,n) is processed). The equation (30a) loads the dc value of the layer that is being processed. The equations in (30b) initialize the partial state $\forall n = 1,2, \ldots, N_b$ BEGIN
$Qs(n) = \vec{L}_n$ [One time Initialization of Qs memory with the channel LLR values]     (29)
END
$\forall i = 1,2, \ldots, it_{max}$, [Iteration loop] BEGIN     (30a)
$\forall l = 1,2, \ldots, M_b$, [Sub-iteration loop/layer loop] BEGIN
$dc = DC(l);$
$M1_{PS} = QMAX;$
$M2_{PS} = QMAX;$     (30b)
$CS_{PS} = 0;$
$\forall n = 1,2, \ldots, dc$, [Block column loop] BEGIN
$bn = BN(l,n);$
$ci = CI(l,n);$
$bc = BC(l,n);$
$dl = DL(l,n));$
$db = DB(l,n);$
$dci = DCI(l,n);$
$sm = SM(l,n);$
$dsm = DSM(l,n);$
$ucvf = UCVF(l,n);$
$dv = DV(bc);$
$\beta = BETA(dc,dv);$     (31)

$shft = dsm;$ if $ucvf = 0$     (32)
$\quad\quad = sm$ if $ucvf = 1$ $R_{new} = \vec{R}_{d/db} = R\_Select(FS(dl), db, Qsign(dci));$ if $(ucvf = 1 \text{ \& } i = 1) = 0$     (33)
$\quad\quad = 0$ if $(ucvf = 1 \text{ \& } i = 1) = 1$ $Q_{old} = Qs(bc);$     (34)
$P_{new} = Q_{old} + R_{new}$     (35)
$P_{new\_shifted} = [P_{new}]^{shft}$     (36)

$R_{old} = \vec{R}_{cl,bn} = R\_Select(FS(l), bn, sign(Q_{old}));$ if $i > 1$     (37)
$\quad\quad = 0$ if $i = 1$ $Q_{new} = P_{new\_shifted} - R_{old}$     (38)
$Qs(bc) = Q_{new};$     (39)
$Qmag = max(abs(Q_{new}) - \beta, 0);$     (40)
$Qsign(bc) = sign(Q_{new});$     (41)
$M1_{PS} = Min(Qmag, M1_{PS});$     (42)
$M2_{PS} = Min(Max(Qmag, M1_{PS}), M2_{PS});$
$Min\_id_{PS} = bn$ if $Q \leq M1_{PS}$     (43)
$CS_{PS} = XOR(sign(Q_{new})CS_{PS});$     (44)
$PS = \{M1_{PS}, M2_{PS}, Min\_id_{PS}, CS_{PS}\};$     (45)
END
$\{M1_{FS}, M2_{FS}, Min\_id_{FS}, CS_{FS}\} = \{M1_{PS}, M2_{PS}, Min\_id_{PS}, CS_{PS}\},$     (46)
$FS(cl) = \{M1_{FS}, M2_{FS}, Min\_id_{FS}, CS_{FS}\}$     (47)
END
END When the decoder 1200 processing starts for a received code word, the Qs memory 1224 is initialized with the channel LLR values as in (29). The processing is generally done from layer 1 to layer $M_b$ and the variable l keeps track of which layer is being processed. However, to improve decoder 1200 efficiency, the layers of the H matrix are processed in a different order. The H matrix is reordered and all the decoder scheduling parameters are generated as registers $M1_{PS}, M2_{PS}, CS_{PS}$. The set of equations in (31) load the parameters for each circulant that need to be processed. Generally, these scheduling parameters are generated using a computer (e.g., a PC or workstation), or an embedded processor coexisting with the decoder on the same or a different integrated circuit. The computer or embedded processor executes a software embodiment of the parameter extraction algorithm and the required decoding schedule to produce the scheduling parameters. The generated schedule is loaded into decoder memory, for example Read Only Memory ("ROM") or Random Access Memory ("RAM"). All of the scheduling parameters in matrices that are indexed by (l,n) are converted into vectors indexed by ((l−1)·DC(l)+ n) after removing any invalid entries in each row of the matrix and are stored in decoder memory. However, for clarity, scheduling parameters are shown as accessed using two indices l and n.

The equation (32) represents a simple selection of a required shift coefficient based on the variable ucvf. All the other equations (33-47) are vector operations. The equation (35) represents the P update. The equation (36) represents the shift operation performed on the P message. The equation (38) represents the Q update. The equation (40) represents the correction operation on Q message. The set of equations (42-44) represent the check node partial state processing of finding $M1_{PS}, M2_{PS}, Min\_id_{PS}, CS_{PS}$. The $CS_{PS}$ represents the cumulative XOR of sign messages of the Q messages processed so far in each row for all the rows in each layer. The CSFs represents the cumulative XOR of sign messages of the all the Q messages in each row for all the rows in each layer. The equations (33) and (37) represent the R new message processing and R old message processing respectively.

The decoder 1200 comprises internal memories to store the internal results or processing. The Q memory 1224 may be double buffered, thus enabling reception of an incoming code word while the decoder 1200 is processing another code word. Equations (29), (34) and (39) represent the read and write operations on Q memory 1224. The FS memory 1204 stores the FS message for all the layers. Equation (47) represents the write operation to FS memory 1204 (note that there is only one write operation per clock cycle). In equation (37), FS(l) represents the read operation from FS memory 1204 to access FS old message 1220 (FS message of the layer of the previous iteration). Note that there is only one read access for each layer as the read address is l inside each sub-iteration loop/layer processing loop.

The decoder contains a separate hard decision memory HD memory which is not shown in 1200. The hard decision bits are the sign bits of P message. The HD memory may also be double buffered, thus enabling processing of the incoming code while sending the decoder decisions to the output interface. The HD memory may have more than two buffers, thus enabling statistical processing of the incoming code words to provide a constant average throughput. This enables the decoder to buffer the hard decisions of the frames that were previously decoded. Since the output interface expects the frames in the same order as they are fed in at the input interface, the HD memory buffers the frames that were processed out-of-order and sends them in-order.

The Q memory 1224 may have more than two buffers, thus enabling statistical processing of the incoming code words to provide a constant average throughput. The incoming code words may differ in the number of errors contained, so the decoder may need a different number of iterations for each frame based on its quality. Allocation of the maximum number of LDPC decoder iterations for each frame can be chosen based on the number of failing LDPC check node constraints in the received frame.

When the LDPC decoder is used as part of an iterative detector in combination with an Inter-Symbol Interference ("ISI") detector, the Q memory can be used to buffer the Channel LLRs from the ISI detector, Extrinsic messages from the LDPC decoder, and to serve as internal storage for the LDPC decoder's Q messages. Statistical buffering can be applied in this case also. In addition to the Q memory and HD memory, the input memory to the ISI detector is also statistically buffered. The input memory to the ISI detector stores the received samples from the previous block in the receiver chain, for example, a Finite Impulse Response filter. Since both the ISI detector the LDPC decoder work in an outer loop called global iteration, the statistical buffering of Q memory and input memory to the ISI detector would be on the same frames that are not yet decoded or not yet fully decoded (i.e., some of the frames are processed already, however they have not yet converged so further iterations are necessary). The statistical buffering of HD memory is to enable keeping the frames that are already decoded.

In decoder 1200, out-of-order processing for R new message generation is employed. In equation (33) FS(dl) represents the read operation from FS memory to access FS new message 1218 (FS message of the dependent layer of the currently processed circulant). Note that there can be as many as dc read accesses for each layer as the read address is dl inside each sub-iteration and each layer can have as many as $min(dc, M_b)$ dependent layers.

The Q sign memory 1310 stores the signs 1308 of all the Q messages of all the circulants in the H matrix. The equation (59) represents the write operation to Q sign memory and the equation (67) represents the read operation from Q sign memory while generating the R new messages 1326. In decoder 1300, equation (55) is not needed because we are not storing the R old messages 1316.

The following set of equations provides more details as to how equations (21)-(24) are processed in the decoder 1300 of FIG. 13. The TDMP can be described with the following equations:

$\forall n = 1, 2, \ldots, N_b$ BEGIN (48)
$P(n) = \vec{L}_n$ [One time Initialization of P memory with the channel LLR values]
END
$\forall i = 1, 2, \ldots, it_{max}$, [Iteration loop] BEGIN
$\forall l = 1, 2, \ldots, j$, [Sub-iteration loop] BEGIN (49a)
dc = DC(l);
$M1_{PS} = Q$MAX;
$M2_{PS} = Q$MAX; (49b)
$CS_{PS} = 0$;
$\forall n = 1, 2, \ldots, dc$, [Block column loop] BEGIN
ci = CI(l,bn);
bn = BN(l,n);
bc = BC(l,bn);
sm = SM(l,bn);
dsm = DSM(l,bn);
ucvf = UCVF(l,bn);
dv = DV (bc);
$\beta$ = BETA(dc,dv); (50)

$shft = dsm$; if $ucvf = 0$ (51)
$= sm$ if $ucvf = 1$ $P_{new} = P(bc)$; (52)
$P_{new\_shifted} = [P_{new}]^{shift}$ (53)

$R_{old} = \vec{R}_{cl,bn} = $ R_Select($FS(l)$, $bn$, sign($Q_{old}$)); if $i > 1$ (54)
$= 0$ if $i = 1$ $R_{old\_delayed}(bn) = R_{old}$ (55)
$Q_{new} = P_{new\_shifted} - R_{old}$ (56)
$Qs(n) = Q_{new}$; (57)
$Q$mag = max(abs($Q_{new}$) − $\beta$,0); (58)
$Q$sign(bc) = sign($Q_{new}$); (59)
$M1_{PS} = $ Min($Q$mag,$M1_{PS}$); (60)
$M2_{PS} = $ Min(Max($Q$mag,$M1_{PS}$),$M2_{PS}$);
Min_id$_{PS}$ = bn if $Q \le M1_{PS}$ (61)
$CS_{PS} = $ XOR(sign($Q_{new}$),$CS_{PS}$); (62)

```
PS = {M1_PS,M2_PS,Min_id_PS,CS_PS};                              (63)
END
{M1_FS,M2_FS,Min_id_FS,CS_FS}= {M1_PS,M2_PS,Min_id_PS,CS_PS};    (64)
FS_temp = FS(l)
FS(l) = {M1_FS,M2_FS,Min_id_FS,CS_FS}                            (65)
∀n = 1,2,...,DC(l), [Another Block column loop] BEGIN
ci = CI(l,bn);
bn = BN(l,n);
bc = BC(l,bn);                                                   (66)
R_new = R⃗_dl,db = R_Select(FS_temp,bn,Qsign(ci));                (67)
Q_old = Qs(n);                                                   (68)
P_new = Q_old + R_new;                                           (69)
P(bc) = P_new;                                                   (70)
END
END
END
```

When the decoder 1300 processing starts for a received code word, the P memory 1330 is initialized with the channel LLR values as in equation (48). The processing is generally done from layer 1 to layer $M_b$ and the variable l keeps track of which layer is being processed. However, to improve decoder 1200 efficiency, the layers of the H matrix are processed in a different order. The H matrix is reordered and all the decoder scheduling parameters are generated as explained in the previous sections for scheduling parameter generation. Since out-of-order processing for R new messages is not employed in the decoder 1300, there is no need for scheduling parameters DCI, DB, or DL. Note that the decoder 1300 supports out-of-order processing for PS processing and layer reordering.

The variable n keeps track of the number of circulants that are processed in each layer. If there is no out-of-order block processing of circulants (for PS processing), then bn=BN(l, n)=n; (i.e., in the nth clock of processing layer l, circulant with block number n). If there is out-of-order block processing of circulants (for PS processing), then bn=BN(l,n); (i.e., in the nth clock of processing layer l, circulant with block number indexed by BN(l,n) is processed). The equation (49a) loads the dc value of the layer that is being processed. The equations in (49b) initialize the partial state registers $M1_{PS}, M2_{PS}, CS_{PS}$. The set of equations in (50) load the parameters for each circulant that needs to be processed. Generally, these scheduling parameters are generated using a computer (e.g., a PC or workstation), or an embedded processor coexisting with the decoder on the same or a different integrated circuit. The computer or embedded processor executes a software embodiment of the parameter extraction algorithm and the required decoding schedule to produce the scheduling parameters. The generated schedule is loaded into decoder memory, for example Read Only Memory ("ROM") or Random Access Memory ("RAM"). All of the scheduling parameters in matrices that are indexed by (l,n) are converted into vectors indexed by ((l−1)·DC(l)+n) after removing any invalid entries in each row of the matrix and are stored in decoder memory. However, for clarity, scheduling parameters are shown as accessed using two indices l and n.

The equation (51) represents a simple selection of a required shift coefficient based on the variable ucvf. All the other equations (52-70) are vector operations. The equation (69) represents the P update. The equation (53) represents the shift operation performed on the P message. The equation (56) represents the Q update. The equation (58) represents the correction operation on the Q message. The set of equations (60-63) represent the check node partial state processing of finding $M1_{PS}, M2_{PS}, Min\_id_{PS}, CS_{PS}$. The $CS_{PS}$ represents the cumulative XOR of signs of the Q messages processed so far in each row for all the rows in each layer. The CSFs represents the cumulative XOR of signs of the all the Q messages in each row for all the rows in each layer. The equations (54) and (67) represent the R new message processing and R old message processing.

The decoder 1300 comprises internal memories to store the internal results of processing. The P memory 1330 may be double buffered, thus enabling reception of an incoming code word while the decoder 1300 is processing another code word. Equations (48), (52) and (70) represent the read and write operations on P memory 1330. Note that in a hardware implementation all the vector processing in the set of equations from (66)-(70) are done on the previously processed layer while the set of equations (52)-(65) are done on the currently processed layer l. Note further that the read operation of equation (52) may create a conflict if the write operation of equation (70) to the same block column in the previously processed layer is not complete. Such read before write conflicts may be handled through insertion of stall cycles. However, embodiments employ a better solution by applying out-of-order processing on PS processing (as in schedule 2 which provides 5 pipeline stages without any stall cycles), and in layer reordering and out-of-order processing on PS processing (as in schedule 3 which provides 6 pipeline stages without any stall cycles).

The FS memory 1304 stores the FS message for all the layers ("m" in FIGS. 13 and 14 represents the number of layers $M_b$). Equation (65) represents the write operation to FS memory. Note that there is only one write operation per clock cycle. In equation (54), FS(l) represents the read operation from FS memory 1304 to access FS old message (FS message of the layer of the previous iteration). Note that there is only one read access for each layer as the read address is l inside each sub-iteration loop/layer processing loop.

The Q FIFO 1324 stores the Q messages 1306 that are sent as inputs to the CNU 1302 and stores them till the CNU processing is complete. Equation (57) represents the write to the Q FIFO 1324 and equation (68) represents the read from Q FIFO 1324.

In decoder 1300, out-of-order processing for R new message 1326 generation is not employed. So there are no read accesses for FS memory 1304 in this decoder configuration for the R new message 1326 generation. The R new messages 1326 are generated in-order as is done in the layered decoder 500 of FIG. 5.

The Q sign memory 1310 stores the signs 1308 of all the Q messages of all the circulants in the H matrix. The equation (41) represents the write operation to Q sign memory and the equation (33) represents the read operation from Q sign memory while generating the R new messages 1326. In decoder 1300, equation (55) is not needed because we are not storing the R old messages 1316.

The set of equations (48)-(65) and the set of equations below provide more details as to how equations (21)-(24) are processed in the decoder 1400 of FIG. 14. However, the second block column loop is different and this difference is described by equations (71)-(76) instead of equations in (66)-(70). The Q FIFO is not needed in decoder 1400. Equation (57) in the first block loop is not needed for decoder 1400. However, in decoder 1400, equation (55) is needed because the R old messages are stored and these messages are read in equation (73). In another embodiment of decoder 1400, the memory for R old messages is omitted by generating delayed R old messages from FS memory 1404 using the value-reuse property (i.e., equation (54) is repeated to generate the delayed R old messages). Thus, embodiments avoiding the FIFO requirement for delayed R old messages have three R message generation units: R new, R old and delayed R old (some times referred to as R prev).

```
∀n = 1,2,...,dc, [Another Block column loop] BEGIN
  ci = CI(l,bn);
  bn = BN(l,n);
  R_new = R_Select(FS_temp,bn,Qsign(ci));           (71)
                                                    (72)
  R_prev = R_old_delayed (n);                       (73)
  P_old = P(bc);                                    (74)
  P_new = P_old + R_new − R_prev;                   (75)
  P(bc) = P_new;                                    (76)
END
```

When constructing the LDPC code matrix itself, layer ordering and block ordering requirements can be taken into account. Independence between adjacent layers can be maximized so that while processing the current layer, the next layer has few dependencies on the current layer.

Some embodiments use scheduled layered approximation as described herein below. In the case of regular LDPC codes with no null matrices, it is not possible to gain any benefit from out-of-order block processing in the block serial decoder 500 of FIG. 5. To enable pipelining without stall cycles, the decoder allows some of the blocks in the currently processed layer to take the updated P message from the layer that is already processed. For instance, consider (5,25) regular LDPC code. Assume that a pipeline depth of 4 is needed to meet the required frequency target for a given throughput and hardware area. Processing each layer takes 25+4 clock cycles if 4 stall cycles are added for 4 pipeline stages. Assume each layer is processed in a layer-time slot that takes 25 clock cycles. The presently processed layer takes the updated P message from the layer that was processed in the previous layer-time slot. It is possible to approximate the layered decoding such that the presently processed layer takes the updated P message from the layer that was processed two layer-time slots previously. However, this layered approximation introduces significant bit error rate performance loss. Embodiments solve this problem by enforcing layered approximation on the circulant level rather than on at the layer level. Since a pipeline depth of 4 is needed, the decoder first processes 4 out of 25 blocks in each layer with the P message update from the layer that was processed two layer-time slots previously. The decoder then processes the remaining 21 blocks out of 25 blocks in each layer with the P message update from the layer that was processed one layer-time slot previously as in the usual layered decoding. To avoid any error floor issues due to the preferential treatment to some of the circulants in H matrix, the decoder changes the set of circulants which would receive the regular layered update and the set which would receive the approximate layered update. Thus, the decoder selects a new set of, for example, 4 circulants that will undergo approximate layered decoding each iteration. The selected circulants can be changed each iteration. In this way after about 6 iterations all of the 25 blocks receive the layered update.

The semi-parallel decoder architecture, as shown in FIG. 10, includes P memory. Embodiments may include one dual-port P memory bank for each of the $d_c$ block columns in the H matrix because each circulant may need to have access to a different set of P values. The P memory has bandwidth of $M*d_c$ LLRs and depth of ceil(p/M). Each bank can support a read/write bandwidth of M LLRs. The shift value applied to each circulant may be achieved through a combination of memory addressing and a permuter network of size M×M. The FS Memory is dual port with one port for read and another for write. The FS memory may be able to read and write FS state (M1, −M1, +/−M2 and index for M1) for M rows. Note that for shorter length codes, embodiments may store M1, −M1 and +/−M2, M1 index, and cumulative sign to provide some logic savings. However, for the long length codes it may be beneficial to store M1, M2, M1 index, and cumulative sign as memory may occupy most of the area in the decoder.

The disclosed decoder architecture can be accelerated by further pipelining. The data path may be pipelined at the stages of CNU (2 stages), P computation, Q subtraction, R select units. Memory accesses may be assigned 2 clock cycles. In some embodiments, a pipeline depth of 10 is employed to achieve a target frequency of 400 MHz. Pipelining, however, incurs additional complexity to the decoder. Note in the above case, the logic pipeline depth is about 5 and the pipeline depth related to memory accesses is 5. Whenever the computation of a layer is started, the decoder needs to wait until the pipeline processing of a previous layer is complete. This incurs a penalty of clock cycles equal to the number of hardware pipeline stages for logic which is denoted as V. In the above example, V is 5. To avoid the 5 stall cycle penalty due to memory accesses, some embodiments employ a result bypass technique with local register cache+prefetching for P and hard decision bits and a prefetching technique for FS and Qsign memories (or equivalently pre-execution for R old). As a result, the penalty for each iteration measured in number of clock cycle is $$j\left(\text{ceil}\left(\frac{p}{M}\right)+V\right).$$

This can be significant penalty on throughput if V is not small compared to ceil(p/M).

Code Design Constraint: The maximum logic pipeline depth $NP_{max}$ that can be achieved without any stall cycle penalty can be computed for the quasi-cyclic codes as follows. As mentioned earlier, the pipeline depth needed for distant memory access can be dealt with the bypass technique/result forwarding using local register cache-so embodiments need not worry about number of pipeline stages needed in the communication between memories and logic. Some embodiments employ pipelining of no more than 6 to 10 stages for the memory communication as local register cache overhead proportional to the number of memory pipeline stages is provided. If the shifts on the p×p block are specified as left cyclic shift (down cyclic shift):

$$\Delta S_{m,n} = \text{shift\_diff}(s(m,n)-s(m\_\text{prev},n)) \forall m=1,2 \ldots$$
$$j; n=1,2 \ldots k.$$

If the shifts on the p×p block are specified as right cyclic shift (up cyclic shift):

$$\Delta S_{m,n} = \text{shift\_diff}(s(m\_\text{prev},n)-s(m,n)) \forall m=1,2 \ldots$$
$$j; n=1,2 \ldots k.$$

Assuming that the layers are numbered from 1 to j, if the current layer is m, denote the next layer to be processed as m_next and the layer that was processed before layer m as m_prev. Because the layers are processed in a linear order in a block parallel layered decoder, m_prev and m_next can be given as follows. Note that for block serial decoders, the layers may be processed in a reordered fashion.

$m\_\text{prev}=m-1$ if $m>1$ $m\_\text{prev}=j$ if $m=1$ $m\_\text{next}=m+1$ if $m<j$ $m\_\text{next}=1$ if $m=j$ shift_diff$(x,y)=x-y$ if $x\geq y$ shift_diff$(x,y)=x-y+p$ if $x<y$ Assuming that the desired parallelization M is 1:

$NP_{m,n}=\Delta S_{m,n}-1$ if $\Delta S_{m,n}>0$ $NP_{m,n}=p$ if $\Delta S_{m,n}=0$ For the general case of $1\leq M\leq p$, the above equations can be written as:

$$NP_{m,n} = \text{floor}\left(\frac{\Delta S_{m,n}}{M}\right) - 1 \text{ if } \Delta S_{m,n} > 0$$

$$NP_{m,n} = \text{floor}\left(\frac{p}{M}\right) \text{ if } \Delta S_{m,n} = 0$$

$$NP\_\text{MAX\_LAYER}_m = \min(NP_{m,n}) \forall\, m = 1, 2, \ldots j;$$

$$n = 1, 2, \ldots k$$

$$NP\_\text{MAX} = \min(NP\_\text{MAX\_LAYER}_n) \forall\, m = 1, 2, \ldots j$$

The number of stall cycles while processing a layer m can be computed as follows:

$NS\_\text{LAYER}_m=\min(v-NP\_\text{MAX\_LAYER}_m,0)$

If v is less than or equal to NP_MAX, then there are no stall cycles and the number of clock cycles per each iteration is given by:

$$Nclk\_\text{Iteration} = j \times \text{ceil}\left(\frac{p}{M}\right)$$

Calculation of Pipeline Depth for option 1, general permutation matrices, and random LDPC codes: Num_Last_Overlapped_rows$_m$=Number of independent rows in the current layer m, which does not depend on the last Np rows of the previous layer m_prev. Assuming that the desired parallelization M is 1:

$NP\_\text{MAX\_LAYER}_m=\text{Num\_Last\_Overlapped\_rows}_m$

For the general case of $1\leq M\leq p$, the above equations can be written as $$NP\_\text{MAX\_LAYER}_n = \text{floor}\left(\frac{\text{Num\_Last\_Overlapped\_rows}_m}{M}\right)$$

If v is less than or equal to NP_MAX, then there are no stall cycles and the number of clock cycles per each iteration is given by:

$$Nclk\_\text{Iteration} = j \times \text{ceil}\left(\frac{p}{M}\right)$$

Given the above equations, the LDPC codes may be designed such that NP_MAX is equal to or greater than the desired NP_MAX. For array codes specified with the permutation blocks with the right (up) cyclic shift, the NP_MAX is given as $$NP\_\text{Max} = \frac{(k-1)}{2}.$$

Re-ordering of rows with in a layer for Option 2: If the code is not designed to satisfy the pipeline constrain in option 1, as is the case of 10-GB LDPC codes, 802.11n and 802.16e LDPC codes, embodiments may apply a shift offset to each layer such that NP_MAX is maximized. So essentially all the rows in each layer may be re-ordered subject to the constraint that each block in the matrix still has groups of M rows for the ease of parallelization. As an example, consider the array codes specified with the permutation blocks with the left (down) cyclic shift. NP_MAX=0. However, a shift offset of down shift of p on all the blocks in all the layers will make it the same as array code with the permutation blocks with the right (up) cyclic shift for decoding purposes. In this case, the relevant equations listed for QC-LDPC codes in the above paragraphs show that $$NP\_\text{Max} = \frac{(k-1)}{2}.$$

However because of reordering due to shift offset, the P values from the buffer have to be read in a fashion accounting for the re-ordering.

Because the check node degree can vary for different mother matrices, to provide the same level of throughput at different check node degrees, embodiments can process a variable number of rows for different mother matrices. Accordingly, the CNU (as discussed herein) can be highly configurable with varying number of inputs. For instance to, support the mother matrices with (dc=40 and dc=20) with edge parallelization of 400, the CNU can selectably process 10 rows in one clock cycle corresponding to dc=40 and 20 rows in one clock cycle corresponding to dc=20. A decoder may include 20 parallel CNUs with number of inputs that is equal to 20. In the case of split processing, a decoder may include 40 parallel CNUs with number of inputs equal to 10 to support the same edge parallelization throughput requirement and to support odd and even block column processing.

Some embodiments provide more reconfigurability: for instance to support the mother matrices with (dc=36, dc=24 and dc=12) with edge parallelization of 216, an embodiment can process 6 rows in one clock cycle corresponding to dc=36; 9 rows in one clock cycle corresponding to dc=24; 18 rows in one clock cycle corresponding to dc=12. Accordingly, a decoder may include 18 parallel CNUs with number of inputs equal to 12. To support mother matrices with dc less than 36 and above 24, an embodiment can process only 6 rows leading to reduced edge parallelization. To support mother matrices with dc less than 24 but above 12, an embodiment can process 9 rows leading to reduced edge parallelization. To support mother matrices with dc less than 12, an embodiment can process 18 rows leading to reduced edge parallelization. FIGS. 59A-59E provide more details on the reconfigurable min1-min2 finder. Note that reconfiguration multiplexer logic can be to be used at the memories and other processing elements as well. A similar principle can be applied for other cases in general.

The block serial decoder architecture (e.g., as shown in FIGS. 5, 8, 9, and 12) has better run-time reconfigurability than the parallel layered decoder architecture. The block serial architecture may be a better choice for supporting multiple code lengths and code profiles. However, the parallel layered decoder (as shown in FIG. 10) has better energy efficiency, so it is suitable for applications where limited run-time reconfiguration is needed.

FIG. 59A shows a Partial Bitronic Merge circuit PBM4+ suitable for use in a reconfigurable min1-min2 finder. PBM4+ receives inputs r, s, t, and u. Inputs r, s, t, and u form two bitonic sequences. R and s form a bitonic sequence of increasing order (i.e., r<s). t and u form a bitonic sequence of decreasing order (i.e., t>u). PBM4+ outputs min 1(M1) and min2(M2) along with the min1 index (M1 index). T, u, s, and r have indices of 0, 1, 2, and 3 respectively.

FIG. 59B shows Bitonic Merge circuits BM2+ and BM2− that sort inputs A and B to provide sorted outputs and output flags as indicated.

FIG. 59C shows a hierarchical Min1-Min2 finder that employs PBM4+ circuits to construct a PBM8+.

Figure 59D:
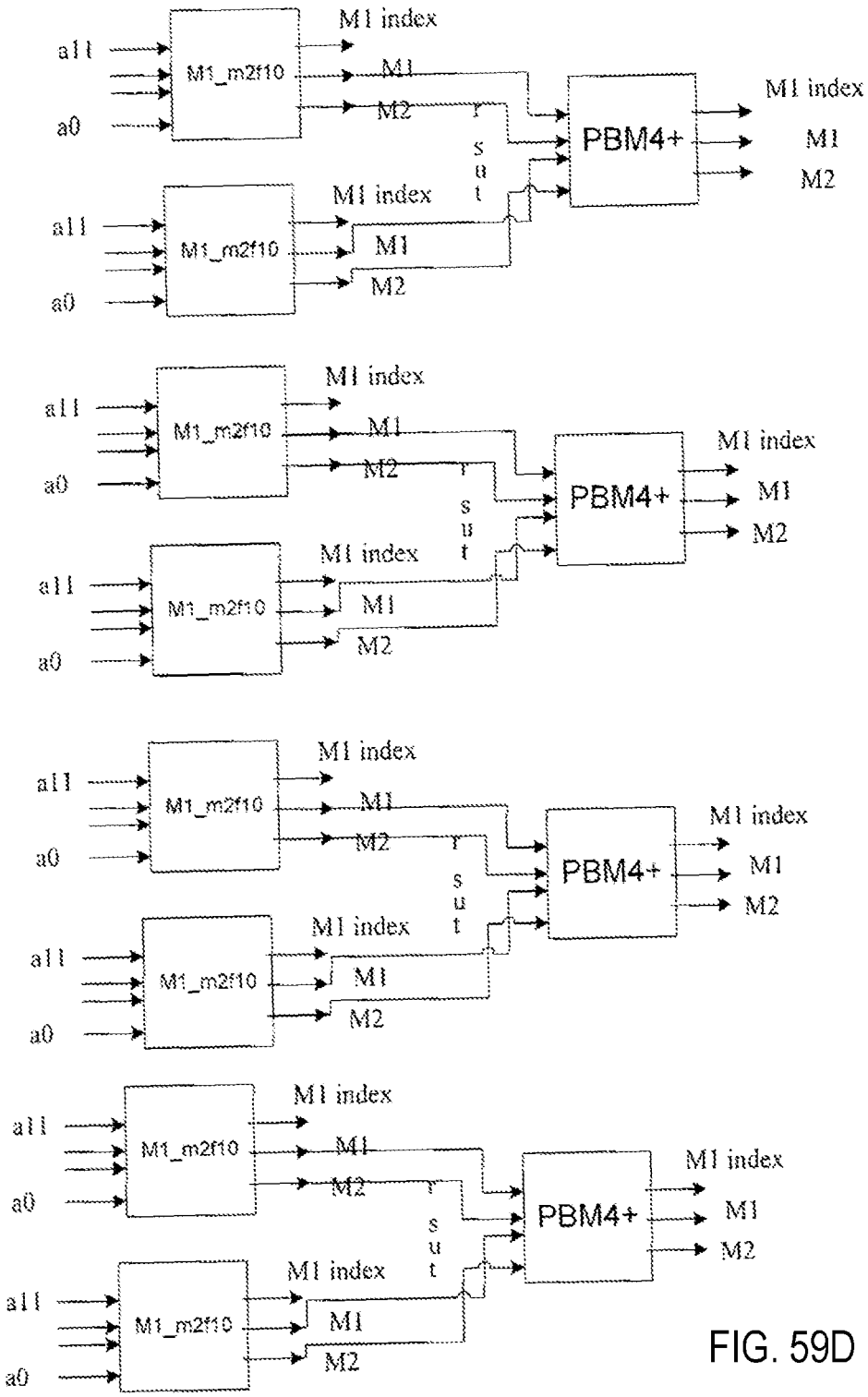

FIG. 59D shows a hierarchical Min1-Min2 finder that employs M1_M2f10 circuits and PBM4+ circuits to reconfigurably provide various finder widths. 8 M1_M2f10 circuits and 4 PBM4+ circuits can be employed to construct 4 M1_M2f20 circuits.

Figure 59E:
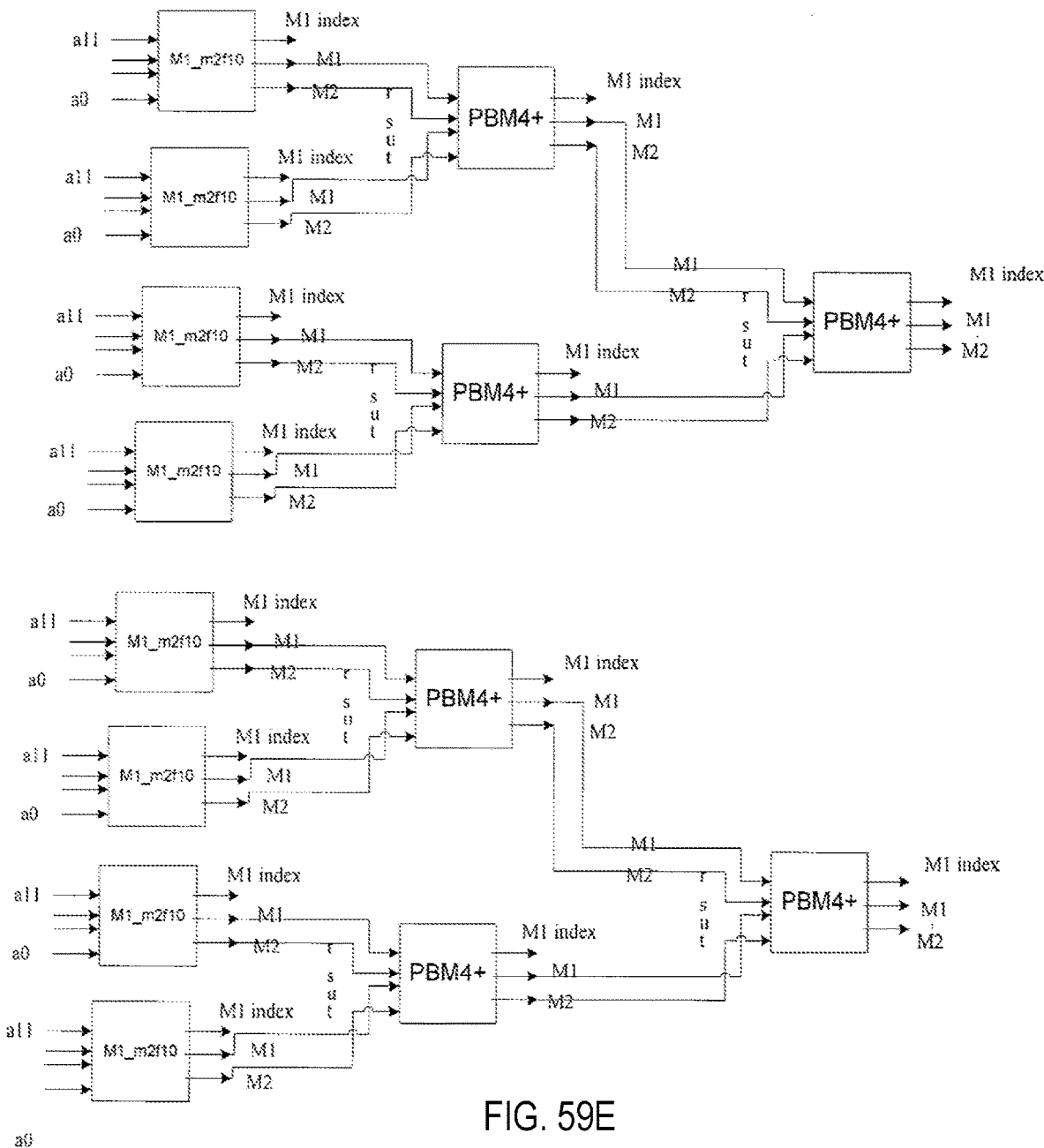

Similarly, FIG. 59E shows 8 M1_M2f10 circuits and 6 PBM4+ circuits arranged to construct 2 M1 M2f40 circuits.

Embodiments may apply any of a variety of LDPC Min-Sum Correction Methods. The different correction methods disclosed herein are suitable for efficient hardware implementation for regular and irregular codes for the min-sum decoding algorithm.

Method 1: OMS/NMS (normalized min-sum): For regular QC-LDPC codes, it is sufficient to apply correction for R values or Q values. For more information see J. Chen, A. Dholakia, E. Eleftheriou, M. Fossorier, and X. Y. Hu, *Reduced-complexity decoding of LDPC codes*, IEEE TRANS. ON COMMUNICATIONS, 1288 (August 2005).

Method 2: 2-D OMS/2-D NMS: For irregular QC-LDPC codes, standard practice is to apply correction for R messages and Q messages in two steps. Either offset or scaling method can be used. For more information see J. Zhang, M. Fossorier, D. Gu, and J. Zhang, *Two-dimensional correction for min-sum decoding of irregular codes*, IEEE COMMUNICATION LETTERS, 180 (March 2006).

Method 3: 2-D NMS-gamma: Apply a scaling operation to reduce the over-estimated reliability values for the irregular LDPC codes. The scaling factor circulant_gamma is a multiple of R scaling factor alpha and Q scaling factor gamma for each circulant. Each block row has a different alpha. Each block column has a different beta. To obtain the scaling coefficients alpha and beta see J. Zhang, M. Fossorier, D. Gu, and J. Zhang, *Two-dimensional correction for min-sum decoding of irregular codes*, IEEE COMMUNICATION LETTERS, 180 (March 2006). Each circulant has a different scaling factor gamma.

Method 4: 2-D NMS-gamma offset: This method is similar to Method 3. However a correction factor gamma_offset that is derived from gamma (or in a different manner either based on density evolution or experimental trials) can be applied as an offset for the Q messages instead of a scaling factor. However for this method, the quantization needs to be uniform with step size an integer multiple of all different offsets.

Method 5: NMS value-reuse/OMS value-reuse: For regular QC-LDPC codes, if performing correction on the output of check node processing (R messages), the scaling/offset correction needs to be done for only two values (Min1, Min2). So for the case of regular QC-LDPC, this correction is performed in the CNU processing labeled as FS (Final State) processing.

Method 6: 1-D NMS-gamma, BN (bit-node) irregular: For check node regular and bit-node irregular QC-LDPC codes, it is sufficient to apply correction for R values based on the block column. Because R_old and R_new need to be scaled, it is easier to apply the algorithm transformation such that scaling is applied to Q messages. Each block column has a different scaling factor gamma and this scaling is applied to Q messages. This method is similar to Method 3 in terms of dataflow graph except that gamma values are directly given by beta values instead of alpha*beta.

Method 7: 1-D NMS-gamma offset, BN irregular: For check node regular and bit-node irregular QC-LDPC codes, it is sufficient to apply correction for R values (as an offset correction) based on the block column. This method is similar to Method 6 except that the gamma offset is used as the offset correction instead of using gamma as the scaling factor. In implementation, Method 7 and Method 4 are similar except for the way the gamma offset parameters are calculated.

Method 8: NMS-alpha, CN (check node) irregular: For check node irregular and bit-node regular QC-LDPC codes, it is sufficient to apply correction for R values/Q values depending on the block row (i.e. check node profile). The correction is scaling factor alpha. For this kind of check node irregular QC-LDPC codes, if the correction is applied on the output of check node processing (R messages), the scaling correction needs to be done for only two values (Min1, Min2). Thus, the correction is performed in the CNU processing labeled as FS (Final State) processing. In implementation, Method 8 is similar to Method 5 except the correction factor varies based on the block row.

Method 9: NMS-alpha offset, CN irregular: For check node irregular and bit-node regular QC-LDPC codes, it is sufficient to apply correction (offset correction) for R values/Q values depending on the block row (i.e. check node profile). The correction is offset based on alpha. For this kind of check node irregular QC-LDPC codes, if the correction is applied on the output of check node processing (R messages), the offset correction may be applied to only two values (Min1, Min2). Thus, the correction is performed in the CNU processing labeled as FS (Final State) processing. In implementation, Method 9 is similar to Method 5 except the correction factor varies based on the block row.

While illustrative embodiments of this invention have been shown and described, modifications thereof can be made by one skilled in the art without departing from the spirit or teaching of this invention. The embodiments described herein are illustrative and are not limiting. Many variations and modifications of the methods and apparatus are possible and are within the scope of the invention. Generally, embodiments encompass any system incorporating forward error correction. Accordingly, the scope of protection is not limited to the embodiments described herein, but is only limited by the claims which follow, the scope of which shall include all equivalents of the subject matter of the claims.

What is claimed is:

1. A method for decoding a low density parity check (LDPC) code, comprising:
    selecting a first R message from a plurality of possible R messages based on a message index value and a sign bit;

delaying a Q message in a memory until an R select unit provides a second R message;
summing the second R message and the delayed Q message to produce a P message; and
permuting the P message by a difference of a permutation of a block currently being processed and a permutation of a block previously processed,
wherein the block currently being processed and the block previously processed are in a same block column.

2. The method of claim 1, further comprising generating the second R message based on a permuted Q message and a sign bit from a Q message.

3. The method of claim 1, further comprising storing sign bits for a plurality of LDPC parity check matrix layers in an array of sign bit memory banks, wherein each memory bank stores sign bits for a layer of the matrix.

4. The method of claim 1, further comprising subtracting the first R message from a permuted P message to produce a Q message that is provided to a check node unit (CNU).

5. The method of claim 1, further comprising permuting the P message by a combination of permutation by a permuter and memory addressing.

6. The method of claim 1, further comprising selecting one of a channel log-likelihood ratio (LLR) value and a P message to input to a permuter, wherein the LLR value is selected to initialize decoding.

7. The method of claim 1, further comprising selecting one of a channel log-likelihood ratio (LLR) value and a Q message to input to the memory, wherein the LLR value is selected to initialize decoding.

8. A low density parity check (LDPC) code decoder, comprising:
decoding circuitry configured to process blocks of an LDPC matrix, the decoding circuitry comprising:
a control unit that controls processing by the decoding circuitry, the control unit configured to cause the decoding circuitry to process blocks of a layer of the LDPC matrix out of order, wherein the control unit is configured to cause the decoding circuitry to process each block of the LDPC matrix in processing substeps comprising:
a first R message update substep that provides a first R message, wherein the first R message is produced for a block of a different layer of the matrix from a layer containing a block currently being processed;
a second R message update substep that provides a second R message, wherein the second R message is produced for a layer of the matrix currently being processed;
a P message substep that generates updated P messages;
a Q message substep that computes variable node messages (Q messages); and
a check node partial state processing substep that updates partial state of the layer based on Q messages computed for the block.

9. The LDPC code decoder of claim 8, wherein the decoding circuitry is configured to generate a Q message by combining the second R message with a P message.

10. The LDPC code decoder of claim 8, wherein the decoding circuitry further comprises a permuter configured to permute a P message.

11. The LDPC code decoder of claim 10, wherein the permuter is configured to permute the P message by a difference of a permutation of a second block currently being processed and a permutation of a block previously processed, wherein the second block currently being processed and the block previously processed are in a same block column of the LDPC matrix.

12. The LDPC code decoder of claim 8, wherein the decoding circuitry is configured to subtract a second R message from a permuted P message to generate a Q message.

13. The LDPC code decoder of claim 8, wherein the decoding circuitry is configured to select one of an updated P message and a channel log-likelihood ratio (LLR) value for storage in a P memory, wherein the channel LLR value is selected to initialize decoding.

14. The LDPC code decoder of claim 8, wherein the decoding circuitry is further configured to select an R message from a plurality of previously generated possible R messages based on a message index value and a sign bit.

15. The LDPC code decoder of claim 8, wherein the LDPC matrix is quasi-cyclic.

16. A method, comprising:
processing blocks of a layer of a low density parity check (LDPC) matrix out of order, wherein processing each of the blocks comprises:
providing a first R message, wherein the first R message is produced for a block of a different layer of the LDPC matrix from a layer containing a block currently being processed;
providing a second R message, wherein the second R message is produced for a layer of the matrix currently being processed;
generating updated P messages;
computing variable node messages (Q messages); and
updating partial state of the layer based on Q messages computed for the block.

17. The method of claim 16, further comprising generating a Q message by combining the second R message with a P message.

18. The method of claim 16, further comprising permuting a P message.

19. The method of claim 18, wherein permuting the P message comprising permuting the P message by a difference of a permutation of a second block currently being processed and a permutation of a block previously processed, wherein the second block currently being processed and the block previously processed are in a same block column of the LDPC matrix.

20. The method of claim 16, further comprising generating a Q message by subtracting the second R message from a permuted P message.

21. The method of claim 16, further comprising:
selecting one of an updated P message and a channel log-likelihood ratio (LLR) value for storage in a P memory; and
selecting a channel LLR value to initialize decoding.

22. The method of claim 16, further comprising selecting an R message from a plurality of previously generated possible R messages based on a message index value and a sign bit.

23. The method of claim 16, wherein the LDPC matrix is quasi-cyclic.

24. A low density parity check (LDPC) code decoder, comprising:
a control unit that controls decoder processing, wherein the control unit is configured to cause the decoder to:
process blocks of an LDPC matrix out of order; and
process each block of the matrix in processing substeps comprising:

a first R message update substep that produces a first R message for a block of a different layer of the matrix from a layer containing a block currently being processed;

a second R message update substep that selects a second R message for a layer of the matrix currently being processed;

a P message substep that generates updated P messages; and a Q message substep that computes variable node messages (Q messages); and a first permuter configured to permute a P message, wherein the permuter permutes the P message by the difference of a permutation of a block currently being processed and a permutation of a block previously processed, and wherein the block currently being processed and the block previously processed are in a same block column.

25. The LDPC code decoder of claim 24, further comprising:

a P message generator configured to combine the first R message with a Q message to produce a P message; and a Q message generator configured to combine the second R message with a P message to produce a Q message.

26. The LDPC code decoder of claim 24, further comprising a Q message memory that stores a Q message that is to be combined with an R message to produce a P message.

27. The LDPC code decoder of claim 24, further comprising a P message memory that stores a P message that is to be combined with the first R message to produce a Q message.

28. The LDPC code decoder of claim 24, wherein the control unit is configured to cause the decoder to generate an updated P message based on a determination of a final state for a block row.

29. A method for decoding a low density parity check (LDPC) code, comprising:

processing blocks of an LDPC matrix out of order;

processing each block of the LDPC matrix in processing substeps that comprise:

a first R message update substep that produces a first R new message for a block of a different layer of the matrix from a layer containing a block currently being processed;

a second R message update substep that selects a second R message for a layer of the matrix currently being processed;

a P message substep that generates updated P messages; and a Q message substep that computes variable node messages (Q messages); and permuting a P message, wherein the permuting comprises permuting the P message by the difference of the permutation of a block currently being processed and the permutation of a block previously processed, and wherein the block currently being processed and the block previously processed are in a same block column.

30. The method of claim 29, further comprising:

combining the first R message with a Q message to produce a P message; and combining the second R message with a P message to produce a Q message.

31. The method of claim 29, further comprising storing a Q message that is to be combined with an R message to produce a P message.

32. The method of claim 29, further comprising storing a P message that is to be combined with the second R message to produce a Q message.

33. The method of claim 29, wherein generation of the updated P message comprises generating the updated P message based on a determination of a final state for a block row.

34. A low density parity check (LDPC) code decoder, comprising:

an array of reconfigurable minimum finder units configured to:

perform block parallel processing of an LDPC matrix;

selectably process in parallel a first plurality (dc1) of block columns of a plurality (M1) of rows of a layer of a first LDPC matrix, where:

dc1 is a check node degree of a block row of the first LDPC matrix;

p1 is a total number of rows of the block row of a first LDPC matrix; and

M1<=p1; and selectably process in parallel a second plurality (dc2) of block columns of a plurality (M2) of rows of a layer of a second LDPC matrix, where:

dc2 is a check node degree of a block row of the second LDPC matrix, and dc1 is different from dc2;

p2 is a total number of rows of the block row of the second LDPC matrix;

M2<=p2; and

M2 is different from M1.

35. The LDPC code decoder of claim 34, wherein the array of reconfigurable minimum finder units is configured to:

partition a vector of input values into a plurality of sub-vectors;

determine a first minimum value and a second minimum value for each sub-vector; and determine a first minimum and a second minimum of the vector based on the first minimum value and second minimum value of the sub-vectors.

* * * * *